US008063859B2

(12) United States Patent
Kimura

(10) Patent No.: US 8,063,859 B2
(45) Date of Patent: Nov. 22, 2011

(54) LIGHT-EMITTING DEVICE AND DRIVING METHOD THEREOF

(75) Inventor: Hajime Kimura, Kanagawa-Ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 491 days.

(21) Appl. No.: 12/271,953

(22) Filed: Nov. 17, 2008

(65) Prior Publication Data

US 2009/0096727 A1   Apr. 16, 2009

Related U.S. Application Data

(63) Continuation of application No. 10/279,001, filed on Oct. 24, 2002, now Pat. No. 7,456,810.

(30) Foreign Application Priority Data

Oct. 26, 2001 (JP) ................................. 2001-330050

(51) Int. Cl.
*G09G 5/00* (2006.01)
(52) U.S. Cl. .......................................... 345/76; 345/82
(58) Field of Classification Search .............. 345/76–83, 345/204; 315/169.1, 169.3
See application file for complete search history.

(56) References Cited

U.S. PATENT DOCUMENTS

| 3,564,135 | A | 2/1971 | Weimer |
| 5,095,248 | A | 3/1992 | Sato |
| 5,359,341 | A | 10/1994 | Hutchings |
| 5,581,160 | A | 12/1996 | Fujita |
| 5,673,058 | A | 9/1997 | Uragami |
| 5,689,205 | A | 11/1997 | Hughes |
| 5,783,952 | A | 7/1998 | Kazazian |
| 6,037,719 | A | 3/2000 | Yap |
| 6,091,203 | A | 7/2000 | Kawashima |
| 6,229,506 | B1 | 5/2001 | Dawson |
| 6,229,508 | B1 | 5/2001 | Kane |
| 6,246,180 | B1 | 6/2001 | Nishigaki |

(Continued)

FOREIGN PATENT DOCUMENTS

EP  1 003 150  5/2000

(Continued)

OTHER PUBLICATIONS

Baldo et al., "Highly Efficient Phosphorescent Emission from Organic Electroluminescent Devices," *Nature*, vol. 395, pp. 151-154, Sep. 10, 1998.

(Continued)

*Primary Examiner* — Regina Liang
(74) *Attorney, Agent, or Firm* — Fish & Richardson P.C.

(57) ABSTRACT

In a light emitting device, luminance irregularities caused by fluctuation in threshold of TFTs for supplying a current to EL elements among pixels hinder the light emitting device from improving the image quality. A voltage equal to the threshold of a TFT 110 is held in capacitor means 111 in advance. When a video signal is inputted from a source signal line, the voltage held in the capacitor means is added to the signal, which is then applied to a gate electrode of the TFT 110. Even when threshold is fluctuated among pixels, each threshold is held in the capacitor means 111 of each pixel, and therefore, influence of the threshold fluctuation can be removed. Since the threshold is stored in the capacitor means 111 alone and the voltage between two electrodes is not changed while a video signal is written, fluctuation in capacitance value has no influence.

8 Claims, 32 Drawing Sheets

| 2101 | : source signal line |
| 2102 | : first gate singal line |
| 2103 | : second gate signal line |
| 2104 | : third gate signal line |
| 2105 | : fourth gate signal line |
| 2106 | : fifth gate signal line |
| 2107~2111 | : TFT |
| 2112, 2117 | : capacitor means |
| 2113 | : EL element |
| 2114 | : current supply line |
| 2115, 2116 | : power supply |
| 2118 | : TFT |

U.S. PATENT DOCUMENTS

| | | | |
|---|---|---|---|
| 6,278,131 B1 | 8/2001 | Yamazaki | |
| 6,348,906 B1 | 2/2002 | Dawson | |
| 6,362,798 B1 | 3/2002 | Kimura | |
| 6,380,687 B1 | 4/2002 | Yamazaki | |
| 6,445,371 B1 | 9/2002 | Miyazawa | |
| 6,501,466 B1 | 12/2002 | Yamagishi | |
| 6,525,704 B1 | 2/2003 | Kondo | |
| 6,570,338 B2 | 5/2003 | Bae | |
| 6,580,408 B1 | 6/2003 | Bae | |
| 6,750,833 B2 | 6/2004 | Kasai | |
| 6,859,193 B1 | 2/2005 | Yumoto | |
| 6,909,242 B2 | 6/2005 | Kimura | |
| 7,091,939 B2 | 8/2006 | Kasai | |
| 7,145,530 B2 | 12/2006 | Miyazawa | |
| 7,193,591 B2 | 3/2007 | Yumoto | |
| 7,456,810 B2 * | 11/2008 | Kimura | 345/76 |
| 7,589,699 B2 | 9/2009 | Miyazawa | |
| 2001/0029070 A1 | 10/2001 | Yamazaki | |
| 2002/0005825 A1 | 1/2002 | Lee | |
| 2002/0070913 A1 | 6/2002 | Kimura | |
| 2003/0020413 A1 | 1/2003 | Oomura | |
| 2003/0069658 A1 | 4/2003 | Yamazaki | |
| 2003/0091871 A1 | 5/2003 | Yamazaki | |
| 2003/0117352 A1 | 6/2003 | Kimura | |
| 2003/0169218 A1 | 9/2003 | Kimura | |
| 2003/0174009 A1 | 9/2003 | Kimura | |
| 2004/0207615 A1 | 10/2004 | Yumoto | |
| 2005/0190177 A1 | 9/2005 | Yumoto | |

FOREIGN PATENT DOCUMENTS

| | | |
|---|---|---|
| EP | 1 020 920 | 7/2000 |
| EP | 1 063 630 | 12/2000 |
| EP | 1 103 946 | 5/2001 |
| EP | 1191512 A2 | 3/2002 |
| JP | 2000-086968 | 3/2000 |
| JP | 2000-347159 | 12/2000 |
| JP | 2000-347621 | 12/2000 |
| JP | 2001-005426 | 1/2001 |
| JP | 2001-83924 | 3/2001 |
| JP | 2001-324958 | 11/2001 |
| JP | 2001-343933 | 12/2001 |
| JP | 2002169510 A | 6/2002 |
| JP | 2003-099000 | 4/2003 |
| JP | 2003-114644 | 4/2003 |
| JP | 2003173165 A | 6/2003 |
| JP | 2004-070074 A | 3/2004 |
| WO | WO 98/48403 | 10/1998 |
| WO | WO 99-65011 | 12/1999 |
| WO | WO 01/06484 | 1/2001 |

OTHER PUBLICATIONS

Baldo et al., "Very High-Efficiency Green Organic Light-Emitting Devices Based on Electrophosphorescence," *Applied Physics Letters*, vol. 75, No. 1, pp. 4-6, Jul. 5, 1999.

Dawson et al., "4.2: Design of an Improved Pixel for a Polysilicon Active-Matrix Organic Led Display," *SID Digest '98*, SID International Symposium Digest of Technical Papers, pp. 11-14, 1998.

Goh et al., "A New Poly-Si Tft Pixel Circuit Scheme for an Active-Matrix Organic Light Emitting Diode Displays," *Asia Display / IDW '01*, pp. 319-322, 2001.

Kida et al., "LN-4: A 3.8 Inch Half-VGA Transflective Color Tft-Lcd With Completely Integrated 6-Bit RGB Parallel Interface Drivers," *Eurodisplay 2002: Proceedings of the 22$^{nd}$ IDRC (International Display Research Conference)*, pp. 831-834, 2002.

D. Pribat et al., "Matrix Addressing for Organic Electroluminescent Displays," *Thin Solid Films*, pp. 25-30, vol. 383, 2001.

Sekine et al., "3.2: Amplifier Compensation Method for a Poly-Si Tft Lclv With an Integrated Data-Driver," *Conference Record of the 1997 IDRC (International Display Research Conference)*, pp. 45-48.

Tsutsui et al., "Electroluminescence in Organic Thin Films," *Photochemical Processes in Organized Molecular Systems Proceedings of the Memorial Conference*, pp. 437-450, Sep. 22, 1990.

Tsutsui et al., "High Quantum Efficiency in Organic Light-Emitting Devices with Iridium-Complex as a Triplet Emissive Center," *Japan Journal of Applied Physics*, vol. 38, No. 12B, pp. L1502-L1504, Dec. 15, 1999.

\* cited by examiner

101 : source signal line
102 : first gate signal line
103 : second gate signal line
104 : third gate signa line
105 : fourthe gate signal line
106~110 : TFT
111, 115 : capacitor means
112 : EL element
113 : current supply line
114 : power supply Fig. 2A charging electricity 1
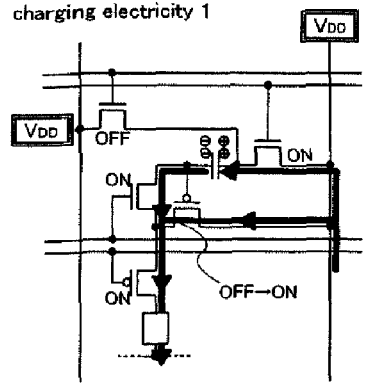
Fig. 2B charging electricity 2
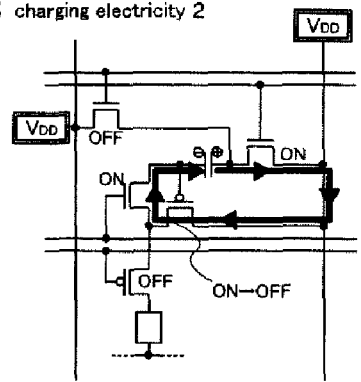
Fig. 2C state of keeping Vth
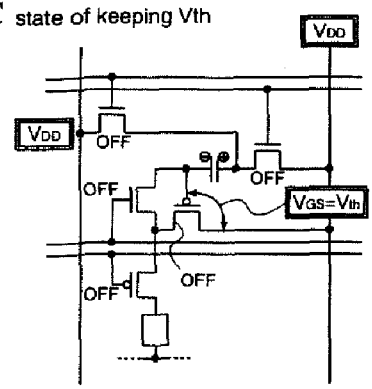
Fig. 2D inputting image signal
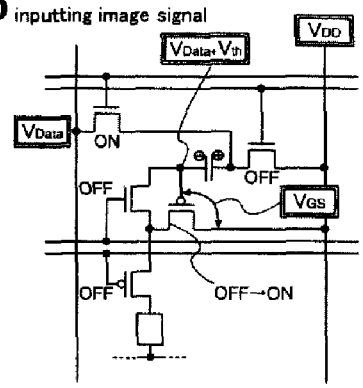
Fig. 2E completion of inputting image signal
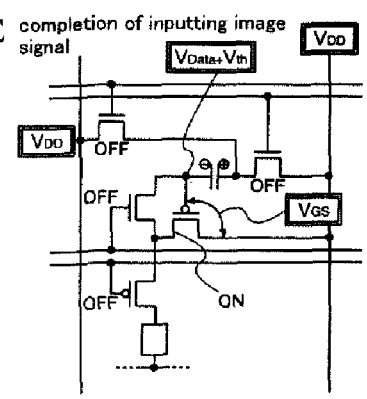
Fig. 2F emitting light
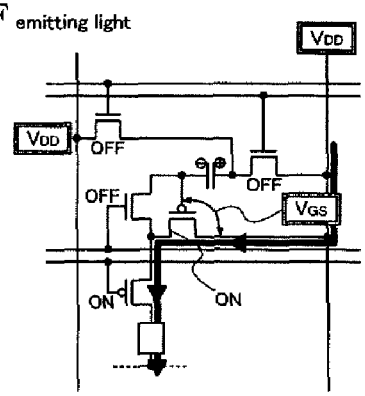

301 : source signal line
302 : gate signal line
303 : switching TFT
304 : driving TFT
305 : capacitor means
306 : EL element
307 : current supply line
308 : power supply 401 : source signal line
402 : first gate signal line
403 : second gate signal line
404 : switching TFT
405 : driving TFT
406 : erasing TFT
407 : capacitor means
408 : EL element
409 : current supply line
410 : power supply 501 : source signal line
502 : first gate signal line
503 : second gate signal line
504 : third gate signal line
505~508 : TFT
509, 510 : capacitor means
511 : EL element
512 : current supply line
513 : power supply Fig. 6A charging electricity 1
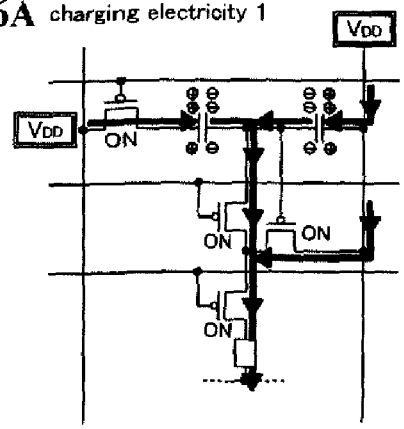
Fig. 6B charging electricity 2
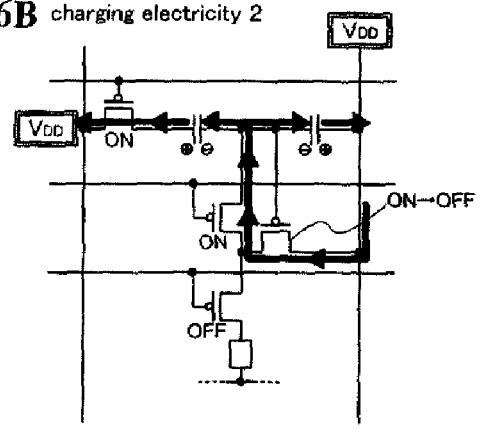
Fig. 6C state of keeping Vth
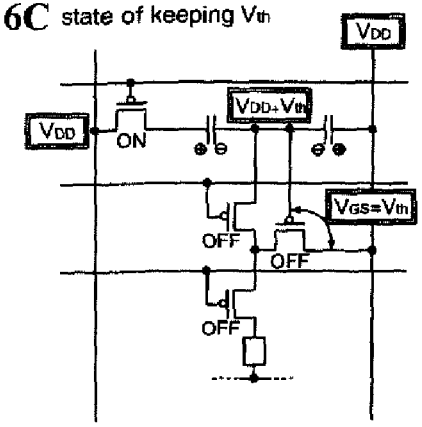
Fig. 6D inputting image signal
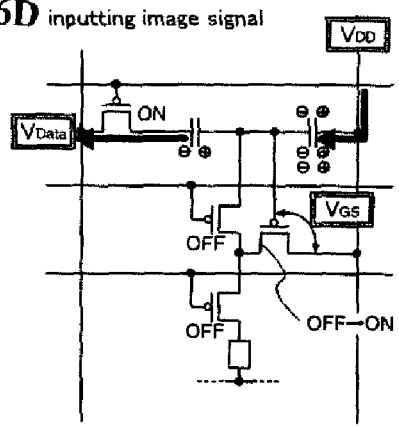
Fig. 6E completion of inputting image signal
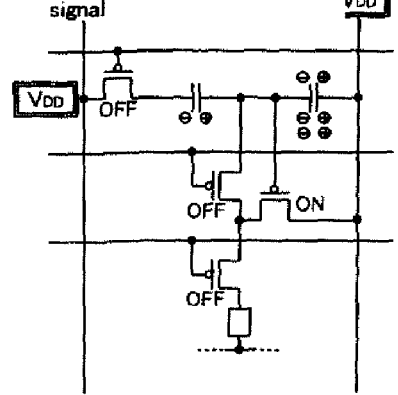
Fig. 6F emitting light
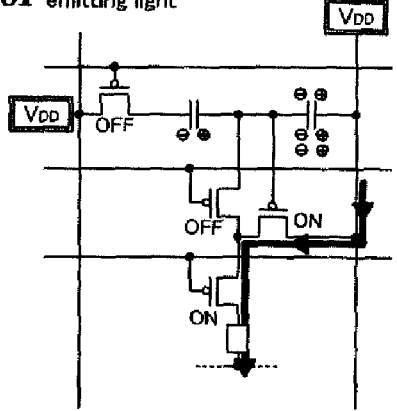

801 : shift register
802 : flip-flop circuit
803 : buffer circuit
804 : sampling circuit
805 : sampling swich 811 : shift register circuit 1
812 : buffer circuit 1
813 : shift register circuit 2
814 : buffer circuit 2
815 : flip-flop circuit
816 : buffer 1001 : shift register
1002 : first latch circuit
1003 : second latch circuit
1004 : D/A converter circuit 1010 : flip-flop circuit 1101 : shift register circuit
1102 : buffer circuit
1103 : pulse dividing circuit
1114 : flip-flop circuit
1115 : buffer
1116 : NAND
1117 : inverter Fig. 13A  forming base insulating film/forming semiconductor film/forming gate insulating film/forming first and second conductive layer

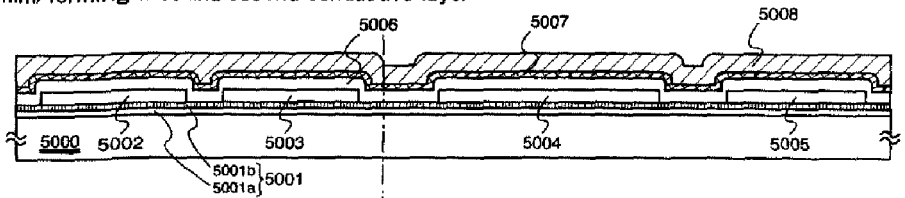

Fig. 13B  first etching treatment

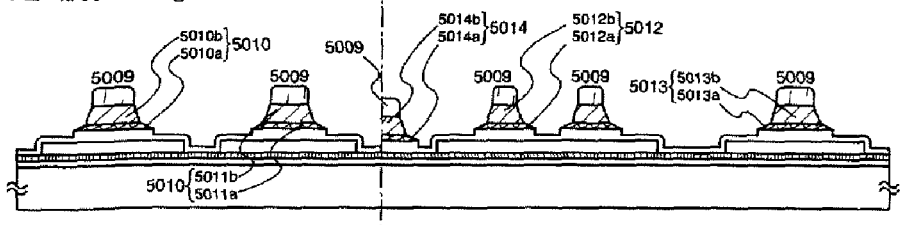

Fig. 13C  second etching treatment/first doping treatment

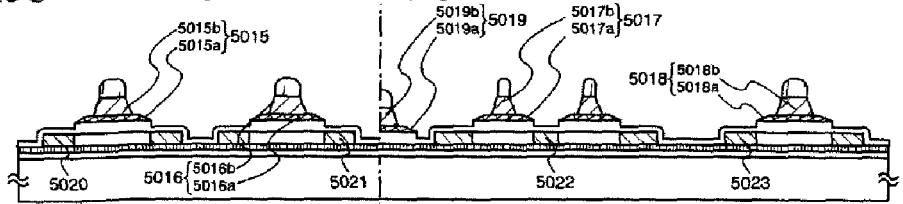

Fig. 13D  second and third doping treatments

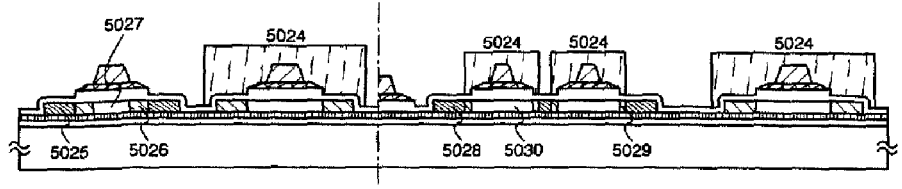

| 5000 | : substrate | 5015~5019 | : second-shaped conductive layer |
| 5001 | : base film | 5020~5023 | : first impurity region(N--region) |
| 5002~5005 | : semiconductor layer | 5025, 5028 | : second impurity region(N+region) |
| 5006 | : gate insulating film | 5026 | : third impurity region(N-region) |
| 5007 | : first conductive layer | 5027, 5030 | : channel region(?) |
| 5008 | : second conductive layer | 5029 | : first impurity region(N--region) |
| 5009, 5024 | : resist mask | | |
| 5010~5014 | : first-shaped conductive layer | | |

Fig. 14A fourth dopinig treatment

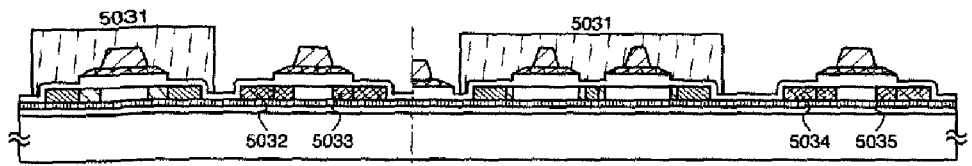

Fig. 14B forming first interlayer insulating film/heat treatment

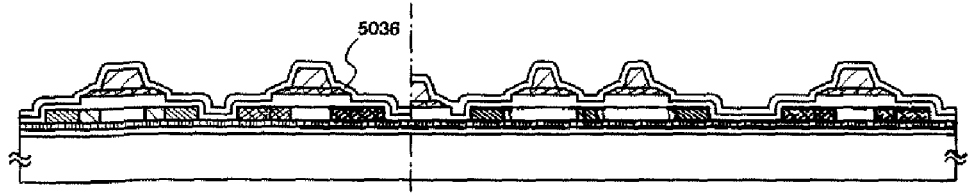

Fig. 14C forming second interlayer insulating film/forming pixel electrode/forming wiring

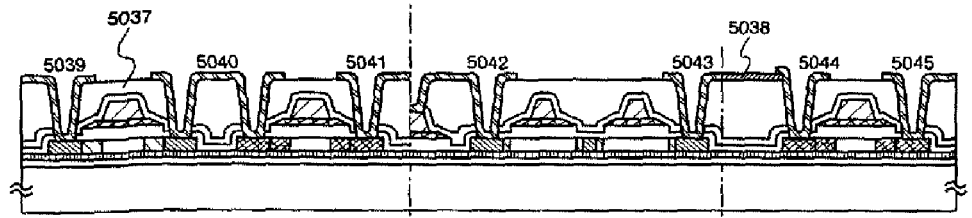

Fig. 14D forming third interlayer insualting film/forming EL element/
fomring protective film

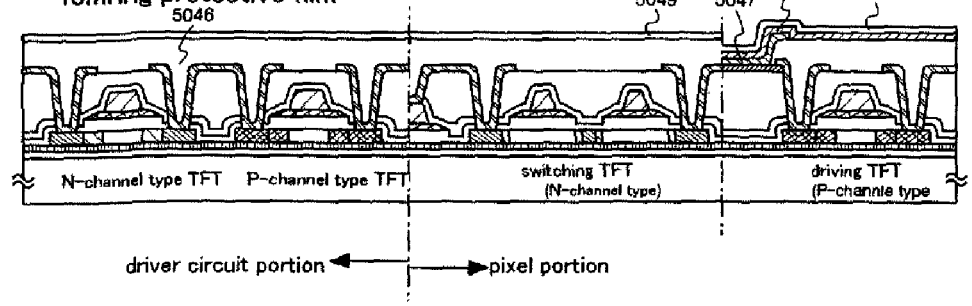

| 5031 | : resist mask | 5039~5045 | : wiring |
| 5032, 5034 | : fourth impurity region(P+region) | 5046 | : third interlayer insulating film |
| 5033, 5035 | : fifth impurity region(P-region) | 5047 | : EL layer |
| 5036 | : first interlayer insulating film | 5048 | : pixel electrode(cathode) |
| 5037 | : second interlayer insualting film | 5049 | : protective film |
| 5038 | : pixel electrode(anode) | | |

Fig. 15A  forming first interlayer insualting film/heat treatment

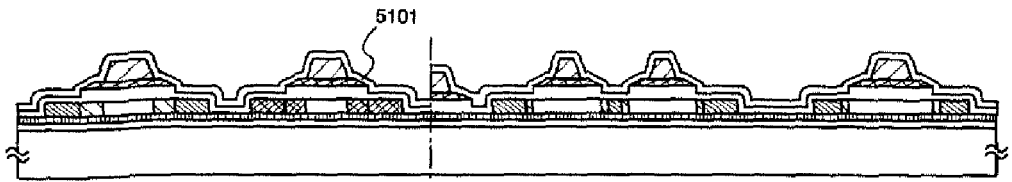

Fig. 15B  forming second interlayer insulating film/forming wiring

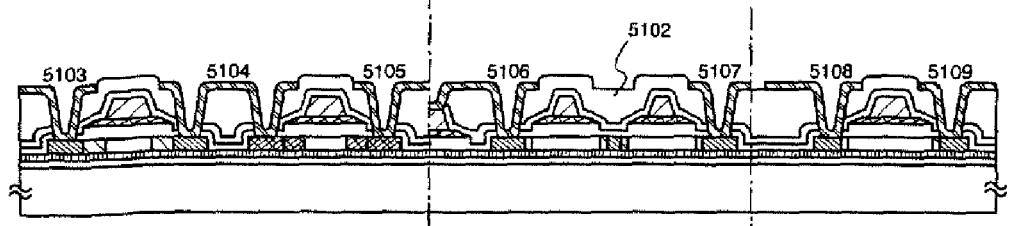

Fig. 15C  forming third interlayer insulating film/forming pixel electrode

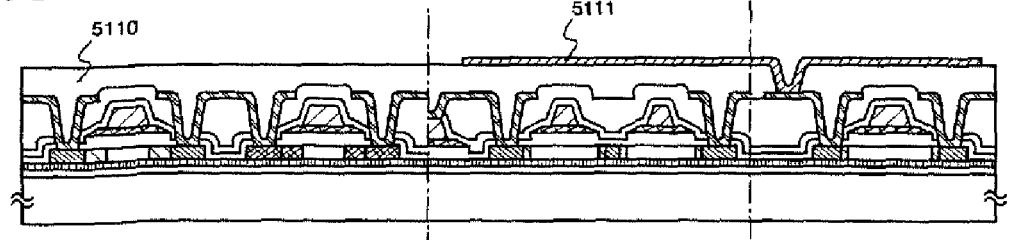

Fig. 15D  forming bank/forming EL element/
forming protective film

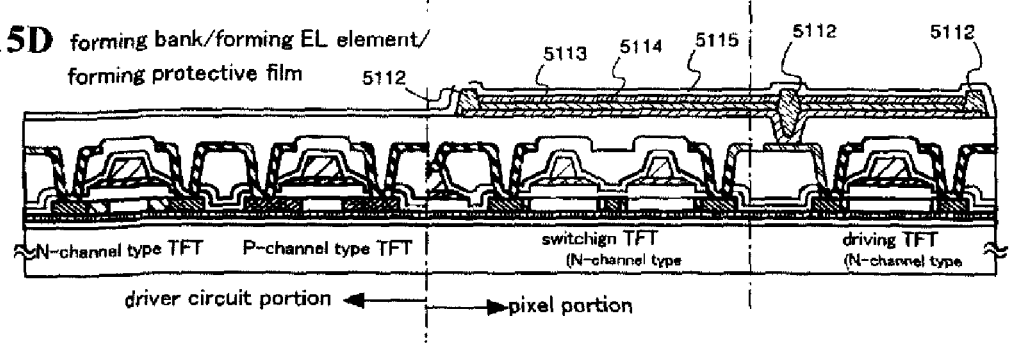

| 5101 | : first interlayer insulating film | 5112 | : bank |
| 5102 | : second interlayer insulating film | 5113 | : EL layer |
| 5103~5109 | : wiring | 5114 | : pixel electrode(anode) |
| 5110 | : third interlayer insulating film | 5115 | : protective film |
| 5111 | : pixel electrode(cathode) | | |

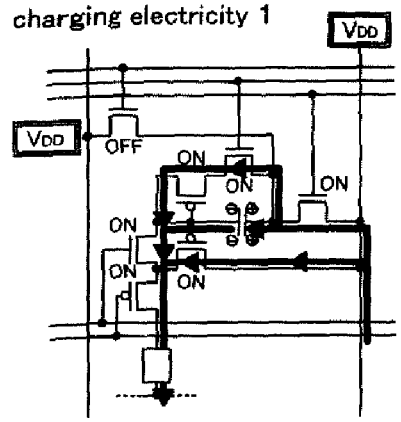
Fig. 19A charging electricity 1
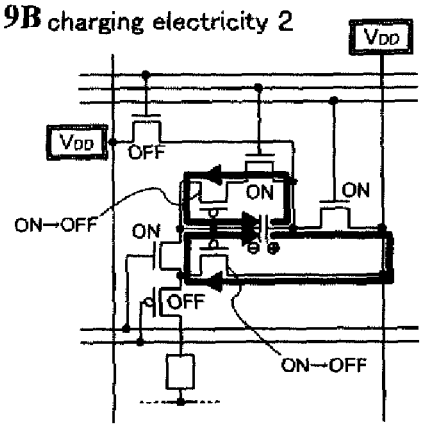
Fig. 19B charging electricity 2
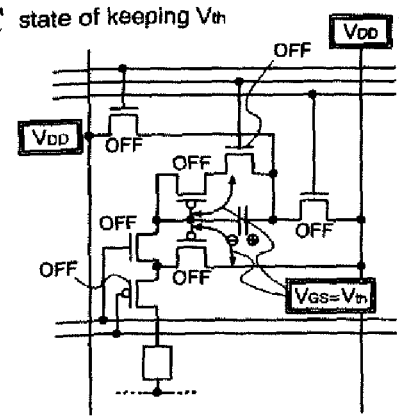
Fig. 19C state of keeping Vth
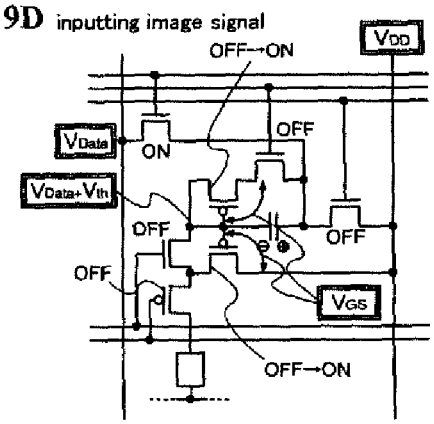
Fig. 19D inputting image signal
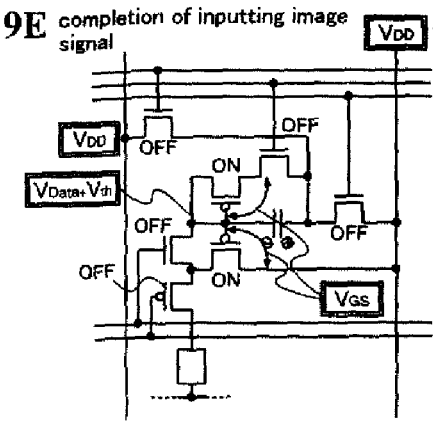
Fig. 19E completion of inputting image signal
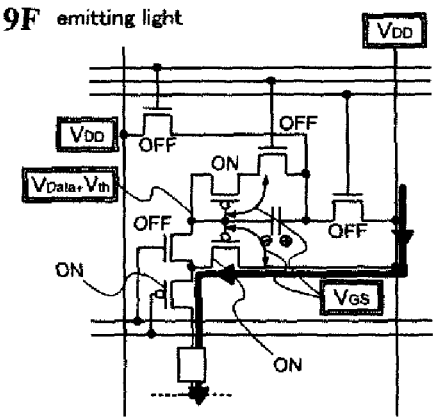
Fig. 19F emitting light

| | |
|---|---|
| 101 | : source signal line |
| 102 | : first gate signal line |
| 103 | : second gate signal line |
| 104 | : third gate signal line |
| 105 | : fourth gate signal line |
| 106~110 | : TFT |
| 111, 115 | : capacitor means |
| 112 | : EL element |
| 113 | : current supply line |
| 114 | : power source |

Fig. 21A
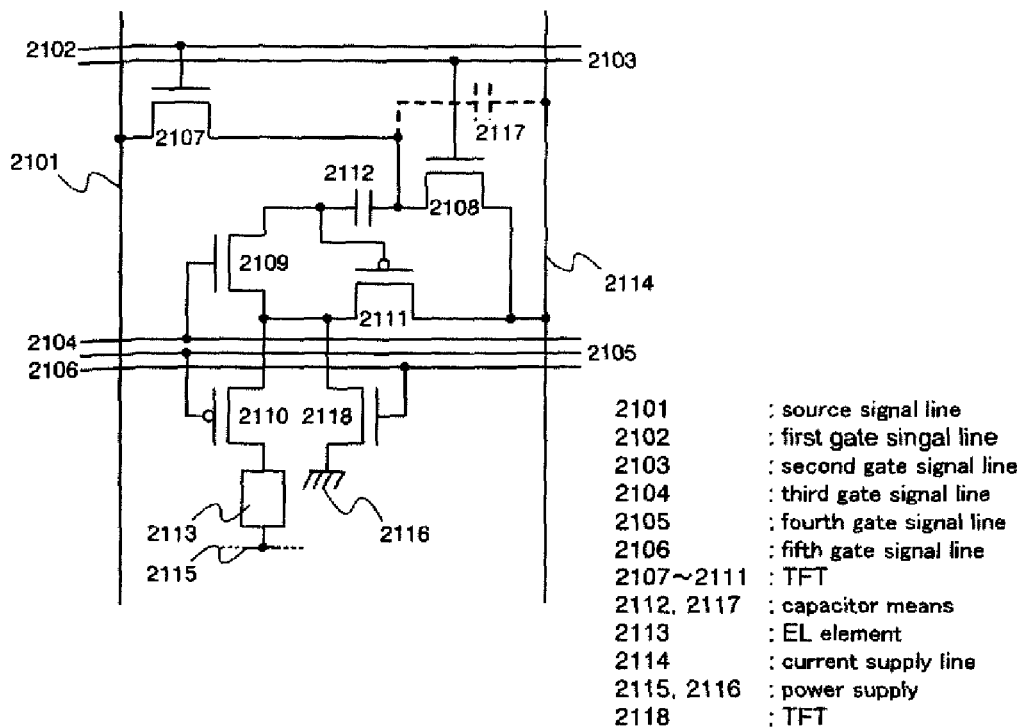
| 2101 | : source signal line |
| 2102 | : first gate singal line |
| 2103 | : second gate signal line |
| 2104 | : third gate signal line |
| 2105 | : fourth gate signal line |
| 2106 | : fifth gate signal line |
| 2107~2111 | : TFT |
| 2112, 2117 | : capacitor means |
| 2113 | : EL element |
| 2114 | : current supply line |
| 2115, 2116 | : power supply |
| 2118 | : TFT |
Fig. 21B charging electricity 1     Fig. 21C charging electricity 2
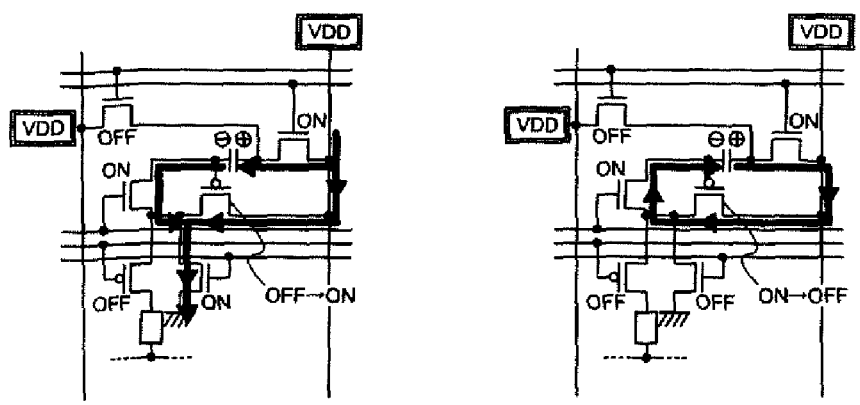

Fig. 22A
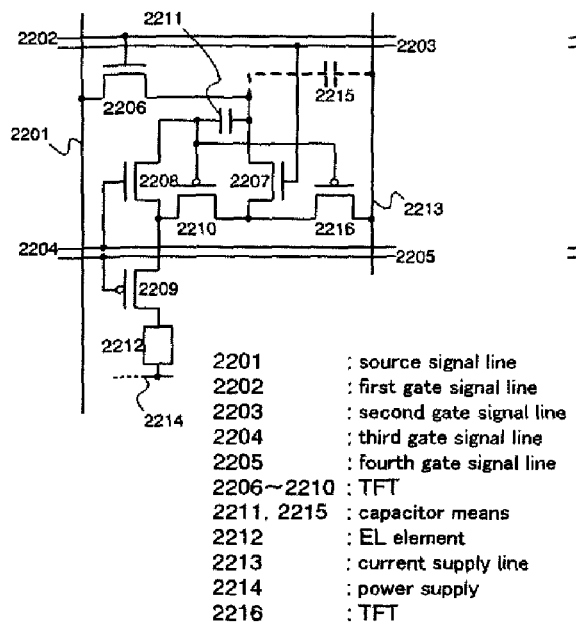
2201 : source signal line
2202 : first gate signal line
2203 : second gate signal line
2204 : third gate signal line
2205 : fourth gate signal line
2206~2210 : TFT
2211, 2215 : capacitor means
2212 : EL element
2213 : current supply line
2214 : power supply
2216 : TFT
Fig. 22B charging electricity 1
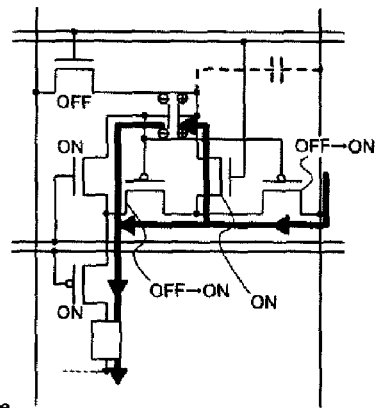
Fig. 22C charging electricity 2
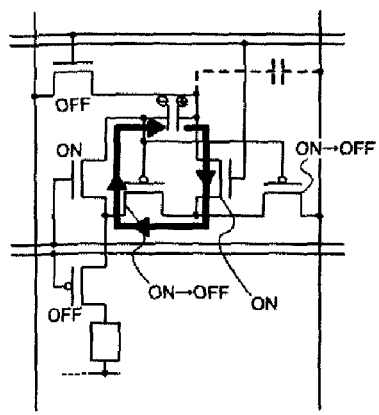
Fig. 22D emitting light
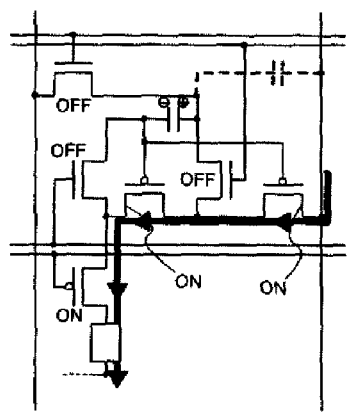

| | |
|---|---|
| 2201 | : source signal line |
| 2202 | : first gate signal line |
| 2203 | : second gate signal line |
| 2204 | : third gate signal line |
| 2205 | : fourth gate signal line |
| 2206~2210 | : TFT |
| 2211, 2215 | : capacitor means |
| 2212 | : EL element |
| 2213 | : current supply line |
| 2214 | : power supply |
| 2216 | : TFT |

Fig. 24A
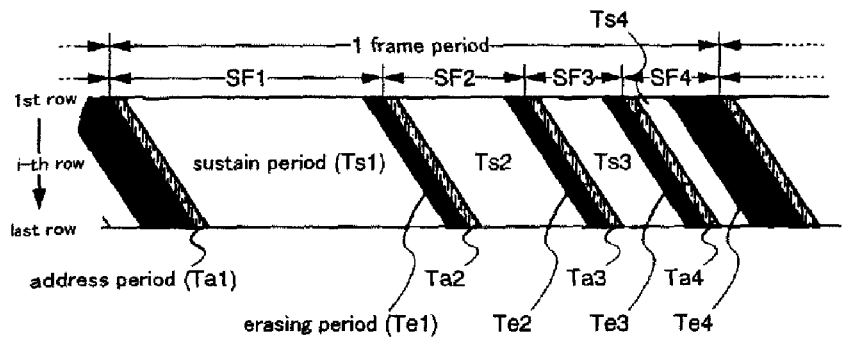
Fig. 24B first gate signal line
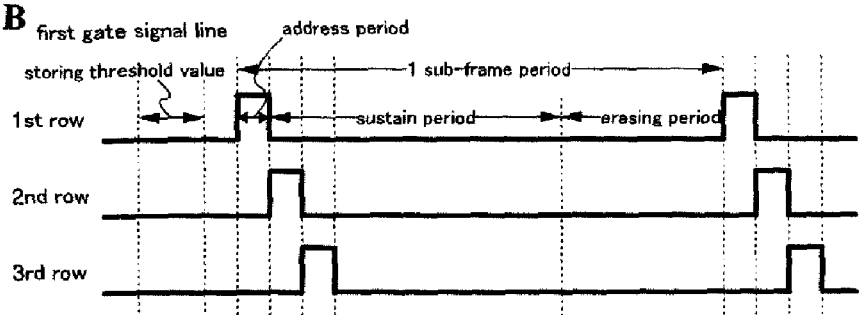
Fig. 24C second and third gate signal lines
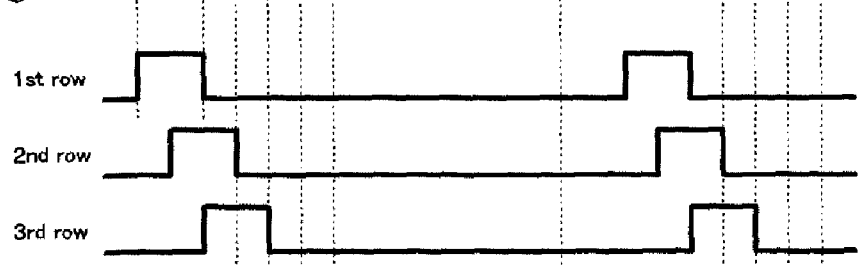
Fig. 24D fourth gate signal line
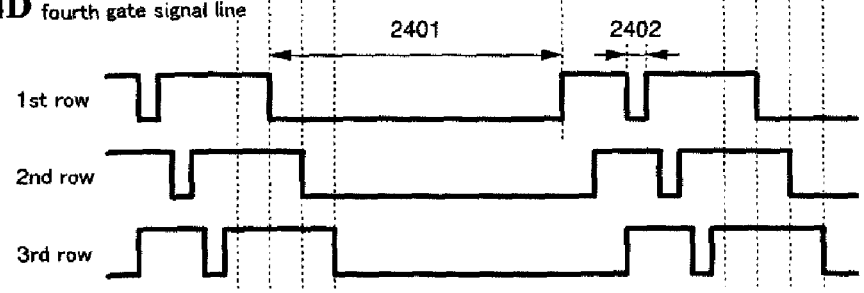

Fig.26A
(i) charging electricity
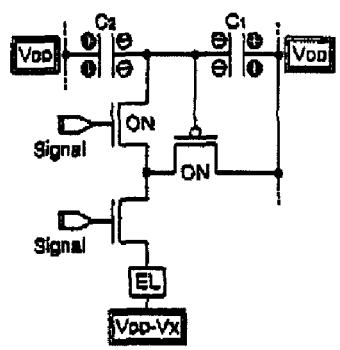
(ii) storing threshold value
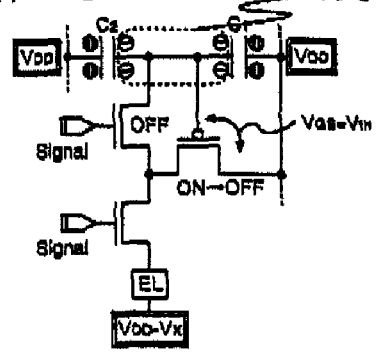
(iii) inputting image signal
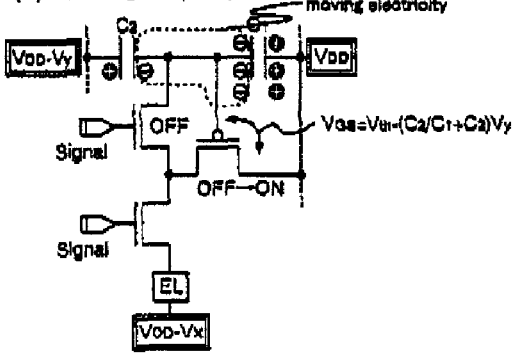
Fig.26B
(i) charging electricity
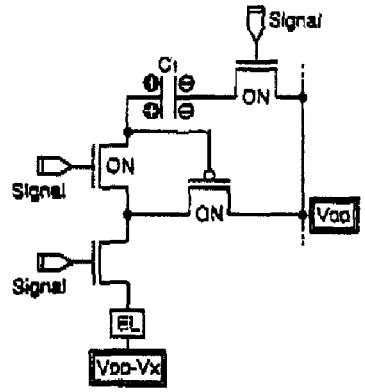
(ii) storing threshold value
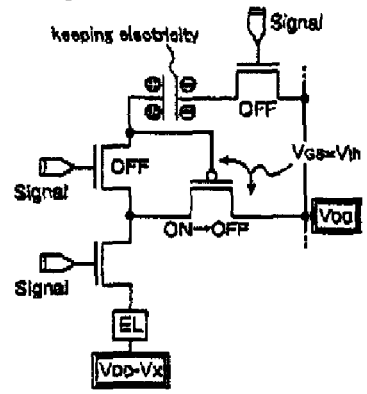
(iii) inputting image signal
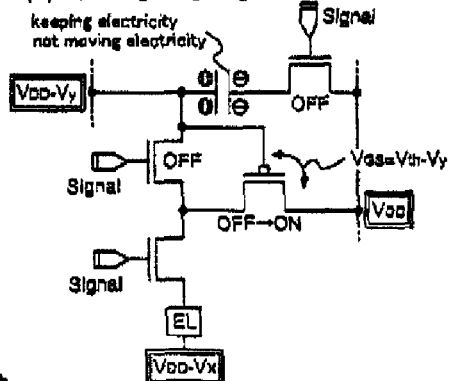

Fig. 32A
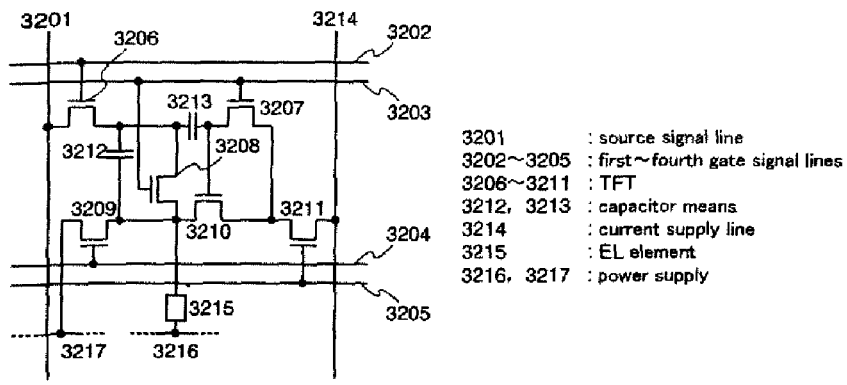
| 3201 | : source signal line |
| --- | --- |
| 3202~3205 | : first~fourth gate signal lines |
| 3206~3211 | : TFT |
| 3212, 3213 | : capacitor means |
| 3214 | : current supply line |
| 3215 | : EL element |
| 3216, 3217 | : power supply |
Fig. 32B charging electricity 1
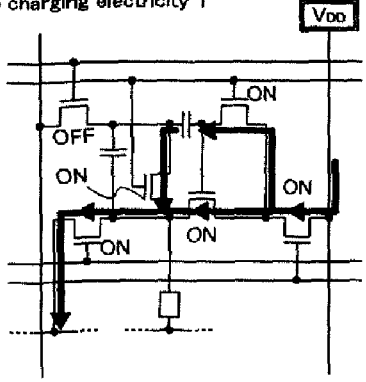
Fig. 32C charging electricity 2
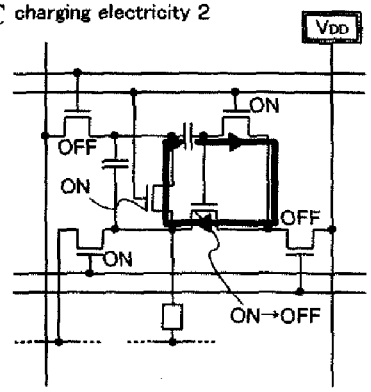
Fig. 32D inputting image signal
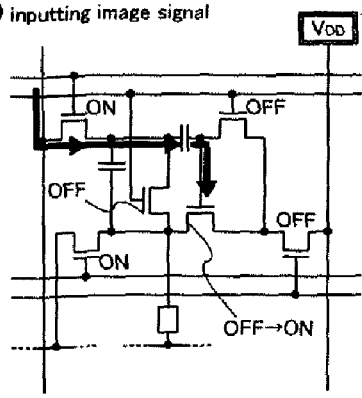
Fig. 32E emitting light
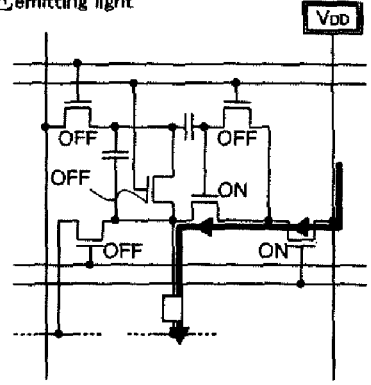

LIGHT-EMITTING DEVICE AND DRIVING METHOD THEREOF

CROSS-REFERENCE TO RELATED APPLICATIONS

This application is a continuation of U.S. application Ser. No. 10/279,001, filed Oct. 24, 2002, now allowed, which claims the benefit of a foreign priority application filed in Japan as Serial No. 2001-330050 on Oct. 26, 2001 both of which are incorporated by reference.

TECHNICAL FIELD

The present invention relates to the structure of a light emitting device having a transistor. In particular, the present invention relates to the structure of an active matrix light emitting device having a thin film transistor (hereinafter referred to as TFT) manufactured on an insulator such as glass or plastic. Further, the present invention relates to electronic equipment using this type of light emitting device as a display portion.

BACKGROUND

The development of display devices using light emitting elements such as electroluminescence (EL) elements and the like has become active in recent years. The light emitting element is a self-emitting element, so that the light emitting display device has high visibility, and is suited for being thinner because a back light which is necessary for liquid crystal display devices (LCDs) and the like is not needed, and that there are almost no limitations on their angle of view.

The term EL element indicates an element having a light emitting layer in which luminescence generated by the application of an electric field can be obtained. There are light emission when returning to a base state from a singlet excitation state (fluorescence), and light emission when returning to a base state from a triplet excitation state (phosphorescence) in the light emitting layer, and a light emitting device of the present invention may use either of the aforementioned types of light emission.

EL elements normally have a laminate structure in which a light emitting layer is sandwiched between a pair of electrodes (anode and cathode). A laminate structure having "an anode, a hole transporting layer, a light emitting layer, an electron transporting layer, and a cathode", proposed by Tang et al. of Eastman Kodak Company, can be given as a typical structure. This structure has extremely high efficiency light emission, and most of the EL elements currently being researched employ this structure.

Further, structures having the following layers laminated in order between an anode and a cathode also exist: a hole injecting layer, a hole transporting layer, a light emitting layer, and an electron transporting layer; and a hole injecting layer, a hole transporting layer, a light emitting layer, an electron transporting layer, and an electron injecting layer. Any of the above-stated structures may be employed as EL element structure used in the light emitting device of the present invention. Furthermore, fluorescent pigments and the like may also be doped into the light emitting layer.

All layers formed in EL elements between the anode and the cathode are referred to generically as "EL layers" in this specification. The aforementioned hole injecting layer, hole transporting layer, light emitting layer, electron transporting layer, and electron injecting layer are all included in the category of EL layers, and light emitting elements structured by an anode, an EL layer, and a cathode are referred to as electro luminescence elements.

SUMMARY

In one general aspect, a light emitting device includes a pixel with a light emitting element, a current supply line, first through fourth transistors, and capacitor means. A gate electrode of the first transistor is electrically connected to a first electrode of the second transistor and to a first electrode of the capacitor means, a first electrode of the first transistor is electrically connected to the current supply line, and a second electrode of the first transistor is electrically connected to a second electrode of the second transistor and to a first electrode of the third transistor. A gate electrode of the second transistor receives a first signal, and a gate electrode of the third transistor receives a second signal. A second electrode of the capacitor means is electrically connected to a first electrode of the fourth transistor. A gate electrode of the fourth transistor receives a third signal, and a second electrode of the fourth transistor is electrically connected to the current supply line.

In another general aspect, a light emitting device includes a pixel with a light emitting element, a source signal line, first through fourth gate signal lines, a current supply line, first through fifth transistors, and capacitor means. A gate electrode of the first transistor is electrically connected to the first gate signal line, a first electrode of the first transistor is electrically connected to the source signal line, and a second electrode of the first transistor is electrically connected to the first electrode of the capacitor means and to a first electrode of the second transistor. A gate electrode of the second transistor is electrically connected to the second gate signal line, and a second electrode of the second transistor is electrically connected to the current supply line. A second electrode of the capacitor means is electrically connected to a first electrode of the third transistor and to a gate electrode of the fifth transistor. A gate electrode of the third transistor is electrically connected to the third gate signal line, and a second electrode of the third transistor is electrically connected to a first electrode of the fourth transistor and to a first electrode of the fifth transistor. A gate electrode of the fourth transistor is electrically connected to the fourth gate signal line, a second electrode of the fourth transistor is electrically connected to a first electrode of the light emitting element, and a second gate electrode of the fifth transistor is electrically connected to the current supply line.

In another general aspect, a light emitting device has a pixel with a light emitting element, a source signal line, first through third gate signal lines, a current supply line, first through fifth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to the current supply line. A second electrode of the capacitor means is electrically connected to a first electrode of the third transistor and to a gate electrode of the fifth transistor. A gate electrode of the third transistor is electrically connected to the second gate signal line, and a second electrode of the third transistor is electrically connected to a first electrode of the fourth transistor and to a first electrode of the fifth transistor. A gate electrode of the fourth transistor is electrically connected to the third gate signal line, a second electrode of the fourth transistor is electrically connected to a first electrode of the light emitting element. A second electrode of the fifth transistor is electrically connected to the current supply line.

In another general aspect, a light emitting device has a pixel with a light emitting element, a source signal line, first through fourth gate signal lines, a current supply line, first through fifth transistors, and capacitor means. A gate electrode of the first transistor is electrically connected to the first gate signal line, a first electrode of the first transistor is electrically connected to the source signal line, and a second electrode of the first transistor is electrically connected to a first electrode of the second transistor and to a first electrode of the capacitor means. A gate electrode of the second transistor is electrically connected to the second gate signal line, and a second electrode of the second transistor is electrically connected to a first electrode of the fourth transistor and to a first electrode of the fifth transistor. A second electrode of the capacitor means is electrically connected to a first electrode of the third transistor and to a gate electrode of the fifth transistor. A gate electrode of the third transistor is electrically connected to the third gate signal line, and a second electrode of the third transistor is electrically connected to a second electrode of the fifth transistor and to a first electrode of the light emitting element. A gate electrode of the fourth transistor is electrically connected to the fourth gate signal line, and a second electrode of the fourth transistor is electrically connected to the current supply line.

In another general aspect, a light emitting device has a pixel with a light emitting element, a source signal line, first through third gate signal lines, a current supply line, first through fifth transistors, and capacitor means. A gate electrode of the first transistor is electrically connected to the first gate signal line, a first electrode of the first transistor is electrically connected to the source signal line, and a second electrode of the first transistor is electrically connected to a first electrode of the second transistor and to a first electrode of the capacitor means. A gate electrode of the second transistor is electrically connected to the second gate signal line, and a second electrode of the second transistor is electrically connected to a first electrode of the fourth transistor and to a first electrode of the fifth transistor. A second electrode of the capacitor means is electrically connected to a first electrode of the third transistor and to a gate electrode of the fifth transistor. A gate electrode of the third transistor is electrically connected to the second gate signal line, and a second electrode of the third transistor is electrically connected to a second electrode of the fifth transistor and to a first electrode of the light emitting element. A gate electrode of the fourth transistor is electrically connected to the third gate signal line, and a second electrode of the fourth transistor is electrically connected to the current supply line.

In another general aspect, a light emitting device has a pixel with a light emitting element, a source signal line, first through fifth gate signal lines, a current supply line, first through sixth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to the current supply line. A second electrode of the capacitor means is electrically connected to a first electrode of the third transistor and to a gate electrode of the fifth transistor. A gate electrode of the third transistor is electrically connected to the third gate signal line, and a second electrode of the third transistor is electrically connected to a first electrode of the fourth transistor and to a first electrode of the fifth transistor. A gate electrode of the fourth transistor is electrically connected to the fourth gate signal line, and a second electrode of the fourth transistor is electrically connected to a first electrode of the light emitting element. A second electrode of the fifth transistor is electrically connected to the current supply line. A gate electrode of the sixth transistor is electrically connected to the fifth gate signal line, and a first electrode of the sixth transistor is electrically connected to the first electrode of the third transistor or to the second electrode of the third transistor.

In another general aspect, a light emitting device has a pixel with a light emitting element, a source signal line, first through fourth gate signal lines, a current supply line, first through sixth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to the current supply line. A second electrode of the capacitor means is electrically connected to a first electrode of the third transistor and to a gate electrode of the fifth transistor. A gate electrode of the third transistor is electrically connected to the second gate signal line, and a second electrode of the third transistor is electrically connected to a first electrode of the fourth transistor and to a first electrode of the fifth transistor. A gate electrode of the fourth transistor is electrically connected to the third gate signal line, and a second electrode of the fourth transistor is electrically connected to a first electrode of the light emitting element. A second electrode of the fifth transistor is electrically connected to the current supply line. A gate electrode of the sixth transistor is electrically connected to the fourth gate signal line, and a first electrode of the sixth transistor is electrically connected to the first electrode of the third transistor or to the second electrode of the third transistor.

In another general aspect, a light emitting device has a pixel with a light emitting element, a source signal line, first through fourth gate signal lines, a current supply line, first through sixth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fifth transistor and to a first electrode of the sixth transistor. A second electrode of the capacitor means is electrically connected to a first electrode of the third transistor, to a gate electrode of the fifth transistor, and to a gate electrode of the sixth transistor. A gate electrode of the third transistor is electrically connected to the third gate signal line, and a second electrode of the third transistor is electrically connected to a first electrode of the fourth transistor and to a second electrode of the fifth transistor. A gate electrode of the fourth transistor is electrically connected to the fourth gate signal line, and a second electrode of the fourth transistor is electrically connected to a first electrode of the light emitting element. A second electrode of the sixth transistor is electrically connected to the current supply line.

In another general aspect, a light emitting device has a pixel with a light emitting element, a source signal line, first through third gate signal lines, a current supply line, first through sixth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fifth transistor and to a first electrode of the sixth transistor. A second electrode of the capacitor means is electrically connected to a first electrode of the third transistor, to a gate electrode of the fifth transistor, and to a gate electrode of the sixth transistor. A gate electrode of the third transistor is electrically connected to the second gate signal line, and a second electrode of the third transistor is electrically connected to a first electrode of the fourth transistor and to a second electrode of the fifth transistor. A gate electrode of the fourth transistor is electrically connected to the third gate signal line, and a second electrode of the fourth transistor is electrically connected to a first electrode of the light emitting element. A second electrode of the sixth transistor is electrically connected to the current supply line.

In another general aspect, a light emitting device has a pixel with a light emitting element, a source signal line, first through fourth gate signal lines, a current supply line, first through sixth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fifth transistor and to a first electrode of the sixth transistor. A second electrode of the capacitor means is electrically connected to a first electrode of the third transistor, to a gate electrode of the fifth transistor, and to a gate electrode of the sixth transistor. A gate electrode of the third transistor is electrically connected to the third gate signal line, and a second electrode of the third transistor is electrically connected to a second electrode of the fifth transistor and to a first electrode of the light emitting element. A gate electrode of the fourth transistor is electrically connected to the fourth gate signal line, a first electrode of the fourth transistor is electrically connected to a second electrode of the sixth transistor, and a second electrode of the fourth transistor is electrically connected to the current supply line.

In another general aspect, a light emitting device has a pixel with a light emitting element, a source signal line, first through third gate signal lines, a current supply line, first through sixth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fifth transistor and to a first electrode of the sixth transistor. A second electrode of the capacitor means is electrically connected to a first electrode of the third transistor, to a gate electrode of the fifth transistor, and to a gate electrode of the sixth transistor. A gate electrode of the third transistor is electrically connected to the second gate signal line, and a second electrode of the third transistor is electrically connected to a second electrode of the fifth transistor and to a first electrode of the light emitting element. A gate electrode of the fourth transistor is electrically connected to the third gate signal line, a first electrode of the fourth transistor is electrically connected to a second electrode of the sixth transistor, and a second electrode of the fourth transistor is electrically connected to the current supply line.

In another general aspect, a light emitting device has a pixel with a light emitting element, a source signal line, first through fourth gate signal lines, a current supply line, first through sixth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fourth transistor and to a first electrode of the fifth transistor. A second electrode of the capacitor means is electrically connected to a first electrode of the third transistor, to a gate electrode of the fifth transistor, and to a gate electrode of the sixth transistor. A gate electrode of the third transistor is electrically connected to the third gate signal line, and a second electrode of the third transistor is electrically connected to a second electrode of the fifth transistor and to a first electrode of the light emitting element. A gate electrode of the fourth transistor is electrically connected to the fourth gate signal line, and a second electrode of the fourth transistor is electrically connected to a first electrode of the sixth transistor. A second electrode of the sixth transistor is electrically connected to the current supply line.

In another general aspect, a light emitting device has a pixel with a light emitting element, a source signal line, first through third gate signal lines, a current supply line, first through sixth transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fourth transistor and to a first electrode of the fifth transistor. A second electrode of the capacitor means is electrically connected to a first electrode of the third transistor, to a gate electrode of the fifth transistor, and to a gate electrode of the sixth transistor. A gate electrode of the third transistor is electrically connected to the second gate signal line, and a second electrode of the third transistor is electrically connected to a second electrode of the fifth transistor and to a first electrode of the light emitting element. A gate electrode of the fourth transistor is electrically connected to the third gate signal line, and a second electrode of the fourth transistor is electrically connected to a first electrode of the sixth transistor. A second electrode of the sixth transistor is electrically connected to the current supply line.

In another general aspect, a light emitting device has a pixel with a light emitting element, a source signal line, first through fifth gate signal lines, a current supply line, first through seventh transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fifth transistor and to a first electrode of the sixth transistor. A second electrode of the capacitor means is electrically connected to a first electrode of the third transistor, to a gate electrode of the fifth transistor, and to a gate electrode of the sixth transistor. A gate electrode of the third transistor is electrically connected to the third gate signal line, and a second electrode of the third transistor is electrically connected to a second electrode of the fifth transistor and to a first electrode of the light emitting element. A gate electrode of the fourth transistor is electrically connected to the fourth gate signal line, a first electrode of the fourth transistor is electrically connected to a second electrode of the sixth transistor, and a second electrode of the fourth transistor is electrically connected to the current supply line. A gate electrode of the seventh transistor is electrically connected to the fifth gate signal line, and a first electrode of the seventh transistor is electrically connected to the first electrode of the third transistor or to the second electrode of the third transistor.

In another general aspect, a light emitting device has a pixel with a light emitting element, a source signal line, first through fourth gate signal lines, a current supply line, first through seventh transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fifth transistor and to a first electrode of the sixth transistor. A second electrode of the capacitor means is electrically connected to a first electrode of the third transistor, to a gate electrode of the fifth transistor, and to a gate electrode of the sixth transistor. A gate electrode of the third transistor is electrically connected to the second gate signal line, and a second electrode of the third transistor is electrically connected to a second electrode of the fifth transistor and to a first electrode of the light emitting element. A gate electrode of the fourth transistor is electrically connected to the third gate signal line, a first electrode of the fourth transistor is electrically connected to a second electrode of the sixth transistor, and a second electrode of the fourth transistor is electrically connected to the current supply line. A gate electrode of the seventh transistor is electrically connected to the fourth gate signal line, and a first electrode of the seventh transistor is electrically connected to the first electrode of the third transistor or to the second electrode of the third transistor.

In another general aspect, a light emitting device has a pixel with a light emitting element, a source signal line, first through fifth gate signal lines, a current supply line, first through seventh transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fourth transistor and to a first electrode of the fifth transistor. A second electrode of the capacitor means is electrically connected to a first electrode of the third transistor, to a gate electrode of the fifth transistor, and to a gate electrode of the sixth transistor. A gate electrode of the third transistor is electrically connected to the third gate signal line, and a second electrode of the third transistor is electrically connected to a second electrode of the fifth transistor and to a first electrode of the light emitting element. A gate electrode of the fourth transistor is electrically connected to the fourth gate signal line, and a second electrode of the fourth transistor is electrically connected to a first electrode of the sixth transistor. A second electrode of the sixth transistor is electrically connected to the current supply line. A gate electrode of the seventh transistor is electrically connected to the fifth gate signal line, and a first electrode of the seventh transistor is electrically connected to the first electrode of the third transistor or to the second electrode of the third transistor.

In another general aspect, a light emitting device has a pixel with a light emitting element, a source signal line, first through fourth gate signal lines, a current supply line, first through seventh transistors, and capacitor means. A gate electrode of the first transistor is electrically connected to the first gate signal line, a first electrode of the first transistor is electrically connected to the source signal line, and a second electrode of the first transistor is electrically connected to a first electrode of the capacitor means and to a first electrode of the second transistor. A gate electrode of the second transistor is electrically connected to the second gate signal line, and a second electrode of the second transistor is electrically connected to a first electrode of the fourth transistor and to a first electrode of the fifth transistor. A second electrode of the capacitor means is electrically connected to a first electrode of the third transistor, to a gate electrode of the fifth transistor, and to a gate electrode of the sixth transistor. A gate electrode of the third transistor is electrically connected to the second gate signal line, and a second electrode of the third transistor is electrically connected to a second electrode of the fifth transistor and to a first electrode of the light emitting element. A gate electrode of the fourth transistor is electrically connected to the third gate signal line, and a second electrode of the fourth transistor is electrically connected to a first electrode of the sixth transistor. A second electrode of the sixth transistor is electrically connected to the current supply line. A gate electrode of the seventh transistor is electrically connected to the fourth gate signal line, and a first electrode of the seventh transistor is electrically connected to the first electrode of the third transistor or to the second electrode of the third transistor.

In another general aspect, a light emitting device has a pixel with a light emitting element, a source signal line, first through fifth gate signal lines, a current supply line, first through seventh transistors, and capacitor means. A gate electrode of the first transistor is electrically connected to the first gate signal line, a first electrode of the first transistor is electrically connected to the source signal line, and a second electrode of the first transistor is electrically connected to a first electrode of the second transistor, to a first electrode of the sixth transistor, and to a first electrode of the capacitor means. A gate electrode of the second transistor is electrically connected to the second gate signal line, and a second electrode of the second transistor is electrically connected to the current supply line. A second electrode of the capacitor means is electrically connected to a first electrode of the third transistor, to a gate electrode of the fifth transistor, and to a gate electrode and second electrode of the sixth transistor. A gate electrode of the third transistor is electrically connected to the third gate signal line, and a second electrode of the third transistor is electrically connected to a first electrode of the fourth transistor and to a first electrode of the fifth transistor. A gate electrode of the fourth transistor is electrically connected to the fourth gate signal line, and a second electrode of the fourth transistor is electrically connected to a first electrode of the light emitting element. A second electrode of the fifth transistor is electrically connected to the current supply line. The seventh transistor is placed between the second electrode of the first transistor and the first electrode of the sixth transistor, or between the first electrode of the third transistor and the second electrode of the sixth transistor, or between the first electrode of the third transistor and the gate electrode of the sixth transistor, and a gate electrode of the seventh transistor is electrically connected to the fifth gate signal line.

In another general aspect, a light emitting device has a pixel with a light emitting element, a source signal line, first through fourth gate signal lines, a current supply line, first through seventh transistors, and capacitor means. A gate electrode of the first transistor is electrically connected to the first gate signal line, a first electrode of the first transistor is electrically connected to the source signal line, and a second electrode of the first transistor is electrically connected to a first electrode of the second transistor, to a first electrode of the sixth transistor, and to a first electrode of the capacitor means. A gate electrode of the second transistor is electrically connected to the second gate signal line, and a second electrode of the second transistor is electrically connected to the current supply line. A second electrode of the capacitor means is electrically connected to a first electrode of the third transistor, to a gate electrode of the fifth transistor, and to a gate electrode and a second electrode of the sixth transistor. A gate electrode of the third transistor is electrically connected to the second gate signal line, and a second electrode of the third transistor is electrically connected to a first electrode of the fourth transistor and to a first electrode of the fifth transistor. A gate electrode of the fourth transistor is electrically connected to the third gate signal line, and a second electrode of the fourth transistor is electrically connected to a first electrode of the light emitting element. A second electrode of the fifth transistor is electrically connected to the current supply line. The seventh transistor is placed between the second electrode of the first transistor and the first electrode of the sixth transistor, or between the first electrode of the third transistor and the second electrode of the sixth transistor, or between the first electrode of the third transistor and the gate electrode of the sixth transistor, and a gate electrode of the seventh transistor is electrically connected to the fourth gate signal line.

Implementations may include one or more of the following features. For example, the second transistor and the third transistor may have the same polarity.

The expression (W1/L1)>(W2/L2) may be satisfied when the gate length of the fifth transistor is given as L1, the channel width thereof as W1, the gate length of the sixth transistor as L2, and the channel width thereof as W2.

The second electrode of the sixth transistor may be electrically connected to a power supply line that has an electric potential different from the electric potential of the current supply line, or to one of the gate signal lines except the gate signal line that controls the pixel. Similarly, a second electrode of the light emitting element may be electrically connected to a power supply line that has an electric potential different from the electric potential of the current supply line.

The pixel may have capacitor storage means, a first electrode of the capacitor storage means may be electrically connected to the second electrode of the first transistor, and a second electrode of the capacitor storage means may receive a constant electric potential to hold a video signal inputted from the source signal line.

In another general aspect, a method of driving a light emitting device is provided. The light emitting device has a pixel with a light emitting element, a source signal line, a current supply line, a transistor for supplying a desired current to the light emitting element, and capacitor means. The method includes a first step of accumulating electric charges in the capacitor means, a second step of making a voltage between two electrodes of the capacitor means into a voltage equal to the threshold voltage of the transistor, a third step of inputting a video signal from the source signal line, and a fourth step of adding the threshold voltage to the electric potential of the video signal and applying it to a gate electrode of the transistor, so that a current is supplied to the light emitting element through the transistor and light is emitted. The voltage between the two electrodes of the capacitor means is constant in at least the third step, and the first transistor is turned non-conductive in at least the first and second steps.

In another general aspect, a method of driving a light emitting device is provided. The light emitting device has a pixel with a light emitting element, at least a current supply line, first through third transistors, and capacitor means. The first transistor has a gate electrode that is electrically connected to a first electrode of the second transistor and to a first electrode of the capacitor means, a first electrode that is electrically connected to the current supply line, and a second electrode that is electrically connected to a second electrode of the second transistor and to a first electrode of the third transistor. The second transistor has a gate electrode through which a first signal is inputted. The third transistor has a gate electrode through which a second signal is inputted. The capacitor means has a second electrode which is electrically connected to a first electrode of the fourth transistor and through which a video signal is inputted. The fourth transistor has a gate electrode through which a third signal is inputted and a second electrode that is electrically connected to the current supply line. The method includes a first step of turning the second through fourth transistors conductive by inputting the first through third signals to thereby accumulate electric charges in the capacitor means, a second step of turning the third transistor non-conductive and turning the second and fourth transistors conductive by inputting the first and third signals to thereby make a voltage held in the capacitor means into a voltage equal to the threshold voltage of the first transistor, a third step of turning the second through fourth transistors non-conductive and inputting the video signal through the second electrode of the capacitor means, and a fourth step of turning the second and fourth transistors non-conductive and turning the third transistor conductive by inputting the second signal to thereby cause a current flow between the source and drain of the first and third transistors. The voltage between the two electrodes of the capacitor means is constant in at least the third step.

The device may be employed in electronic equipment chosen from the group consisting of a video camera, a digital camera, a goggle type display, a navigation system, an audio reproducing device, a notebook personal computer, a game machine, a mobile computer, a cellular phone, and a DVD player.

The details of one or more implementations are set forth in the accompanying drawings and the description below. Other features will be apparent from the description and drawings, and from the claims.

DESCRIPTION OF DRAWINGS

FIGS. 2A-2F are diagrams illustrating drive of the pixel shown in FIGS. 1A and 1B.

FIGS. 6A-6F are diagrams illustrating driving the pixel shown in FIGS. 5A and 5B.

FIGS. 13A-13D are diagrams showing an example of light emitting device manufacturing process.

FIGS. 14A-14D are diagrams showing an example of light emitting device manufacturing process.

FIGS. 15A-15D are diagrams showing an example of light emitting device manufacturing process.

FIGS. 19A-19F are diagrams illustrating driving of the pixel shown in FIGS. 18A and 18B.

FIGS. 21A-21C are diagrams showing an embodiment of the pixel structure in a light emitting device of the present invention and the operation.

FIGS. 22A-22D are diagrams showing an embodiment of the pixel structure in a light emitting device of the present invention and the operation.

FIGS. 24A-24D are timing charts for gate signal lines of when a light emitting device having a pixel of the present invention is driven by a digital time ratio gray scale method.

FIGS. 26A and 26B are diagrams illustrating the operation principle of the present invention.

FIGS. 32A-32E are diagrams showing an embodiment of the pixel structure in a light emitting device of the present invention and the operation.

Like reference symbols in the various drawings indicate like elements.

DETAILED DESCRIPTION

Figure 3:
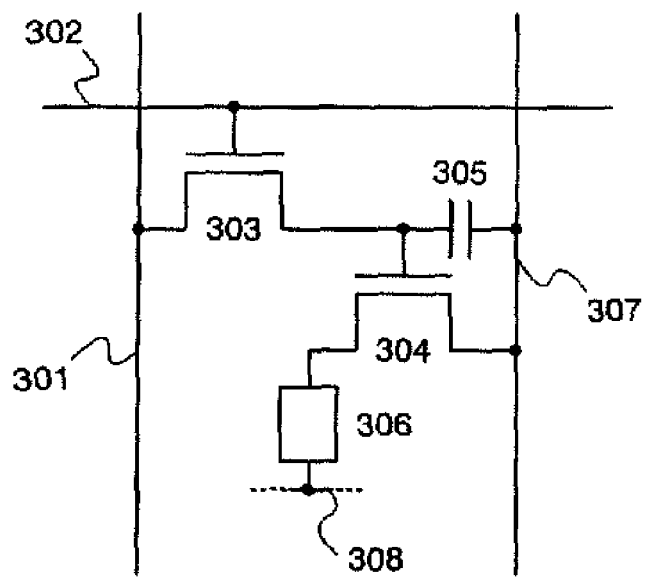
FIG. 3 is a diagram showing a structural example of a pixel commonly used in a light emitting device.

FIG. 3 shows the structure of a pixel in a common light emitting device. An EL display device is taken as an example of a typical light emitting device. The pixel shown in FIG. 3 has a source signal line 301, a gate signal line 302, a switching TFT 303, a driving TFT 304, capacitor means 305, an EL element 306, a current supply line 307, and a power supply 308.

How the parts are connected will be described. The TFTs each have three terminals, gate, source, and drain. Source and drain cannot be discriminated clearly from each other because of the TFT structure. Therefore, one of source and drain is referred to as first electrode and the other is referred to as second electrode when connection between elements is described. The terms source and drain will be used when it is necessary to describe the electric potentials of the terminals (e.g., the gate-source voltage of a TFT) in regard to ON and OFF of TFTs.

In the present invention, a TFT being ON means that the gate-source voltage of the TFT has exceed its threshold to cause a current to flow between the source and the drain. A TFT being OFF means that the gate-source voltage of the TFT is below its threshold and no current is flowing between the source and the drain.

The switching TFT 303 has a gate electrode connected to the gate signal line 302. A first electrode of the switching TFT 303 is connected to the source signal line 301 and a second electrode of the switching TFT 303 is connected to a gate electrode of the driving TFT 304. A first electrode of the driving TFT 304 is connected to the current supply line 307 and a second electrode of the driving TFT 304 is connected to a first electrode of the EL element 306. A second electrode of the EL element 306 is connected to the power supply 308. The capacitor means 305 is connected between the gate electrode and first electrode of the driving TFT 304 to hold the gate-source voltage of the driving TFT 304.

When the electric potential of the gate signal line 302 is changed to turn the switching TFT 303 ON, a video signal that has been inputted to the source signal line 301 is inputted to the gate electrode of the driving TFT 304. The gate-source voltage of the driving TFT 304 is determined in accordance with the electric potential of the video signal inputted, thereby determining a current flowing between the source and drain of the driving TFT 304 (hereinafter referred to as drain current). This current is supplied to the EL element 306 to emit light.

Here, a TFT formed of polycrystalline silicon (polysilicon, hereinafter referred to as P—Si) is higher in field effect mobility and larger in ON current than a TFT formed of amorphous silicon (hereinafter referred to as A-Si), and is therefore more suitable as a transistor for use in a light emitting device.

On the other hand, a TFT formed of polysilicon has a problem in that its electric characteristic is fluctuated easily by defects in crystal grain boundaries.

If the threshold, ON current, and other characteristics of TFTs that constitute a pixel fluctuate between pixels structured as shown in FIG. 3, the drain current level is varied between the TFTs by the fluctuation even though the same video signal is inputted. This causes fluctuation in luminance of the EL element 306 and therefore it raises a problem in the case of analog gray scale.

Accordingly, a digital gray scale method has been provided which uses a region where the threshold or the like of a TFT hardly effects ON current to drive an EL element in a manner that allows only two levels of luminance, either 100% or 0%. This method can produce only two gray scales, white and black, and therefore the number of gray scales is increased by combining the method with a time ratio gray scale method or the like.

Figure 4A:
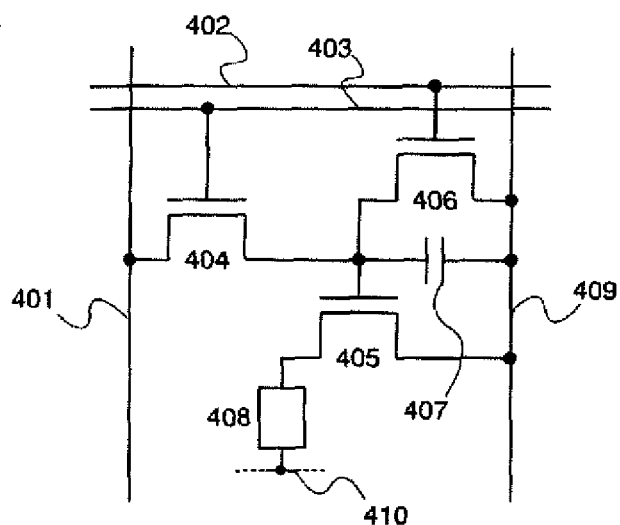
FIGS. 4A and 4B are diagrams showing a pixel structure of when driving by a time ratio gray scale method using a digital video signal.
Figure 4B:
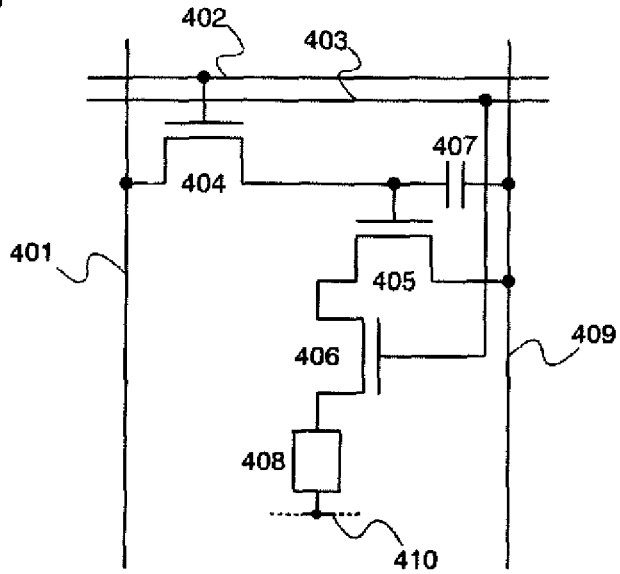

When the digital gray scale method is combined with a time ratio gray scale method, a pixel of a light emitting device can be structured as shown in FIGS. 4A and 4B. By using an erasing TFT 406 in addition to a switching TFT 404 and a driving TFT 405, the length of light emission time can be controlled minutely.

Also proposed is a device that uses an analog gray scale method to correct fluctuation in threshold of TFTs. As shown in FIG. 5, a pixel of the device has a source signal line 501, first through third gate signal lines 502 to 504, TFTs 505 to 508, capacitor means 509 ($C_2$) and 510 ($C_1$), a current supply line 512, and an EL element 511.

The TFT 505 has a gate electrode connected to the first gate signal line 502. A first electrode of the TFT 505 is connected to the source signal line 501 and a second electrode of the TFT 505 is connected to a first electrode of the capacitor means 509. A second electrode of the capacitor means 509 is connected to a first electrode of the capacitor means 510. A second electrode of the capacitor means 510 is connected to the current supply line 512. The TFT 506 has a gate electrode connected to the second electrode of the capacitor means 509 and to the first electrode of the capacitor means 510. A first electrode of the TFT 506 is connected to the current supply line 512. A second electrode of the TFT 506 is connected to a first electrode of the TFT 507 and to a first electrode of the TFT 508. A gate electrode of the TFT 507 is connected to the second gate signal line 503. A second electrode of the TFT 507 is connected to the second electrode of the capacitor means 509 and to the first electrode of the capacitor means 510. A gate electrode of the TFT 508 is connected to the third gate signal line 504, and a second electrode of TFT 508 is connected to a first electrode of the EL element 511. A second electrode of the EL element 511 receives from the power supply 513 a constant electric potential, which is different from the electric potential of the current supply line 512.

Figure 5A:
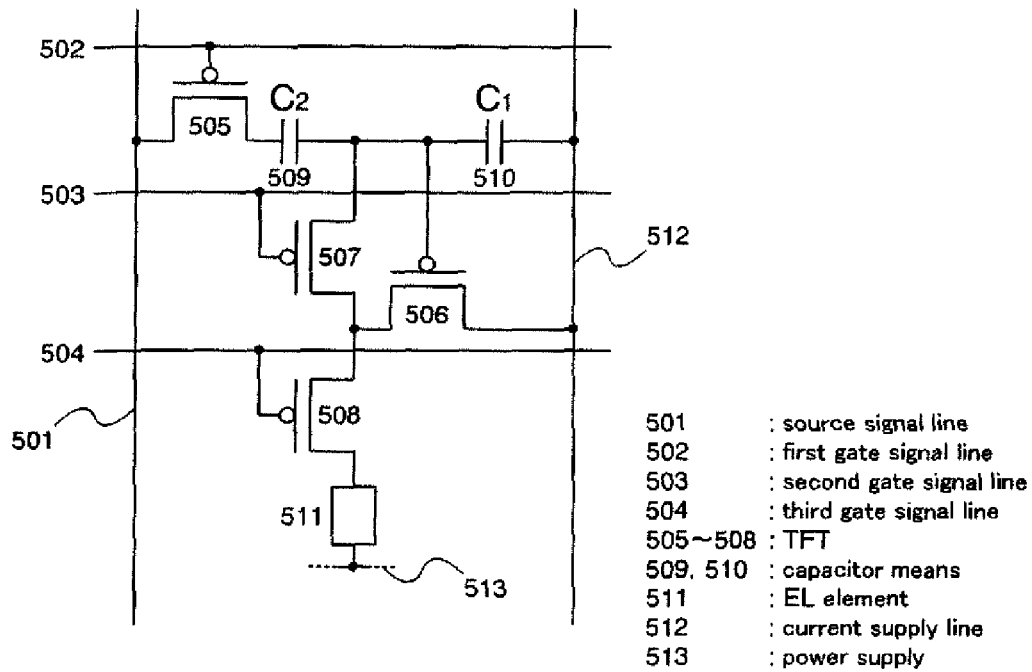
FIGS. 5A and 5B are diagrams showing the structure of a pixel capable of correcting threshold fluctuation.
Figure 5B:
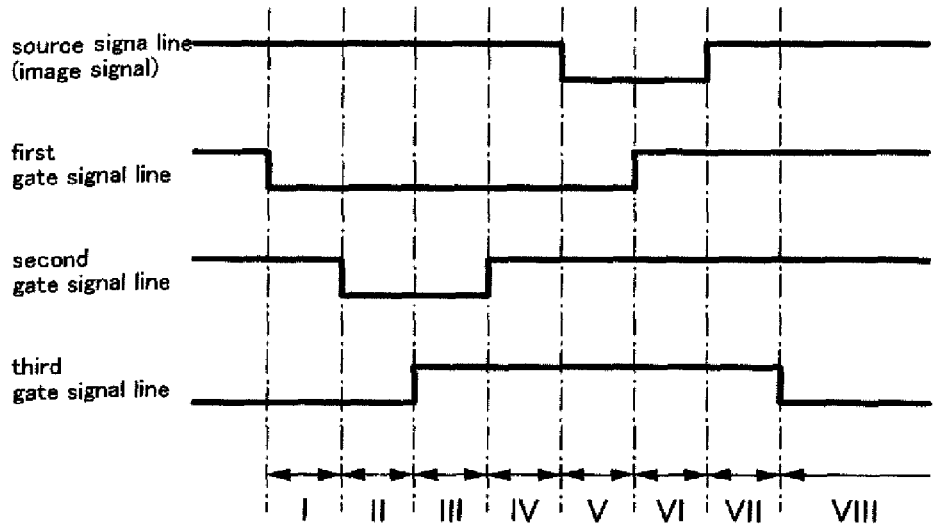

The operation thereof is described with reference to FIG. 5B and FIGS. 6A to 6F. FIG. 5B shows timing of video signals and pulses inputted to the source signal line 501 and the first through third gate signal lines 502 to 504, and is divided into eight sections, I to VIII, in accordance with operations shown in FIG. 6. In the example shown in FIG. 5, the pixel is composed of four TFTs, which have the same p-channel polarity. Therefore, each of the TFTs is turned ON by inputting the L level to its gate electrode and is turned OFF when its gate electrode receives the H level.

First, the first gate signal line 502 reaches the L level to turn the TFT 505 ON (Section I). Subsequently, the second and third gate signal lines reach the L level to turn the TFTs 507 and 508 ON. The capacitor means 509 and 510 are charged at this point as shown in FIG. 6A, and when the voltage held in the capacitor means 510 exceeds the threshold ($V_{th}$) of the TFT 506, the TFT 506 is turned ON (Section II).

Then, the third gate signal line reaches the H level to turn the TFT 508 OFF. This causes the electric charges accumulated in the capacitor means 509 and 510 to move again and eventually, the voltage held in the capacitor means 510 becomes equal to $V_{th}$. At this point, the voltage held in the capacitor means 509 also becomes equal to $V_{th}$ since the electric potential of the current supply line 512 and the electric potential of the source signal line 501 are both $V_{DD}$ as shown in FIG. 6B. Therefore, the TFT 506 is eventually turned OFF.

When the voltages held in the capacitor means 509 and 510 become equal to $V_{th}$ as described above, the second gate signal line 503 reaches the H level to turn the TFT 507 OFF (Section IV). Through this operation, $V_{th}$ is held in the capacitor means as shown in FIG. 6C. At this point, electric charges $Q_1$ held in the capacitor means 510 ($C_1$) satisfy Expression (1). At the same time, electric charges $Q_2$ held in the capacitor means 509 ($C_2$) satisfy Expression (2).

[Numerical Expression: 1]

$$Q_1 = C_1 \times |V_{th}| \quad (1)$$

[Numerical Expression: 2]

$$Q_2 = C_2 \times |V_{th}| \quad (2)$$

Then, a video signal is inputted as shown in FIG. 6D (Section V). A video signal is outputted to the source signal line 501 and the electric potential thereof is changed from $V_{DD}$ to the electric potential $V_{Data}$ of the video signal, (here, $V_{DD} > V_{Data}$ since the TFT 506 is a p-channel TFT). If the electric potential of the gate electrode of the TFT 506 at this point is given as $V_P$ and electric charges at this node are given as Q. Expressions (3) and (4) are satisfied because of the law of conservation of electric charges including the capacitor means 509 and 510.

[Numerical Expression 3]

$$Q + Q_1 = C_1 \times (V_{DD} - V_P) \quad (3)$$

[Numerical Expression 4]

$$Q - Q_2 = C_2 \times (V_P - V_{Data}) \quad (4)$$

From Expressions (1) to (4), the electric potential $V_P$ of the gate electrode of the TFT 506 is expressed by Expression (5).

[Numerical Expression 5]

-continued $$V_P = \frac{C_1}{C_1 + C_2} V_{DD} + \frac{C_2}{C_1 + C_2} V_{Data} - |V_{th}| \quad (5)$$

Therefore, a gate-source voltage $V_{GS}$ of the TFT 506 is expressed by Expression (6).

[Numerical Expression 6]

$$\begin{aligned} V_{GS} &= V_P - V_{DD} \quad (6) \\ &= \frac{C_2}{C_1 + C_2}(V_{Data} - V_{DD}) - |V_{th}| \\ &= \frac{C_2}{C_1 + C_2}(V_{Data} - V_{DD}) + V_{th} \end{aligned}$$

The right side of Expression (6) includes the term $V_{th}$. This means that the threshold of the TFT 506 in the pixel is added to the video signal inputted from the source signal line before the video signal is held in the capacitor means 510.

When inputting the video signal is completed, the first gate signal line 502 reaches the H level to turn the TFT 505 OFF (Section VI). Thereafter, the electric potential of the source signal line returns to the given level (Section VII). Through the above operations, the operation of writing a video signal in the pixel is completed (FIG. 6E).

Subsequently, the third gate signal line reaches the L level to turn the TFT 508 ON. This causes a current to flow into the EL element as shown in FIG. 6F, thereby making the EL element emit light. The value of the current flowing into the EL element at this point is determined in accordance with the gate-source voltage of the TFT 506 and a drain current $I_{DS}$ flowing in the TFT 506 is expressed by Expression (7).

[Numerical Expression 7]

$$\begin{aligned} I_{DS} &= \frac{\beta}{2}(V_{GS} - V_{th})^2 \quad (7) \\ &= \frac{\beta}{2}\left\{\frac{C_2}{C_1 + C_2}(V_{Data} - V_{DD})\right\}^2 \end{aligned}$$

It is understood from Expression 7 that the drain current $I_{DS}$ of the TFT 506 is independent of the threshold $V_{th}$. Therefore, even when the threshold of the TFT 506 fluctuates, a current according to the electric potential $V_{Data}$ of a video signal flows into the EL element by correcting the fluctuation in each pixel and adding the corrected threshold to the video signal.

However, in the structure described above, the drain current $I_{DS}$ of the TFT 506 is fluctuated if the capacitance values of the capacitor means 509 and 510 fluctuate. Accordingly, an object of the present invention is to provide a light emitting device employing a pixel in which correction of fluctuation in TFT threshold is made possible by a structure that is not influenced by fluctuation in capacitance value.

Means for Solving the Problem

According to the method described above, the drain current $I_{DS}$ of the TFT 506 is dependent on the capacitance values of the two capacitor means 509 and 510. In other words, electric charges move between the capacitor means $C_1$ and $C_2$ when it shifts from holding of the threshold (FIG. 6C) to writing of a video signal (FIG. 6D). This means that the voltage between two electrodes of $C_1$ and the voltage between two electrodes of $C_2$ are changed when it proceeds from FIG. 6C to FIG. 6D. If the capacitance values of $C_1$ and $C_2$ are fluctuated at this point, the voltage between two electrodes of $C_1$ and the voltage between two electrodes of $C_2$ are also fluctuated. In the present invention, no electric charges move in capacitor means while a video signal is inputted after the threshold is stored in the capacitor means. Accordingly, the voltage between two electrodes of the capacitor means does not change. This makes correction possible by simply adding the threshold to the video signal, and therefore fluctuation in capacitance value is prevented from affecting the drain current. Transistors in the present invention are mainly TFTs but they are given as an example and single crystal transistors or transistors utilizing an organic may be employed instead. For instance, TFTs formed by using the SOI technique may be used as single crystal transistors. Thin film transistors may be ones that use a polycrystalline semiconductor for their active layers or ones that use an amorphous semiconductor for their active layers. Examples thereof include TFTs using polysilicon and TFTs using amorphous silicon. Other than those, bipolar transistors, or transistors formed of carbon nanotubes or the like may be employed.

Embodiment Mode of the Invention

Figure 1A:
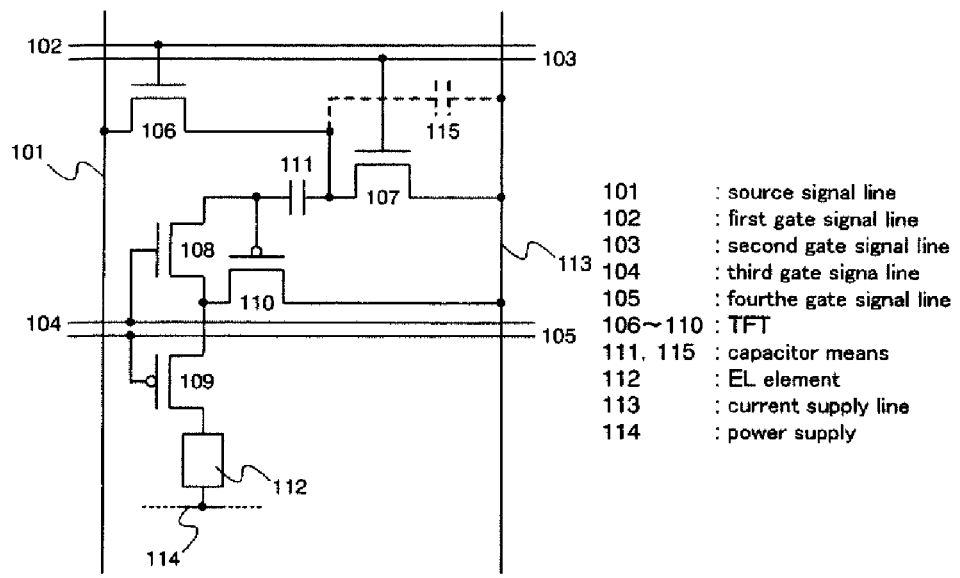
FIGS. 1A and 1B are diagrams showing a mode of pixel structure in a light emitting device of the present invention.

FIG. 1A shows an embodiment of the present invention. There is provided a source signal line 101, first to fourth gate signal lines 102 to 105, first to fifth TFTs 106 to 110, first and second capacitor means 111 and 115, an EL element 112, a current supply line 113, and a power supply 114.

The first TFT 106 has a gate electrode connected to the first gate signal line 102. A first electrode of the first TFT 106 is connected to the source signal line 101 and a second electrode of the first TFT 106 is connected to a first electrode of the second TFT 107. A gate electrode of the second TFT 107 is connected to the second gate signal line 103. A second electrode of the second TFT 107 is connected to the current supply line 113. The first capacitor means 111 has a first electrode connected to the first electrode of the second TFT 107 and has a second electrode connected to a first electrode of the third TFT 108. A gate electrode of the third TFT 108 is connected to the third gate electrode 104. A second electrode of the third TFT 108 is connected to a first electrode of the fourth TFT 109. A gate electrode of the fourth TFT 109 is connected to the fourth gate signal line 105. A second electrode of the fourth TFT 109 is connected to a first electrode of the EL element 112. The fifth TFT 110 has a gate electrode connected to the first electrode of the third TFT 108 and to the second electrode of the first capacitor means 111. A first electrode of the fifth TFT 110 is connected to the second electrode of the third TFT 108 and to the first electrode of the fourth TFT 109. A second electrode of the fifth TFT 110 is connected to the current supply line 113. The second capacitor means 115 is placed between the second electrode of the first TFT 106 and the current supply line 113 to hold the electric potential of a video signal inputted from the source signal line 101. The device does not particularly need the second capacitor means 115 to operate. A second electrode of the EL element 112 receives from the power supply 114 a constant electric potential, which is different from the electric potential of the current supply line 113.

Figure 1B:
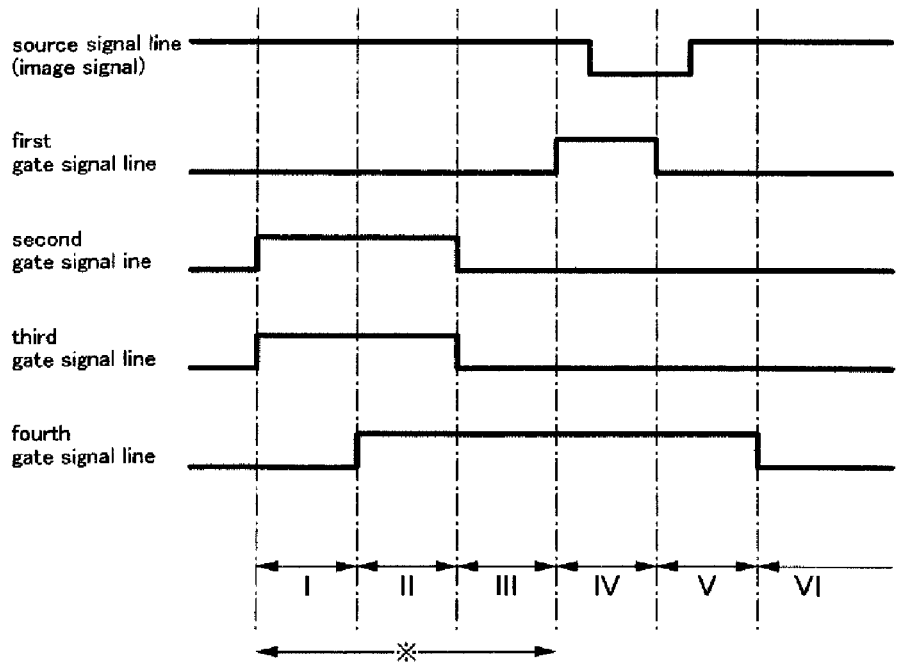

The operation thereof is described with reference to FIG. 1B and FIGS. 2A to 2F. FIG. 1B shows timing of video signals and pulses inputted to the source signal line 101 and the first through fourth gate signal lines 102 to 105, and is divided into six sections, I to VI, in accordance with operations shown in FIG. 2. In the structure shown in FIG. 1A, the first through third TFTs 106 to 108 are n-channel TFTs and the fourth and fifth TFTs 109 and 110 are p-channel TFTs. The TFTs constituting the device may all be p-channel TFTs as shown in FIG. 5A. However, the first through third TFTs 106 to 108 here are n-channel TFTs. Each of the n-channel TFTs is turned ON by inputting the H level to its gate electrode and is turned OFF when its gate electrode receives the L level. Each of the p-channel TFTs is turned ON by inputting the L level to its gate electrode and is turned OFF when its gate electrode receives the H level.

For simplification, the second capacitor means 115 is omitted in FIGS. 2A to 2F.

First, the second and third gate signal lines 103 and 104 reach the H level and the fourth gate signal line 105 reaches the L level to turn the TFTs 107 to 109 ON (Section I). This generates a current shown in FIG. 2A to charge the capacitor means 111. When the voltage held in the capacitor means 111 exceeds the threshold ($V_{th}$) of the TFT 110, the TFT 110 is turned ON.

Thereafter, the fourth gate signal line 105 reaches the H level to turn the TFT 109 OFF (Section II). This closes the path between the current supply line 113 and the EL element 112 and the current flow is stopped. On the other hand, as shown in FIG. 2, the electric charges accumulated in the capacitor means 111 start to move again. Since the voltage between two electrodes of the capacitor means 111 equals the gate-source voltage of the TFT 110, the TFT 110 is turned OFF and movement of the electric charges is ended as this voltage becomes equal to $V_{th}$ (FIG. 2B).

Then, the second and third gate signal lines 103 and 104 both reach the L level to turn the TFTs 107 and 108 OFF. Accordingly, the threshold voltage of the TFT 110 is held in the capacitor means 111 as shown in FIG. 2C.

Subsequently, the first gate signal line 102 reaches the H level to turn the TFT 106 ON (Section IV). A video signal is outputted to the source signal line 101 and the electric potential thereof is changed from $V_{DD}$ to the electric potential $V_{Data}$ of the video signal, (here, $V_{DD} > V_{Data}$ since the TFT 110 is a p-channel TFT). At this point, $V_{th}$ mentioned above has been held in the capacitor means 111 without a change, and therefore the electric potential of the gate electrode of the TFT 110 is one obtained by adding the threshold $V_{th}$ to the electric potential $V_{Data}$ of the video signal inputted from the source signal line 101. This turns the TFT 110 ON (FIG. 2D).

As writing of a video signal is completed, the first gate signal line 102 reaches the L level to turn the TFT 106 OFF (Section V). Thereafter, outputting a video signal to the source signal line is finished and the electric potential of the source signal line returns to $V_{DD}$ (FIG. 2E).

Subsequently, the fourth gate signal line 105 reaches the L level to turn the TFT 109 ON (Section VI). Since the TFT 110 has already been turned ON, the EL element 112 emits light when a current flows into the EL element 112 from the current supply line 113 (FIG. 2F). The value of the current flowing into the EL element 112 at this point is determined in accordance with the gate-source voltage of the TFT 110, and the gate-source voltage of the TFT 110 at that time is ($V_{DD} - (V_{Data} + V_{th})$). If the threshold $V_{th}$ of the TFT 110 fluctuates among pixels, a voltage according to the fluctuation is held in the capacitor means 111 of each pixel. Therefore, the luminance of the EL element 112 is not influenced by fluctuation in threshold.

Through the above operations, a video signal is written and light is emitted. The present invention can offset the electric potential of a video signal by the threshold of the TFT 110 through capacitive coupling of the capacitor means 111. Accordingly, the threshold can be corrected accurately without being influenced by characteristic fluctuation of other elements or the like as described above.

FIGS. 26A and 26B are diagrams for a simple illustration of threshold correction operations in a prior art and in the present invention. In FIG. 26A, electric charges are held between two capacitor means $C_1$ and $C_2$ and there is movement of electric charges when a video signal is inputted. Therefore, a gate-source voltage $V_{GS}$ of a TFT that supplies a current to an EL element is expressed by an expression that includes capacitance values $C_1$ and $C_2$ in its terms as shown in (iii) of FIG. 26A. This means that fluctuation in capacitance values $C_1$ and $C_2$ leads to fluctuation in gate-source voltage of the TFT.

In contrast, in the present invention, electric charges are held in capacitor means but there is no movement of electric charges when a video signal is inputted as shown in (iii) of FIG. 26B. In other words, an electric potential obtained by adding the threshold voltage to the electric potential of the video signal is applied without a change to the gate electrode of the TFT. This is more effective in keeping the gate-source voltage of the TFT from being fluctuated.

The timing of selecting a pixel, namely, the timing of writing a video signal in a pixel, is determined by the timing of inputting a signal to the source signal line 101 and the timing of selecting the first gate signal line 102. This means that operations in a pixel such as initializing and charging capacitor means with electric charges can be conducted independent of the timing of writing a video signal. These operations may be concurrently performed on plural rows, and therefore, the timing of, e.g., selecting the second to fourth gate signal lines in one row may overlap with the timing in another row. Accordingly, a period indicated by □ in FIG. 1B, namely, a period for the operation of storing the threshold voltage, can be set long.

Figure 20A:
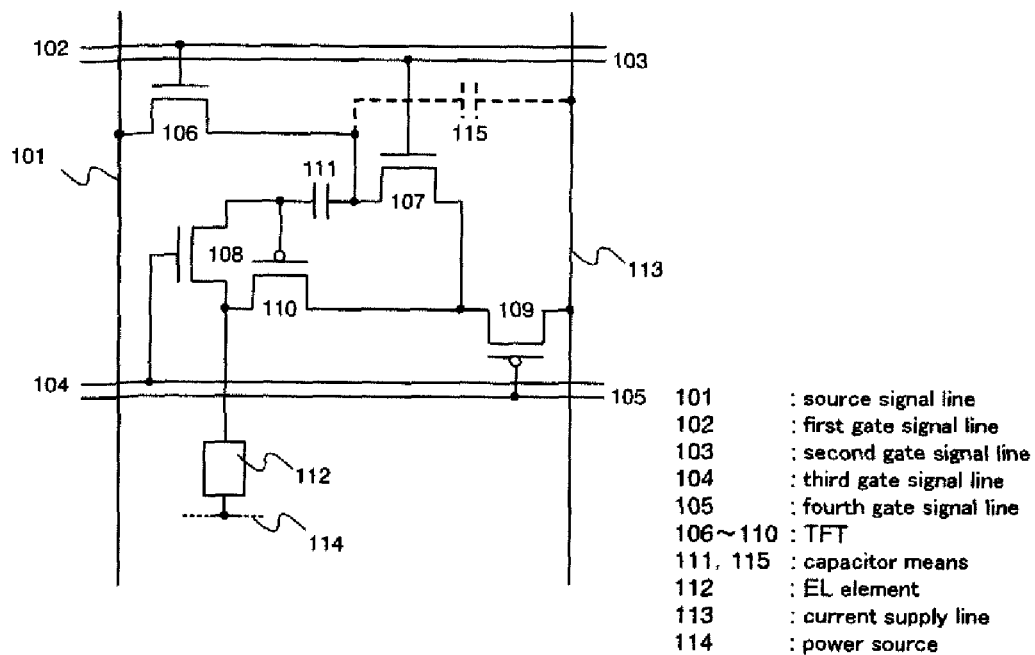
FIGS. 20A and 20B are diagrams showing an embodiment of the pixel structure in a light emitting device of the present invention and the operation.

The TFT 109 in FIG. 1A may be repositioned to obtain a structure of FIG. 20A. FIG. 20A and FIG. 1A use the same symbols. The TFT 109 is moved from the position between the first electrode of the TFT 110 and the EL element 112 to the position between the second electrode of the TFT 110, the second electrode of the TFT 107, and the current supply line 113.

The polarities of the TFTs in the structure of this embodiment mode are merely given as an example and not to put limitation.

In the embodiment mode of the present invention which is shown in FIG. 1, each pixel is controlled by four gate signal lines. However, the TFTs 107 and 108, which are controlled by the second and third gate signal lines 103 and 104, have the same operation timing as shown in FIG. 1B, and therefore, can be controlled by the same gate signal line if the TFTs 107 and 108 have the same polarity. The number of gate signal lines can thus be reduced and, in this case, the aperture ratio can be raised.

EMBODIMENTS

Embodiments of the present invention will be described below.

Embodiment 1

Figure 7A:
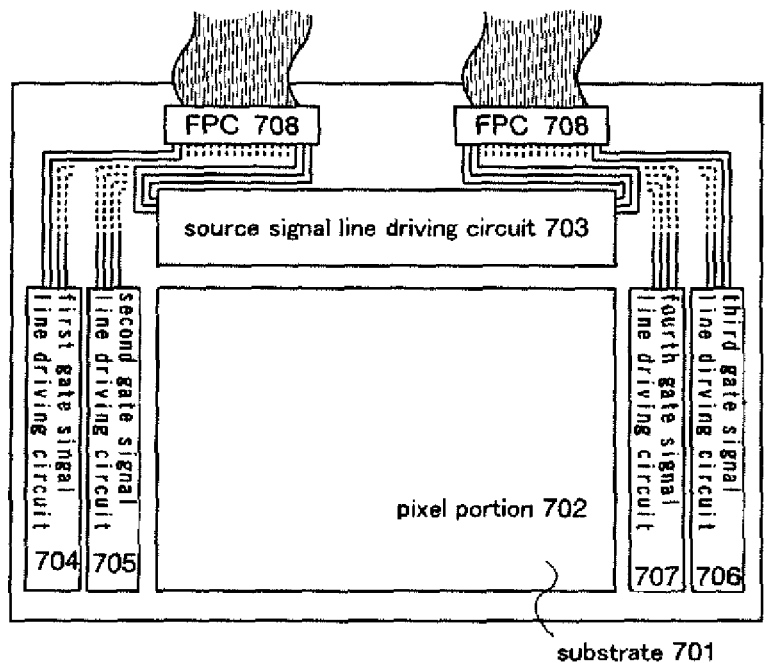
FIGS. 7A-7C are diagrams showing a structural example of an analog video signal input type light emitting device that is an embodiment of the present invention.

In this embodiment, the configuration of a light emitting device in which analogue video signals are used for video signals for display will be described. FIG. 7A depicts the exemplary configuration of the light emitting device. The device has a pixel portion 702 where a plurality of pixels is arranged in a matrix shape over a substrate 701, and it has a source signal line driving circuit 703 and first to fourth gate signal line driving circuits 704 to 707 around the pixel portion. In FIG. 7A, four couples of gate signal line driving circuits are used to control the first to fourth gate signal lines in pixels shown in FIG. 1.

Signals inputted to the source signal line driving circuit 703, and the first to third gate signal line driving circuits 704 to 706 are fed from outside through a flexible printed circuit (FPC) 708.

Figure 7B:
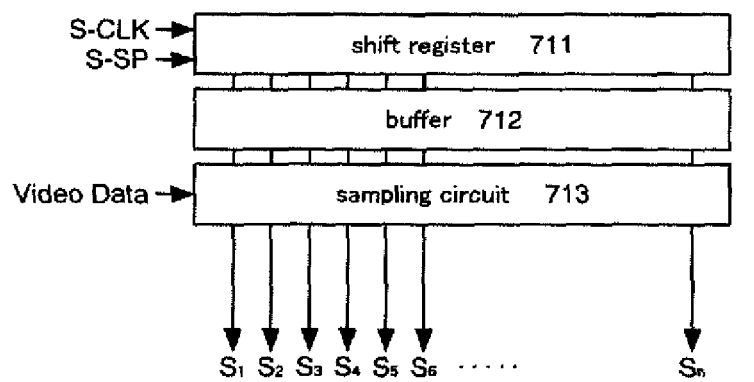

FIG. 7B depicts the exemplary configuration of the source signal line driving circuit. This is the source signal line driving circuit for using analogue video signals for video signals for display, which has a shift register 711, a buffer 712, and a sampling circuit 713. Not shown particularly, but a level shifter may be added as necessary.

Figure 8A:
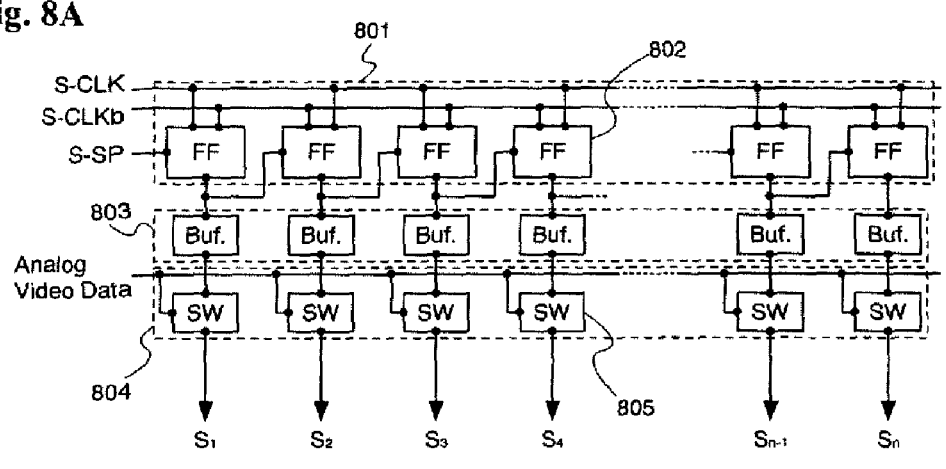
FIGS. 8A and 8B are diagrams showing a structural example of a source signal line driving circuit and gate signal line driving circuit of the light emitting device shown in FIGS. 7A-7C.

The operation of the source signal line driving circuit will be described. FIG. 8A shows the more detailed configuration, thus referring to the drawing.

A shift register 801 is formed of a plurality of flip-flop circuits (FF) 802, to which the clock signal (S-CLK), the clock inverted signal (S-CLKb), and the start pulse (S-SP) are inputted. In response to the timing of these signals, sampling pulses are outputted sequentially.

The sampling pulses outputted from the shift register 801 are passed through a buffer 803 and amplified, and then inputted to a sampling circuit. The sampling circuit 804 is formed of a plurality of sampling switches (SW) 805, which samples video signals in a certain column in accordance with the timing of inputting the sampling pulses. More specifically, when the sampling pulses are inputted to the sampling switches, the sampling switches 805 are turned on. The potential held by the video signals at this time is outputted to the separate source signal lines through the sampling switches.

Figure 7C:
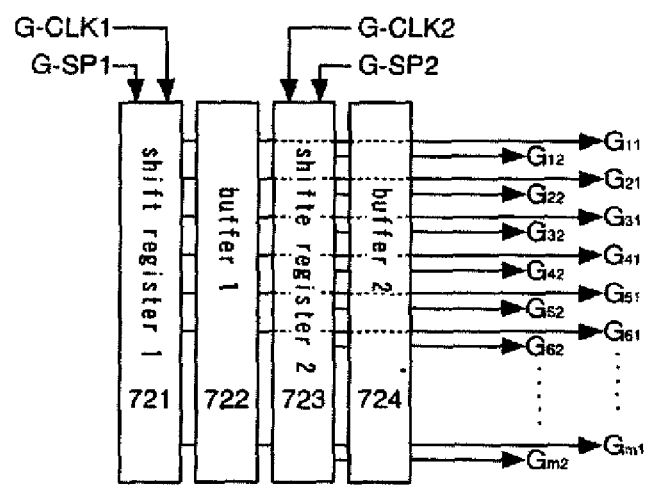
Figure 8B:
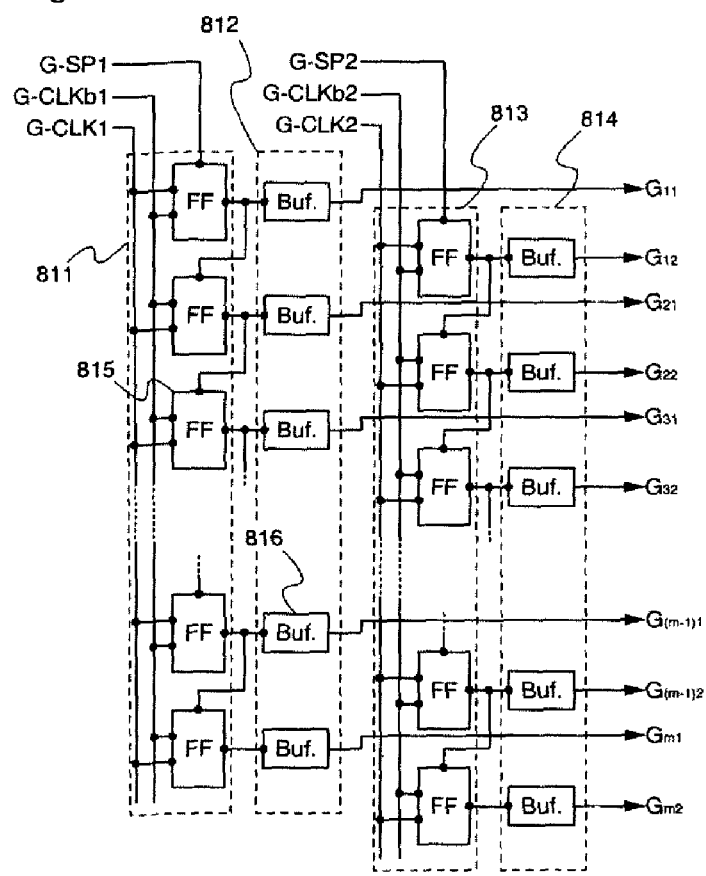

Subsequently, the operation of the gate signal line driving circuit will be described. FIG. 8B depicts the more detailed exemplary configuration of the first and second gate signal line driving circuits 704 and 705 shown in FIG. 7C. The first gate signal line driving circuit has a shift register circuit 811, and a buffer 812, which is driven in response to the clock signal (G-CLK1), the clock inverted signal (G-CLKb1), and the start pulse (G-SP1). The second gate signal line driving circuit has a shift register circuit 813, and a buffer 814, which is driven in response to the clock signal (G-CLK2), the clock inverted signal (G-CLKb2), and the start pulse (G-SP2).

The operation from the shift register to the buffer is the same as that in the source signal line driving circuit. The selecting pulses amplified by the buffer select separate gate signal lines for them. The first gate signal line driving circuit sequentially selects first gate signal lines $G_{11}, G_{21}, \ldots$ and $G_{m1}$, and the second gate signal line driving circuit sequentially selects second gate signal lines $G_{12}, G_{22}, \ldots$ and $G_{m2}$. A third gate signal line driving circuit, not shown, is also the same as the first and second gate signal line driving circuits, sequentially selecting third gate signal lines $G_{13}, G_{23}, \ldots$ and $Gm_{m3}$. In the selected row, video signals are written in the pixel to emit light according to the procedures described in Embodiment Mode.

In addition, as one example of the shift register, that formed of a plurality of flip-flops is shown here. However, such the configuration is acceptable that signal lines can be selected by a decoder.

Embodiment 2

Figure 9A:
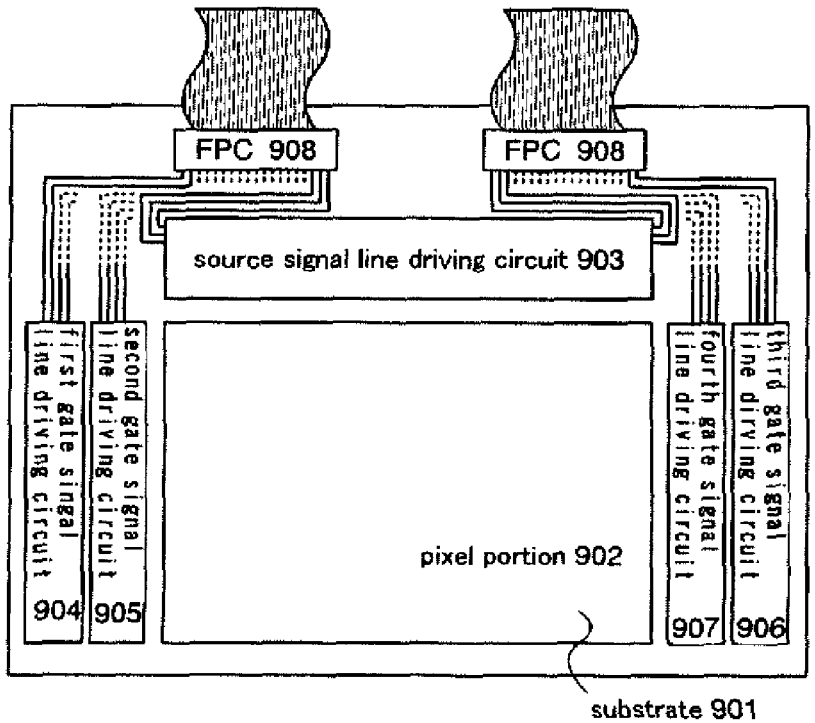
FIGS. 9A and 9B are diagrams showing a structural example of a digital video signal input type light emitting device that is an embodiment of the present invention.

In this embodiment, the configuration of a light emitting device in which digital video signals are used for video signals for display will be described. FIG. 9A depicts the exemplary configuration of a light emitting device. The device has a pixel portion 902 where a plurality of pixels is arranged in a matrix shape over a substrate 901, and it has a source signal line driving circuit 903, and first to fourth gate signal line circuits 904 to 907 around the pixel portion. In FIG. 9A, four couples of gate signal line driving circuits are used to control the first to fourth gate signal lines in pixels shown in FIG. 1.

Signals inputted to the source signal line driving circuit 903, and the first to fourth gate signal line driving circuits 904 to 907 are fed from outside through a flexible printed circuit (FPC) 908.

Figure 9B:
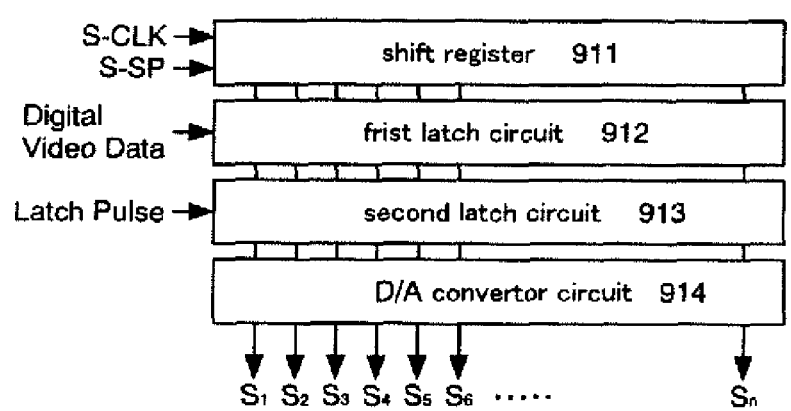

FIG. 9B depicts the exemplary configuration of the source signal line driving circuit. This is the source signal line driving circuit for using digital video signals for video signals for display, which has a shift register 911, a first latch circuit 912, a second latch circuit 913, and a D/A converter circuit 914. Not shown in the drawing particularly, but a level shifter may be added as necessary.

The first to fourth gate signal line driving circuits 904 to 906 are fine to be those shown in Embodiment 1, thus omitting the illustration and description here.

Figure 10A:
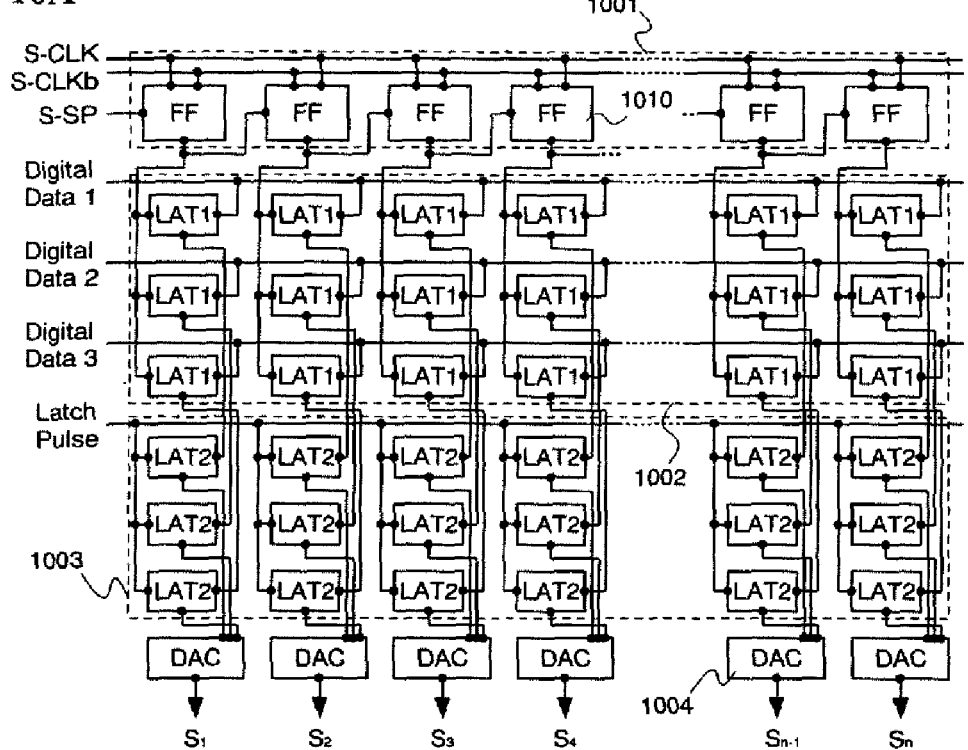
FIGS. 10A and 10B are diagrams showing a structural example of a source signal line driving circuit of the light emitting device shown in FIGS. 9A and 9B.

The operation of the source signal line driving circuit will be described. FIG. 10A shows the more detailed configuration, thus referring to the drawing.

A shift register 1001 is formed of a plurality of flip-flop circuits (FF) 1010, to which the clock signal (S-CLK), the clock inverted signal (S-CLKb), and the start pulse (S-SP) are inputted. Sampling pulses are sequentially outputted in response to the timing of these signals.

The sampling pulses outputted from the shift register 1001 are inputted to first latch circuits 1002. Digital video signals are being inputted to the first latch circuits 1002. The digital video signals are held at each stage in response to the timing of inputting the sampling pulses. Here, the digital video signals are inputted by three bits. The video signals at each bit are held in the separate first latch circuits. Here, three first latch circuits are operated in parallel by one sampling pulse.

When the first latch circuits 1002 finish to hold the digital video signals up to the last stage, latch pulses are inputted to second latch circuits 1003 during the horizontal retrace period, and the digital video signals held in the first latch circuits 1002 are transferred to the second latch circuits 1003 all at once. After that, the digital video signals held in the second latch circuits 1003 for one row are inputted to D/A converter circuits 1004 simultaneously.

While the digital video signals held in the second latch circuits 903 are being inputted to the D/A converter circuits 904, the shift register 901 again outputs sampling pulses. Subsequent to this, the operation is repeated to process the video signals for one frame.

The D/A converter circuits 1004 convert the inputted digital video signals from digital to analogue and output them to the source signal lines as the video signals having the analogue voltage.

The operation described above is conducted throughout the stages during one horizontal period. Accordingly, the video signals are outputted to the entire source signal lines.

In addition, as described in Embodiment 1, such the configuration is acceptable that a decoder is used instead of the shift register to select signal lines.

Embodiment 3

Figure 10B:
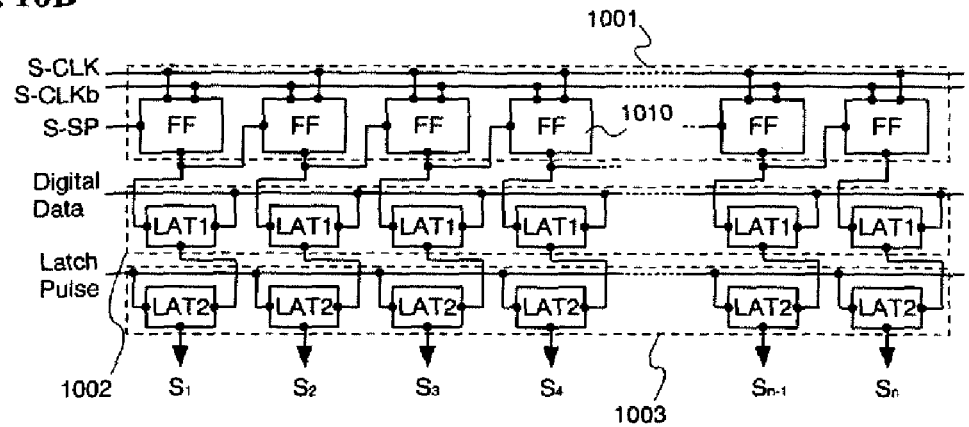

In Embodiment 2, a digital video signal is written in a pixel after it is given digital-analog conversion by a D/A converter circuit. A light emitting device of the present invention can also use a time ratio gray scale method to perform display in gray scales. In this case, a D/A converter circuit is not necessary as shown in FIG. 10B and gray scales are controlled by the length of the light emission time of an EL element. This makes parallel processing of video signals of the respective bits unnecessary, and therefore, only first and second latch circuits for 1 bit are required. Then, digital video signals of the respective bits are serially inputted and sequentially held in latch circuits before written in pixels.

When a time ratio gray scale method is used to perform display in gray scales, the fourth TFT 109 in FIG. 1 can be used as an erasing TFT. In this case, the fourth TFT 109 has to be kept turned OFF during an erasing period, and in order to achieve this, the fourth gate signal line 105 is controlled by an erasing gate signal line driving circuit. Usually, a gate signal line driving circuit for selecting a gate signal line outputs one or more pulses in one horizontal period. On the other hand, an erasing gate signal line driving circuit has to keep the fourth TFT 109 turned OFF during an erasing period, and therefore, it is an independent driving circuit.

FIG. 24 shows an example of using a time ratio gray scale method. FIG. 24A is a timing chart for obtaining 4-bit gray scales, and has address (writing) periods Ta1 to Ta4, sustain (light emission) periods Ts1 to Ts4, and erasing periods Te1 to Te4 for the respective bits.

An address (writing) period is a period required for the operation of inputting a video signal to pixels for one screen. Therefore, address periods for respective bits have the same length. On the other hand, the lengths of sustain (light emission) periods are set such that the ratio of the lengths follows power of 2, namely, $1:2:4: \ldots : 2^{(n-1)}$. The sum of lengths of periods in which light is emitted determines the gray scales. In the example of FIG. 24A, 4-bit gray scales are intended and the ratio of the lengths of sustain (light emission) periods is 1:2:4:8.

Originally, an erasing period is provided to avoid overlap of address (writing) periods and selection of different gate signal lines at the same time when a sustain (light emission) period is short.

FIG. 24B shows timing of pulses inputted to the first gate signal line in FIG. 1. A period required to select the gate signal lines in the first row through the last row is an address (writing) period.

FIG. 24C shows timing of pulses inputted to the second and third gate signal lines in FIG. 1. Here, the pixel is driven treating the second and third gate signal lines as one. A period in which the signal lines are at the H level is a period for storing the threshold and is put before an address period in each sub-frame period.

FIG. 24D shows timing of pulses inputted to the fourth gate signal line in FIG. 1. A period indicated by 2401 is a light emission period. An erasing period is provided by inputting the H level to the fourth gate signal line. In a period indicated by 2402, the TFT 109 has to be turned ON during the operation of storing the threshold, and therefore, the L level is inputted as shown in FIG. 2A.

Although FIG. 24 shows that the threshold is stored in an erasing period, light may be emitted during this period. This means that an erasing period is not always necessary for a upper bit and the threshold may be stored during a sustain (light emission) period.

Figure 25A:
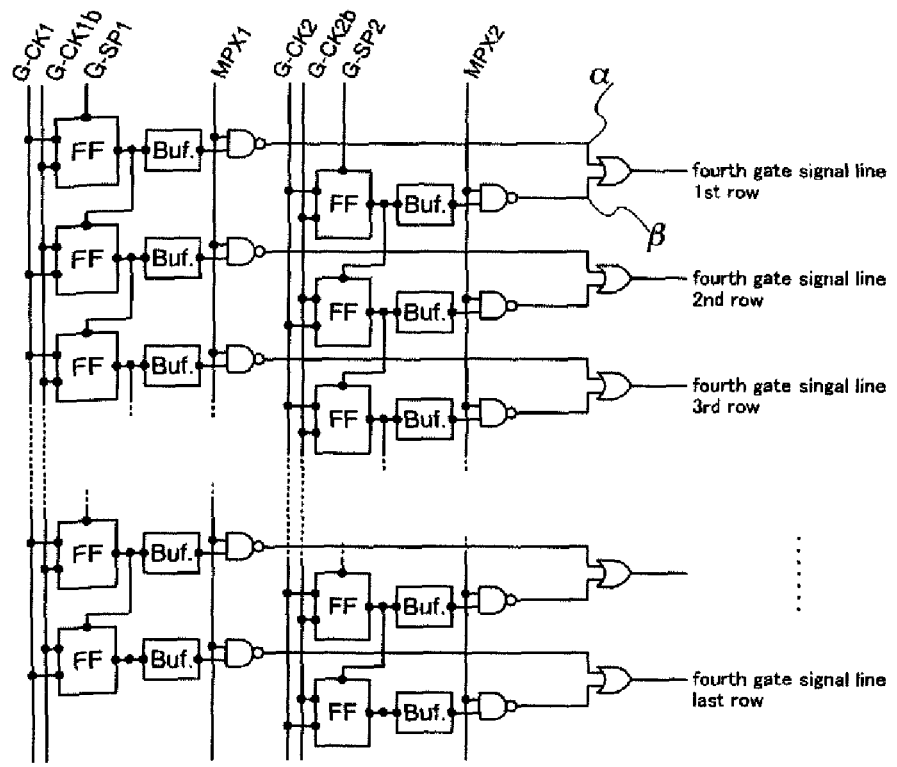
FIG. 25A-25B are diagrams showing the structure of a gate signal line driving circuit for outputting pulses to a gate signal line in accordance with the timing charts of FIGS. 24A-24D.
Figure 25B:
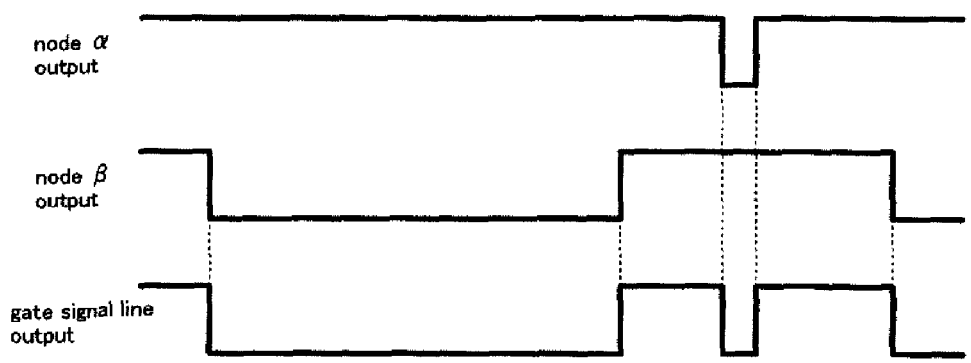

Pulses as those shown in FIGS. 24B and 24C can readily be created using the structure of a conventional gate signal line driving circuit. On the other hand, pulses as those in FIG. 24D require a little ingenuity. In this embodiment, a gate signal line driving circuit is given a two-phase structure as shown in FIG. 25A and pulses at α and β nodes are combined as shown in FIG. 25B using OR circuits to obtain a desired pulse.

Embodiment 4

According to the light emitting devices described so far, the first to fourth gate signal lines are controlled by operating the first to fourth gate signal line driving circuits, respectively. As a merit of such a configuration, there is a point that it is adaptable to various drive methods to some degree because selective timings of the respective gate signal lines can be independently changed. However, an occupying area of the driving circuit on the substrate is increased. Thus, there is a demerit that a peripheral area of a display region becomes larger, that is, it becomes difficult to narrow a frame region.

Figure 11A:
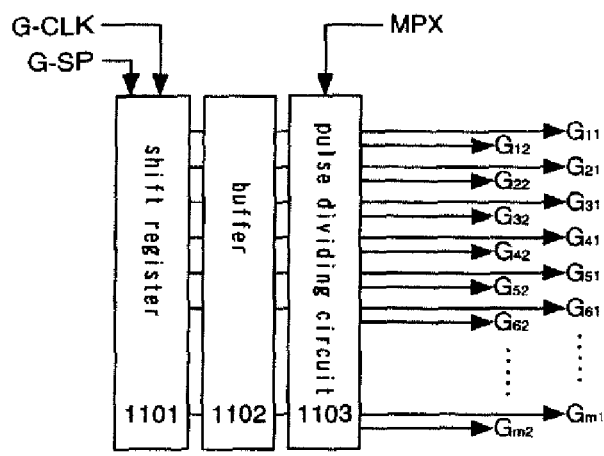
FIGS. 11A and 11B are diagrams showing a different structural example of the gate signal line driving circuit from FIGS. 8A and 8B.
Figure 11B:
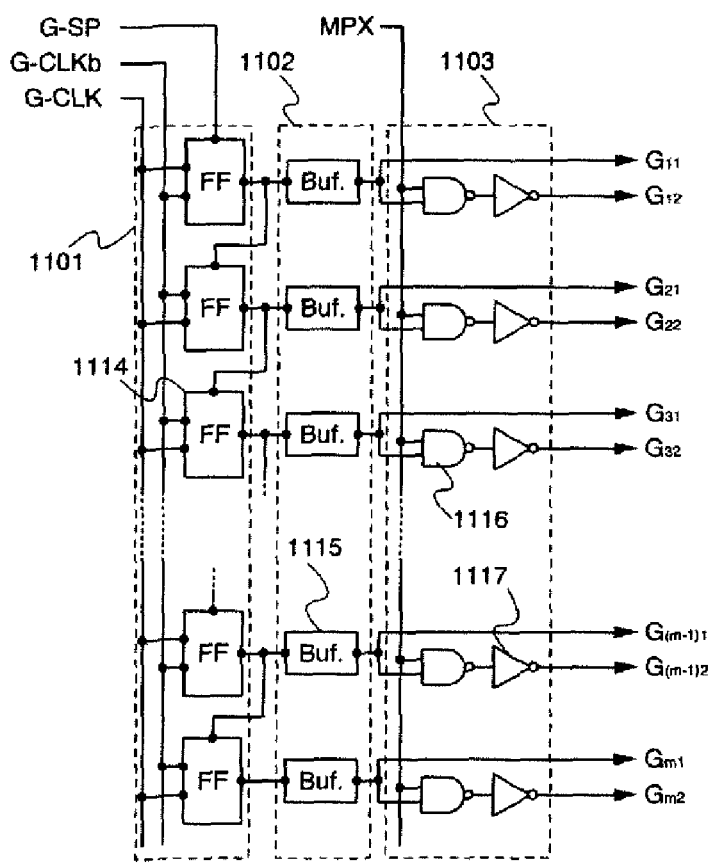

FIG. 11A shows a configuration example for solving such a problem. In FIG. 11A, as in the gate signal line driving circuit used in other embodiments, it has the shift register 1101 and the buffer 1102. In this embodiment, a pulse dividing circuit 1103 is added after the buffer. A detailed configuration is shown in FIG. 11B.

The pulse dividing circuit 1103 is composed of a plurality of NANDs 1116 and a plurality of inverters 1107. The buffer output and a division signal (MPX) inputted from the outside are NANDed so that two gate signal lines can be controlled according to different pulses by a single gate signal line driving circuit. In the case of FIGS. 11A and 11B, the first gate signal line and the second signal line are controlled by the single gate signal line driving circuit.

Figure 12:
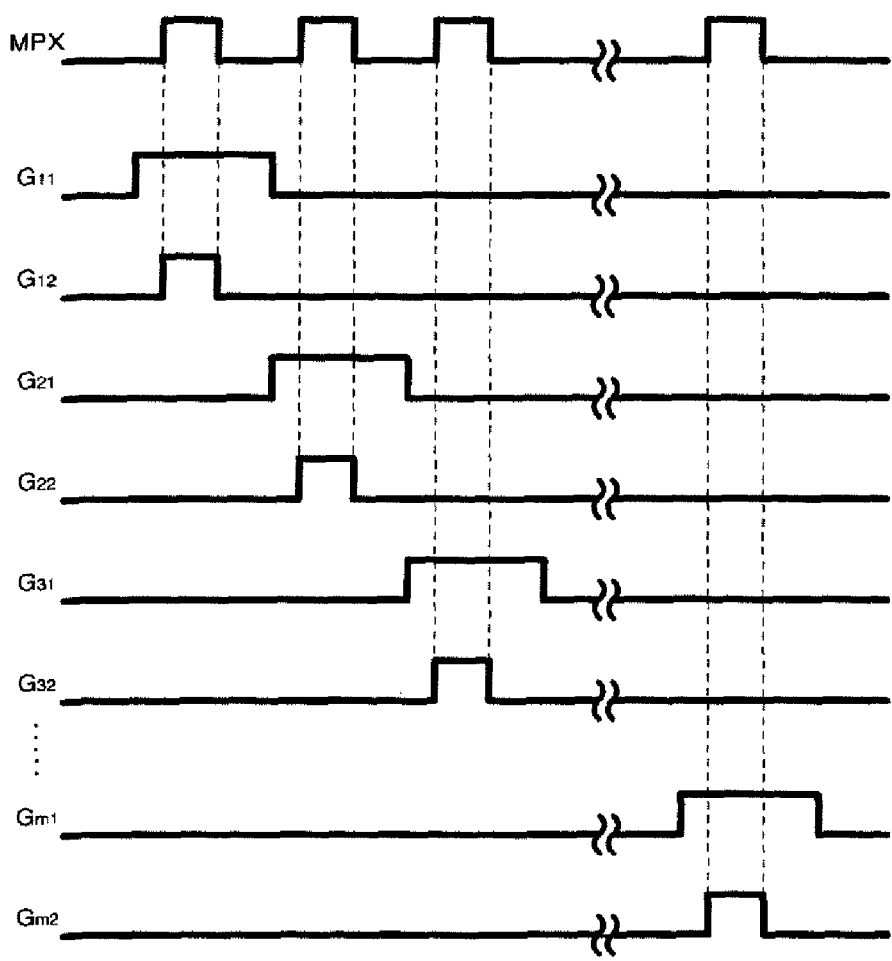
FIG. 12 is a diagram illustrating pulse output timing of the gate signal line driving circuit shown in FIGS. 11A and 11B.

FIG. 12 shows the division signal (MPX) and timing for selecting the respective gate signal lines. In the respective first gate signal lines $G_{11}, G_{21}, \ldots, G_{m1}$, the buffer output is used as a selective pulse without being processed. On the other hand, when the buffer output is an H level and the division signal is an H level, the output of the NAND becomes an L level and then an H-level is outputted through the inverter. The second gate signal lines $G_{12}, G_{22}, \ldots, G_{m2}$ are selected in accordance with such pulses.

Embodiment 5

In the present invention, a TFT for supplying an EL element with a current for light emission (the TFT 106 in FIG. 1A) desirably operates in a saturation range in order to avoid fluctuation in luminance due to degradation of the EL element. In this case, a gate length L is set large so that the current in the saturation range is generally kept constant even when the source-drain voltage of the TFT 106 is changed.

In this case, to hold the threshold in the capacitor means, a voltage exceeding the threshold of the TFT is given to the capacitor means first, and then from this state, this voltage is converged to the threshold voltage. However, when the gate length L of the TFT is large, the holding operation takes time due to the gate capacitance or the like. This embodiment gives a description on a structure that can realize high-speed operation in such a case.

Figure 18A:
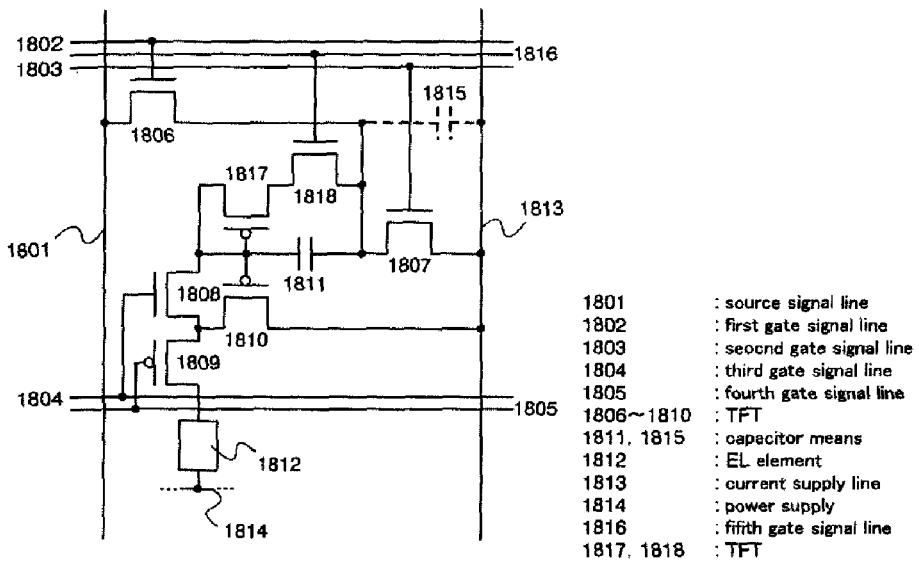
FIGS. 18A and 18B are diagrams showing an embodiment of the pixel structure in a light emitting device of the present invention.

FIG. 18A shows the structure of a pixel. TFTs 1817 and 1818 and a fifth gate signal line 1816 for controlling the TFT 1818 are added to the pixel shown in FIG. 1A. As indicated by the dotted line in FIG. 18A, capacitor means 1815 may be placed between a second electrode of a TFT 1806 and a current supply line 1813 to use it as a capacitor for holding video signals.

Figure 18B:
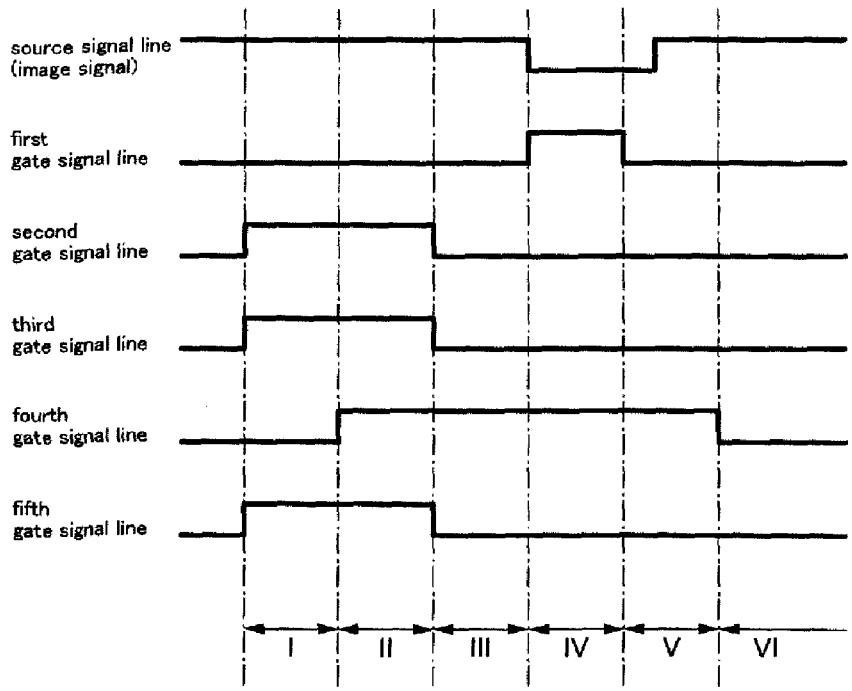

The operation thereof is described with reference to FIG. 18B and FIGS. 19A to 19F. FIG. 18B shows timing of video signals and pulses inputted to a source signal line 1801 and first to fifth gate signal lines 1802 to 1805 and 1816, and is divided into six sections, I to VI, in accordance with operations shown in FIG. 19. This embodiment is to increase the operation speed for finishing holding the threshold voltage in the capacitor means, and employs the same video signal writing operation and light emission operation as those described in Embodiment Mode. Therefore, operations of charging the capacitor means with electric charges and holding electric charges in the capacitor means alone are described here.

First, the second, third, and fifth gate signal lines 1803, 1804, and 1816 reach the H level and the fourth gate signal line 1805 reaches the L level to turn the TFTs 1807, 1808, 1809, and 1818 ON (Section I). This generates a current as shown in FIG. 19A to charge the capacitor means 1811. When the voltage held in the capacitor means 1811 exceeds the threshold ($V_{th}$) of the TFTs 1810 and 1817, the TFTs 1810 and 1817 are turned ON (FIG. 19A).

Then, the fourth gate signal line 1805 reaches the H level to turn the TFT 1809 OFF (Section II). This closes the path between the current supply line 1813 and the EL element 1812 and the current flow is stopped. On the other hand, as shown in FIG. 19B, the electric charges accumulated in the capacitor means 1811 start to move again. Since the voltage between two electrodes of the capacitor means 1811 equals the gate-source voltage of the TFTs 1810 and 1817, the TFTs 1810 and 1817 are turned OFF and movement of the electric charges is ended as this voltage becomes equal to $V_{th}$.

When storing of the threshold in the capacitor means 1811 is completed, the second and fifth gate signal lines reach the L level and the third gate signal line reaches the H level to turn the TFTs 1807, 1808, and 1818 OFF (Section III).

Subsequently, the first gate signal line 1802 reaches the H level to turn the TFT 1806 ON (Section IV). A video signal is outputted to the source signal line 1801 and the electric potential thereof is changed from $V_{DD}$ to the electric potential $V_{Data}$ of the video signal, (here, $V_{DD} > V_{Data}$ since the TFT 110 is a p-channel TFT). At this point, $V_{th}$ mentioned above has been held in the capacitor means 1811 without a change and therefore the electric potential of the gate electrode of the TFTs 1810 and 1817 are one obtained by adding the threshold $V_{th}$ to the electric potential $V_{Data}$ of the video signal inputted from the source signal line 1801. This turns the TFTs 1810 and 1817 ON (FIG. 19D).

As writing of a video signal is completed, the first gate signal line 1802 reaches the L level to turn the TFT 1806 OFF (Section V). Thereafter, output of a video signal to the source signal line 1801 is finished and the electric potential of the source signal line 1801 returns to $V_{DD}$ (FIG. 19E).

Subsequently, the fourth gate signal line 1805 reaches the L level to turn the TFT 1809 ON (Section VI). Since the TFT 1810 has already been turned ON, the EL element 1812 emits light when a current flows into the EL element 1812 from the current supply line 1813 (FIG. 19F). The value of the current flowing into the EL element 1812 at this point is determined in accordance with the gate-source voltage of the TFT 1810, and the gate-source voltage of the TFT 1810 at that time is ($V_{DD} - (V_{Data} + V_{th})$). If the threshold $V_{th}$ of the TFT 1810 fluctuates among pixels, a voltage according to the fluctuation is held in the capacitor means 1811 of each pixel. Therefore, the luminance of the EL element 1812 is not influenced by fluctuation in threshold.

Here, the gate electrode of the newly added TFT 1817 is connected to the gate electrode of the TFT 1810 that supplies the EL element 1813 with a current for light emission. As shown in FIGS. 19A and 19B, the number of paths along which electric charges move is larger than in Embodiment Mode and supplying a current to the EL element 1812 is not the role of the TFT 1817. Therefore, the gate length L can be set small and the channel width W can be set large. Since the gate capacitance is small, electric charges move smoothly and the time taken for the voltage held in the capacitor means to converge to $V_{th}$ can be shortened.

Embodiment 6

This embodiment shows an example in which a structure different from the one in Embodiment 5 is used to achieve the threshold storing operation at high speed.

FIG. 22A shows the structure. In this case, a TFT whose threshold is held in capacitor means 2211 is the TFT 2210. A current is supplied through a TFT 2216, the TFT 2210, and a TFT 2209 to an EL element 2212 for light emission. The TFT 2209 simply functions as a switching element. To counter degradation of the EL element 2212, the TFT 2216 operates in a saturation range and its gate length L is set large so that the drain current is generally kept constant in the saturation range even when the source-drain voltage is changed.

The capacitor means 2211 is charged with electric charges through current paths shown in FIGS. 22B to 22C. Thereafter, when the TFT 2209 is turned OFF, electric charges again move as shown in FIG. 22C. As the voltage held in the capacitor means 2211 becomes equal to the threshold of the TFTs 2210 and 2216, the TFTs 2210 and 2216 are turned OFF. Through this operation, the threshold is stored in the capacitor means 2211. In this case, the operation of FIG. 22C progresses more quickly since the gate length L of the TFT 2210 is set small.

Thereafter, a video signal is written as in Embodiment Mode and other embodiments. Then, the TFT 2209 is turned ON to supply a current to the EL element 2212 through the current supply line, the TFT 2216, the TFT 2210, and the TFT 2209 in the stated order as shown in FIG. 22D. This causes the EL element to emit light.

In this case, gate electrodes of the TFTs 2210 and 2216 are connected to each other and therefore the TFTs function as a multi-gate TFT. If the gate length of the TFT 2210 is given as $L_1$, the channel width thereof as $W_1$, the gate length of the TFT 2216 as $L_2$, and the channel width thereof as $W_2$, ($W_1/L_1$)>($W_2/L_2$) is satisfied. This means that, in the threshold storing operation, a larger current is available to store the threshold voltage as shown in FIG. 22C since the TFT 2210 that is small in L and large in W is used. In other words, quicker operation is possible. In addition, a constant drain current can be caused to flow during light emission even if there is a small change in source-drain voltage of the TFTs 2210 and 2216 because the TFTs 2210 and 2216 are used as a multi-gate TFT and the gate length L of the TFT 2216 is set large.

Figure 23A:
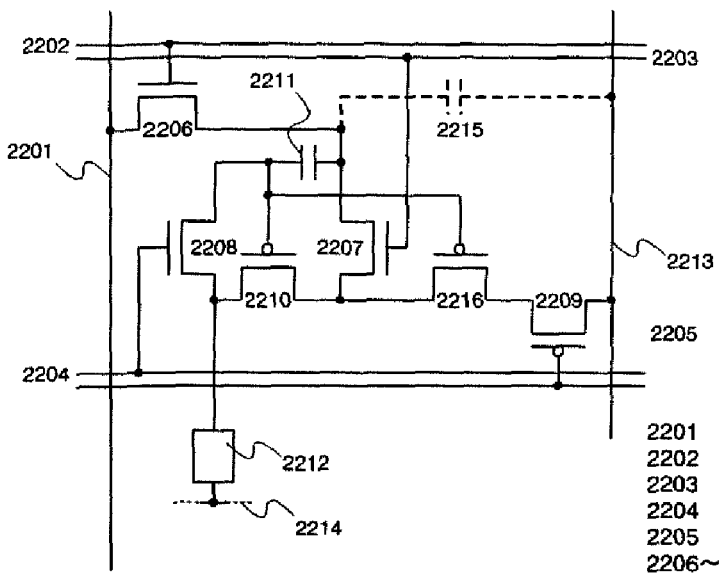
FIGS. 23A and 23B are diagrams showing variations of the pixel structure shown in FIGS. 22A-22D.
Figure 23B:
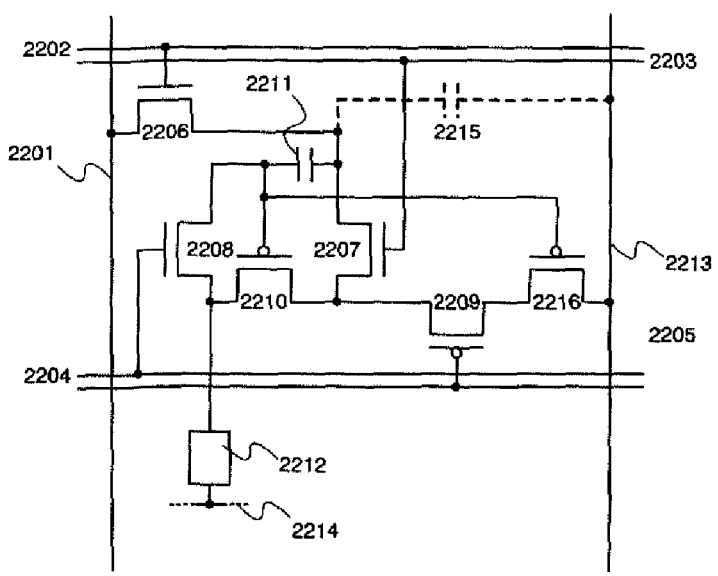

The TFT 2209 may be placed at any other positions than the one shown in FIG. 22A, for example, positions shown in FIGS. 23A and 23B. The TFT 2209 may be used as an erasing TFT when a digital video signal is used to perform display by a time ratio gray scale method.

Embodiment 7

Figure 20B:
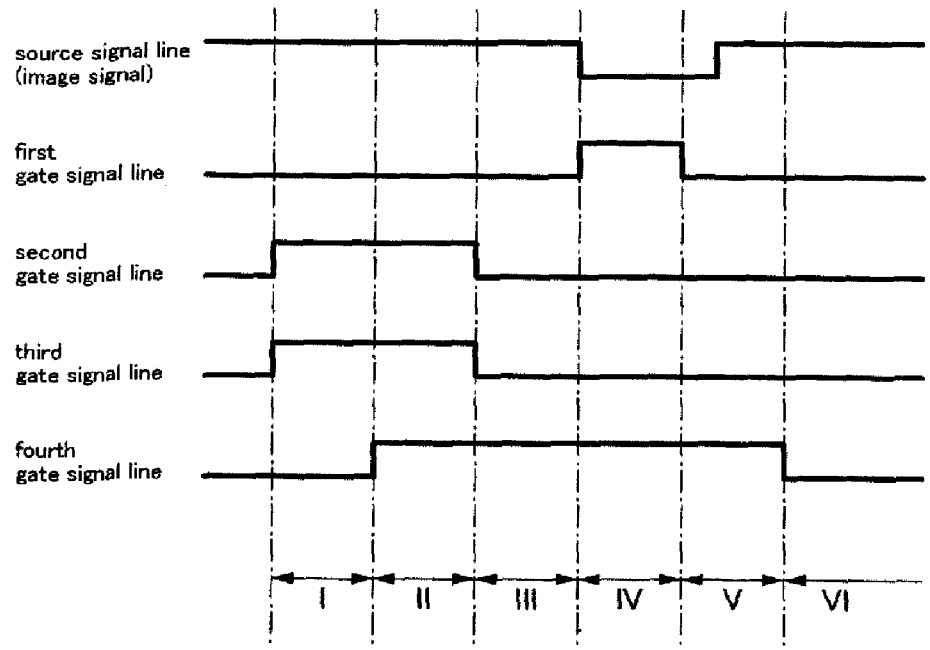

In any of the pixels shown in FIGS. 1, 18, 20, and others, a current flows in an EL element while capacitor means is charged. This causes the EL element to emit light in a period that is not intended for light emission. The unintended light emission period is very short, and therefore, does not affect the image quality much. However, this makes the EL element itself a load while the capacitor means is charged with electric charges and thus prolongs the charging time. This embodiment describes a structure that prevents a current from flowing into the EL element when the capacitor means is charged with electric charges.

FIG. 21A shows a structural example of a pixel. A TFT 2118 is added to the pixel shown in FIG. 1A. The TFT 2118 has a gate electrode connected to a fifth gate signal line 2106. A first gate electrode of the TFT 2118 is connected to a first electrode of a TFT 2109 or to a second electrode of the TFT 2109. A second electrode of the TFT 2118 is connected to a power supply line, and has an electric potential different from the electric potential of a current supply line 2114. As indicated by the dotted line in FIG. 21A, capacitor means 2117 may be placed between a second electrode of a first TFT 2107 and the current supply line 2114 to use it as a capacitor for holding video signals. Further, the second electrode of the TFT 2118 may be connected to a first gate signal line or the like of any other pixels than the pixel in which the TFT 2118 is placed. In this case, gate signal lines that are not selected have a constant electric potential, and this is utilized to make one of them into a substitute of a power supply line.

To charge the capacitor means 2112 with electric charges, pulses are inputted to second, third, and fifth gate signal lines 2103, 2104, and 2106 to turn the TFTs 2108, 2109, and 2118 0N and the device behaves as shown in FIG. 21B. Since the TFT 2110 is OFF, no current flows into an EL element 2113 and light is not emitted. However, the capacitor means 2112 is charged due to the existence of a current path provided by the newly added TFT 2118. Thereafter, when the fifth gate signal line 2106 reaches the L level to turn the TFT 2118 OFF, electric charges that have been accumulated in the capacitor means 2112 move as shown in FIG. 21C. At the instant the voltage in the capacitor means 2112 becomes lower than the threshold of the TFT 2111, the TFT 2111 is turned OFF and movement of electric charges is ceased. The threshold of the TFT 2111 is thus held in the capacitor means 2112.

In this embodiment, the TFTs are separately controlled by the first to fifth gate signal lines. However, this is not the only possible structure. Considering the aperture ratio of a pixel and the like, less signal lines are more desirable. Accordingly, TFTs that operate in sync with each other, for example, the TFTs 2108 and 2109 in FIG. 21A, may have the same polarity so that they can be controlled by one gate signal line.

This embodiment may be combined with other embodiments.

Embodiment 8

In this specification, a substrate in which a driving circuit including a CMOS circuit and a pixel portion having a switching TFT and a driving TFT are formed on the same substrate is called an active matrix substrate as a matter of convenience. In addition, in this embodiment, a process of manufacturing the active matrix substrate will be described using FIGS. 13A to 13D and 14A to 14D.

A quartz substrate, a silicon substrate, a metallic substrate, or a stainless substrate, in which an insulating film is formed on the surface thereof is used as a substrate 5000. In addition, a plastic substrate having a heat resistance, which is resistant to a processing temperature in this manufacturing process may be used. In this embodiment, the substrate 5000 made of glass such as barium borosilicate glass or aluminoborosilicate glass is used.

Next, a base film 5001 made from an insulating film such as a silicon oxide film, a silicon nitride film, or a silicon oxynitride film is formed on the substrate 5000. In this embodiment, a two-layer structure is used for the base film 5001. However, a single layer structure of the insulating film or a structure in which two layers or more of the insulating film are laminated may be used.

In this embodiment, as a first layer of the base film 5001, a silicon oxynitride film 5001a is formed at a thickness of 10 nm to 200 nm (preferably, 50 nm to 100 nm) by a plasma CVD method using $SiH_4$, $NH_3$, and $N_2O$ as reactive gases. In this embodiment, the silicon oxynitride film 5001a is formed at a thickness of 50 nm. Next, as a second layer of the base film 5001, a silicon oxynitride film 5001b is formed at a thickness of 50 nm to 200 nm (preferably, 100 nm to 150 nm) by a plasma CVD method using $SiH_4$ and $N_2O$ as reactive gases. In this embodiment, the silicon oxynitride film 5001b is formed at a thickness of 100 nm.

Subsequently, semiconductor layers 5002 to 5006 are formed on the base film 5001. The semiconductor layers 5002 to 5005 are formed as follows. That is, a semiconductor film is formed at a thickness of 25 nm to 80 nm (preferably, 30 nm to 60 nm) by known means (such as a sputtering method, an LPCVD method, or a plasma CVD method). Next, the semiconductor film is crystallized by a known crystallization method (such as a laser crystallization method, a thermal crystallization method using RTA or a furnace anneal furnace, a thermal crystallization method using a metallic element for promoting crystallization, or the like). Then, the obtained crystalline semiconductor film is patterned in a predetermined shape to form the semiconductor layers 5002 to 5006. Note that an amorphous semiconductor film, a microcrystalline semiconductor film, a crystalline semiconductor film, a compound semiconductor film having an amorphous structure such as an amorphous silicon germanium film, or the like may be used as the semiconductor film.

In this embodiment, an amorphous silicon film having a film thickness of 55 nm is formed by a plasma CVD method. A solution containing nickel is held on the amorphous silicon film and it is dehydrogenated at 500° C. for 1 hour, and then thermal crystallization is conducted at 550° C. for 4 hours to form a crystalline silicon film. After that, patterning processing using a photolithography method is performed to form the semiconductor layers 5002 to 5005.

Note that, when the crystalline semiconductor film is formed by a laser crystallization method, a gas laser or a solid laser, which conducts continuous oscillation or pulse oscillation is preferably used as the laser. An excimer laser, a YAG laser, a $YVO_4$ laser, a YLF laser, a $YAlO_3$ laser, a glass laser, a ruby laser, a Ti: sapphire laser, and the like can be used as the former gas laser. In addition, a laser using a crystal such as YAG, $YVO_4$, YLF or $YAlO_3$, which is doped with Cr, Nd, Er, Ho, Ce, Co, Ti, or Tm can be used as the latter solid laser. The fundamental of the laser is changed according to a doping material and laser light having a fundamental of the neighborhood of 1 μm is obtained. A harmonic to the fundamental can be obtained by using a non-linear optical element. Note that, in order to obtain a crystal having a large grain size at the crystallization of the amorphous semiconductor film, it is preferable that a solid laser capable of conducting continuous oscillation is used and a second harmonic to a fourth harmonic of the fundamental are applied. Typically, a second harmonic (532 nm) or a third harmonic (355 nm) of an Nd:$YVO_4$ laser (fundamental of 1064 nm) is applied.

Also, laser light emitted from the continuous oscillation $YVO_4$ laser having an output of 10 W is converted into a harmonic by a non-linear optical element. Further, there is a method of locating a $YVO_4$ crystal and a non-linear optical element in a resonator and emitting a harmonic. Preferably, laser light having a rectangular shape or an elliptical shape is formed on an irradiation surface by an optical system and irradiated to an object to be processed. At this time, an energy density of about 0.01 $MW/cm^2$ to 100 $MW/cm^2$ (preferably, 0.1 $MW/cm^2$ to 10 $MW/cm^2$) is required. The semiconductor film is moved relatively to the laser light at a speed of about 10 cm/s to 2000 cm/s to be irradiated with the laser light.

Also, when the above laser is used, it is preferable that a laser beam emitted from a laser oscillator is linearly condensed by an optical system and irradiated to the semiconductor film. A crystallization condition is set as appropriate. When an excimer laser is used, it is preferable that a pulse oscillation frequency is set to 300 Hz and a laser energy density is set to 100 mJ/cm$^2$ to 700 mJ/cm$^2$ (typically, 200 mJ/cm$^2$ to 300 mJ/cm$^2$). In addition, when a YAG laser is used, it is preferable that the second harmonic is used, a pulse oscillation frequency is set to 1 Hz to 300 Hz, and a laser energy density is set to 300 mJ/cm$^2$ to 1000 mJ/cm$^2$ (typically, 350 mJ/cm$^2$ to 500 mJ/cm$^2$). A laser beam linearly condensed at a width of 100 μm to 1000 μm (preferably, 400 μm) is irradiated over the entire surface of the substrate. At this time, an overlap ratio with respect to the linear beam may be set to 50% to 98%.

However, in this embodiment, the amorphous silicon film is crystallized using a metallic element for promoting crystallization so that the metallic element remains in the crystalline silicon film. Thus, an amorphous silicon film having a thickness of 50 nm to 100 nm is formed on the crystalline silicon film, heat treatment (thermal anneal using an RTA method or a furnace anneal furnace) is conducted to diffuse the metallic element into the amorphous silicon film, and the amorphous silicon film is removed by etching after the heat treatment. As a result, the metallic element contained in the crystalline silicon film can be reduced or removed.

Note that, after the formation of the semiconductor layers 5002 to 5005, doping with a trace impurity element (boron or phosphorus) may be conducted in order to control a threshold value of a TFT.

Next, a gate insulating film 5006 covering the semiconductor layers 5002 to 5005 is formed. The gate insulating film 5006 is formed from an insulating film containing silicon at a film thickness of 40 nm to 150 nm by a plasma CVD method or a sputtering method. In this embodiment, a silicon oxynitride film is formed as the gate insulating film 5006 at a thickness of 115 nm by the plasma CVD method. Of course, the gate insulating film 5006 is not limited to the silicon oxynitride film. Another insulating film containing silicon may be used as a single layer or a laminate structure.

Note that, when a silicon oxide film is used as the gate insulating film 5006, a plasma CVD method is employed, TEOS (tetraethyl orthosilicate) and O$_2$ are mixed, a reactive pressure is set to 40 Pa, and a substrate temperature is set to 300° C. to 400° C. Then, discharge may occur at a high frequency (13.56 MHz) power density of 0.5 W/cm$^2$ to 0.8 W/cm$^2$ to form the silicon oxide film. After that, when thermal anneal is conducted for the silicon oxide film formed by the above steps at 400° C. to 500° C., a preferable property as to the gate insulating film 5006 can be obtained.

Next, a first conductive film 5007 having a film thickness of 20 nm to 100 nm and a second conductive film 5008 having a film thickness of 100 nm to 400 nm are laminated on the gate insulating film 5006. In this embodiment, the first conductive film 5007 which has the film thickness of 30 nm and is made from a TaN film and the second conductive film 5008 which has the film thickness of 370 nm and is made from a W film are laminated.

In this embodiment, the TaN film as the first conductive film 5007 is formed by a sputtering method using Ta as a target in an atmosphere containing nitrogen. The W film as the second conductive film 5008 is formed by a sputtering method using W as a target. In addition, it can be formed by a thermal CVD method using tungsten hexafluoride (WF$_6$). In any case, when they are used for a gate electrode, it is necessary to reduce a resistance, and it is desirable that a resistivity of the W film is set to 20 μΩ cm or lower. When a crystal grain is enlarged, the resistivity of the W film can be reduced. However, if a large number of impurity elements such as oxygen exist in the W film, the crystallization is suppressed so that the resistance is increased. Therefore, in this embodiment, the W film is formed by a sputtering method using high purity W (purity of 99.9999%) as a target while taking into a consideration that an impurity does not enter the film from a gas phase at film formation. Thus, a resistivity of 9 μΩ cm to 20 μΩ cm can be realized.

Note that, in this embodiment, the TaN film is used as the first conductive film 5007 and the W film is used as the second conductive film 5008. However, materials which compose the first conductive film 5007 and the second conductive film 5008 are not particularly limited. The first conductive film 5007 and the second conductive film 5008 each may be formed from an element selected from Ta, W, Ti, Mo, Al, Cu, Cr, and Nd, or an alloy material or a compound material, which contains mainly the above element. In addition, they may be formed from a semiconductor film which is represented by a polycrystalline silicon film doped with an impurity element such as phosphorus, or an AgPdCu alloy.

Next, a mask 5009 made of a resist is formed by using a photolithography method and first etching processing for forming electrodes and wirings is performed. The first etching processing is performed under a first etching condition and a second etching condition (FIG. 13B).

In this embodiment, as the first etching condition, an ICP (inductively coupled plasma) etching method is used. In addition, CF$_4$, Cl$_2$, and O$_2$ are used as etching gases and a ratio of respective gas flow rates is set to 25:25:10 (sccm). RF power having 500 W and 13.56 MHz is supplied to a coil type electrode at a pressure of 1.0 Pa to produce plasma, thereby conducting etching. RF power having 150 W and 13.56 MHz is supplied to a substrate side (sample stage) to apply a substantially negative self bias voltage thereto. The W film is etched under this first etching condition so that end portions of the first conductive layer 5007 are made to have taper shapes.

Subsequently, the etching condition is changed to the second etching condition without removing the mask 5009 made of a resist. CF$_4$ and Cl$_2$ are used as etching gases and a ratio of respective gas flow rates is set to 30:30 (sccm). RF power having 500 W and 13.56 MHz is supplied to a coil type electrode at a pressure of 1.0 Pa to produce plasma, thereby conducting etching for about 15 seconds. RF power having 20 W and 13.56 MHz is supplied to a substrate side (sample stage) to apply a substantially negative self bias voltage thereto. In the second etching condition, both the first conductive film 5007 and the second conductive film 5008 are etched to the same degree. Note that, in order to conduct etching without leaving the residue on the gate insulating film 5006, it is preferable that an etching time is increased at a rate of about 10 to 20%.

In the above first etching processing, when a shape of the mask made of a resist is made suitable, the end portions of the first conductive film 5007 and the end portions of the second conductive film 5008 become taper shapes by an effect of the bias voltage applied to the substrate side. Thus, first-shaped conductive layers 5010 to 5014 made from the first conductive layer 5007 and the second conductive layer 5008 are formed by the first etching processing. With respect to the insulating film 5006, regions which are not covered with the first-shaped conductive layers 5010 to 5014 are etched by about 20 nm to 50 nm so that thinner regions are formed.

Next, second etching processing is performed without removing the mask 5009 made of a resist (FIG. 13C). In the second etching processing, $SF_6$, $Cl_2$, and $O_2$ are used as etching gases and a ratio of respective gas flow rates is set to 24:12:24 (sccm). RF power having 700 W and 13.56 MHz is supplied to a coil type electrode at a pressure of 1.3 Pa to produce plasma, thereby conducting etching for about 25 seconds. RF power having 10 W and 13.56 MHz is supplied to a substrate side (sample stage) to apply a substantially negative self bias voltage thereto. Thus, the W film is selectively etched to form second-shaped conductive layers 5015 to 5019. At this time, first conductive layers 5015a to 5018a are hardly etched.

Then, first doping processing is performed without removing the mask 5009 made of a resist to add an impurity element for providing an N-type to the semiconductor layers 5002 to 5005 at a low concentration. The first doping processing is preferably performed by an ion doping method or an ion implantation method. With respect to a condition of the ion doping method, a dose is set to $1 \times 10^{13}$ atoms/cm$^2$ to $5 \times 10^{14}$ atoms/cm$^2$ and an accelerating voltage is set to 40 keV to 80 keV. In this embodiment, a dose is set to $5.0 \times 10^{13}$ atoms/cm$^2$ and an accelerating voltage is set to 50 keV. As the impurity element for providing an N-type, an element which belongs to Group 15 is preferably used, and typically, phosphorus (P) or arsenic (As) is used. In this embodiment, phosphorus (P) is used. In this case, the second-shaped conductive layers 5015 to 5019 become masks to the impurity element for providing an N-type. Thus, first impurity regions (N$^{--}$ regions) 5020 to 5023 are formed in a self alignment. Then, the impurity element for providing an N-type is added to the first impurity regions 5020 to 5023 at a concentration range of $1 \times 10^{18}$ atoms/cm$^3$ to $1 \times 10^{20}$ atoms/cm$^3$.

Subsequently, after the mask 5009 made of a resist is removed, a new mask 5024 made of a resist is formed and second doping processing is performed at a higher accelerating voltage than that in the first doping processing. In a condition of an ion doping method, a dose is set to $1 \times 10^{13}$ atoms/cm$^2$ to $3 \times 10^{15}$ atoms/cm$^2$ and an accelerating voltage is set to 60 keV to 120 keV. In this embodiment, a dose is set to $3.0 \times 10^{15}$ atoms/cm$^2$ and an accelerating voltage is set to 65 keV. In the second doping processing, second conductive layers 5015b to 5018b are used as masks to an impurity element and doping is conducted such that the impurity element is added to the semiconductor layers located under the taper portions of the first conductive layers 5015a to 5018a.

As a result of the above second doping processing, the impurity element for providing an N-type is added to second impurity regions (N$^-$ regions; Lov regions) 5026 overlapped with the first conductive layers at a concentration range of $1 \times 10^{18}$ atoms/cm$^3$ to $5 \times 10^{19}$ atoms/cm$^3$. In addition, the impurity element for providing an N-type is added to third impurity regions (N$^+$ regions) 5025 and 5028 at a concentration range of $1 \times 10^{19}$ atoms/cm$^3$ to $5 \times 10^{21}$ atoms/cm$^3$. After the first and second doping processing, regions to which no impurity element is added or regions to which the trace impurity element is added are formed in the semiconductor layers 5002 to 5005. In this embodiment, the regions to which the impurity element is not completely added or the regions to which the trace impurity element is added are called channel regions 5027 and 5030. In addition, there are, of the first impurity regions (N$^{--}$ regions) 5020 to 5023 formed by the above first doping processing, regions covered with the resist 5024 in the second doping processing. In this embodiment, they are continuously called first impurity regions (N$^{--}$ regions; LDD regions) 5029.

Note that, in this embodiment, the second impurity regions (N$^-$ regions) 5026 and the third impurity regions (N$^+$ regions) 5025 and 5028 are formed by only the second doping processing. However, the present invention is not limited to this. A condition for doping processing may be changed as appropriate and doping processing may be performed plural times to form those regions.

Next, as shown in FIG. 14A, after the mask 5024 made of a resist is removed, a new mask 5031 made of a resist is formed. After that, third doping processing is performed. By the third doping processing, fourth impurity regions (P$^+$ regions) 5032 and 5034 and fifth impurity regions (P$^-$ regions) 5033 and 5035 to which an impurity element for providing a conductivity type reverse to the above first conductivity type is added are formed in the semiconductor layers as active layers of P-channel TFTs.

In the third doping processing, the second conductive layers 5016b and 5018b are used as masks to the impurity element. Thus, the impurity element for providing a P-type is added to form the fourth impurity regions (P$^+$ regions) 5032 and 5034 and the fifth impurity regions (P$^-$ regions) 5033 and 5035 in a self alignment.

In this embodiment, the fourth impurity regions 5032 and 5034 and the fifth impurity regions 5033 and 5035 are formed by an ion doping method using diborane ($B_2H_6$). In a condition of the ion doping method, a dose is set to $1 \times 10^{16}$ atoms/cm$^2$ and an accelerating voltage is set to 80 keV.

Note that, in the third doping processing, the semiconductor layers composing N-channel TFTs are covered with the masks 5031 made of a resist.

Here, by the first and second doping processing, phosphorus is added to the fourth impurity regions (P$^+$ regions) 5032 and 5034 and the fifth impurity regions (P$^-$ regions) 5033 and 5035 at different concentrations. In the third doping processing, doping processing is conducted such that a concentration of the impurity element for providing a P-type is $1 \times 10^{19}$ atoms/cm$^3$ to $5 \times 10^{21}$ atoms/cm$^3$ in any region of the fourth impurity regions (P$^+$ regions) 5032 and 5034 and the fifth impurity regions (P$^-$ regions) 5033 and 5035. Thus, the fourth impurity regions (P$^+$ regions) 5032 and 5034 and the fifth impurity regions (P$^-$ regions) 5033 and 5035 serve as the source regions and the drain regions of the P-channel TFTs without causing a problem.

Note that, in this embodiment, the fourth impurity regions (P$^+$ regions) 5032 and 5034 and the fifth impurity regions (P$^-$ regions) 5033 and 5035 are formed by only the third doping processing. However, the present invention is not limited to this. A condition for doping processing may be changed as appropriate and doping processing may be performed plural times to form those regions.

Next, as shown in FIG. 14B, the mask 5031 made of a resist is removed and a first interlayer insulating film 5036 is formed. An insulating film containing silicon is formed as the first interlayer insulating film 5036 at a thickness of 100 nm to 200 nm by a plasma CVD method or a sputtering method. In this embodiment, a silicon oxynitride film is formed at a film thickness of 100 nm by a plasma CVD method. Of course, the first interlayer insulating film 5036 is not limited to the silicon oxynitride film, and therefore another insulating film containing silicon may be used as a single layer or a laminate structure.

Next, as shown in FIG. 14C, heat treatment is performed for the recovery of crystallinity of the semiconductor layers and the activation of the impurity element added to the semiconductor layers. This heat treatment is performed by a thermal anneal method using a furnace anneal furnace. The thermal anneal method is preferably conducted in a nitrogen atmosphere in which an oxygen concentration is 1 ppm or less, preferably, 0.1 ppm or less at 400° C. to 700° C. In this embodiment, the heat treatment at 410° C. for 1 hour is performed for the activation processing. Note that a laser anneal method or a rapid thermal anneal method (RTA method) can be applied in addition to the thermal anneal method.

Also, the heat treatment may be performed before the formation of the first interlayer insulating film 5036. However, if materials which compose the first conductive layers 5015a to 5019a and the second conductive layers 5015b to 5019b are sensitive to heat, it is preferable that heat treatment is performed after the first interlayer insulating film 5036 (insulating film containing mainly silicon, for example, silicon nitride film) for protecting a wiring and the like is formed as in this embodiment.

As described above, when the heat treatment is performed after the formation of the first interlayer insulating film 5036 (insulating film containing mainly silicon, for example, silicon nitride film), the hydrogenation of the semiconductor layer can be also conducted simultaneous with the activation processing. In the hydrogenation step, a dangling bond of the semiconductor layer is terminated by hydrogen contained in the first interlayer insulating film 5036.

Note that heat treatment for hydrogenation which is different from the heat treatment for activation processing may be performed.

Here, the semiconductor layer can be hydrogenated regardless of the presence or absence of the first interlayer insulating film 5036. As another means for hydrogenation, means for using hydrogen excited by plasma (plasma hydrogenation) or means for performing heat treatment in an atmosphere containing hydrogen of 3% to 100% at 300° C. to 450° C. for 1 hour to 12 hours may be used.

Next, a second interlayer insulating film 5037 is formed on the first interlayer insulating film 5036. An inorganic insulating film can be used as the second interlayer insulating film 5037. For example, a silicon oxide film formed by a CVD method, a silicon oxide film applied by an SOG (spin on glass) method, or the like can be used. In addition, an organic insulating film can be used as the second interlayer insulating film 5037. For example, a film made of polyimide, polyamide, BCB (benzocyclobutene), acrylic, or the like can be used. Further, a laminate structure of an acrylic film and a silicon oxide film may be used.

In this embodiment, an acrylic film having a film thickness of 1.6 μm is formed. When the second interlayer insulating film 5037 is formed, unevenness caused by TFTs formed on the substrate 5000 is reduced and the surface can be leveled. In particular, the second interlayer insulating film 5037 has a strong sense of leveling. Thus, a film having superior evenness is preferable.

Next, using dry etching or wet etching, the second interlayer insulating film 5037, the first interlayer insulating film 5036, and the gate insulating film 5006 are etched to form contact holes which reach the third impurity regions 5025 and 5028 and the fourth impurity regions 5032 and 5034.

Next, a pixel electrode 5038 made from a transparent conductive film is formed. A compound of indium oxide and tin oxide (indium tin oxide: ITO), a compound of indium oxide and zinc oxide, zinc oxide, tin oxide, indium oxide, or the like can be used for the transparent conductive film. In addition, the transparent conductive film to which gallium is added may be used. The pixel electrode corresponds to the anode of an EL element.

In this embodiment, an ITO film is formed at a thickness of 110 nm and then patterned to form the pixel electrode 5038.

Next, wirings 5039 to 5045 electrically connected with the respective impurity regions are formed. Note that, in this embodiment, a Ti film having a film thickness of 100 nm, an Al film having a film thickness of 350 nm, and a Ti film having a film thickness of 100 nm are formed into a laminate in succession by a sputtering method and a resultant laminate film is patterned in a predetermined shape so that the wirings 5039 to 5045 are formed.

Of course, they are not limited to a three-layer structure. A single layer structure, a two-layer structure, or a laminate structure composed of four layers or more may be used. Materials of the wirings are not limited to Al and Ti, and therefore other conductive films may be used. For example, an Al film or a Cu film is formed on a TaN film, a Ti film is formed thereon, and then a resultant laminate film is patterned to form the wirings.

Thus, one of the source and the drain of an N-channel TFT in a pixel portion is electrically connected with a source signal line (laminate of 5019a and 5019b) through the wiring 5042 and the other is electrically connected with the gate electrode of a P-channel TFT in the pixel portion through the wiring 5043. In addition, one of the source and the drain of the P-channel TFT in the pixel portion is electrically connected with a pixel electrode 5047 through the wiring 5044. Here, a portion on the pixel electrode 5047 and a portion of the wiring 5044 are overlapped with each other so that electrical connection between the wiring 5044 and the pixel electrode 5047 is produced.

By the above steps, as shown in FIG. 14D, the driving circuit portion including the CMOS circuit composed of the N-channel TFT and the P-channel TFT and the pixel portion including the switching TFT and the driving TFT can be formed on the same substrate.

The N-channel TFT in the driving circuit portion includes low concentration impurity regions 5026 (Lov regions) overlapped with the first conductive layer 5015a composing a portion of the gate electrode and high concentration impurity regions 5025 which each serve as the source region or the drain region. The P-channel TFT which is connected with the N-channel TFT through the wiring 5040 and composes the CMOS circuit includes low concentration impurity regions 5033 (Lov regions) overlapped with the first conductive layer 5016a composing a portion of the gate electrode and high concentration impurity regions 5032 which each serve as the source region or the drain region.

The N-channel switching TFT in the pixel portion includes low concentration impurity regions 5029 (Loff regions) formed outside the gate electrode and high concentration impurity regions 5028 which each serve as the source region or the drain region. In addition, the P-channel driving TFT in the pixel portion includes low concentration impurity regions 5035 (Lov regions) overlapped with the first conductive layer 5018a composing a portion of the gate electrode and high concentration impurity regions 5034 which each serve as the source region or the drain region.

Next, a third interlayer insulating film 5046 is formed. An inorganic insulating film or an organic insulating film can be used as the third interlayer insulating film. A silicon oxide film formed by a CVD method, a silicon oxide film applied by an SOG (spin on glass) method, or the like can be used as the inorganic insulating film. In addition, an acrylic resin film or the like can be used as the organic insulating film.

Examples of a combination of the second interlayer insulating film 5037 and the third interlayer insulating film 5046 will be described below.

There is a combination in which a silicon oxide film formed by a plasma CVD method is used as the second interlayer insulating film 5037 and a silicon oxide film formed by a plasma CVD method is used as the third interlayer insulating film 5046. In addition, there is a combination in which a silicon oxide film formed by an SOG method is used as the second interlayer insulating film 5037 and a silicon oxide film formed by an SOG method is used as the third interlayer insulating film 5046. In addition, there is a combination in which a laminate film of a silicon oxide film formed by an SOG method and a silicon oxide film formed by a plasma CVD method is used as the second interlayer insulating film 5037 and a silicon oxide film formed by a plasma CVD method is used as the third interlayer insulating film 5046. In addition, there is a combination in which acrylic is used for the second interlayer insulating film 5037 and acrylic is used for the third interlayer insulating film 5046. In addition, there is a combination in which a laminate film of an acrylic film and a silicon oxide film formed by a plasma CVD method is used as the second interlayer insulating film 5037 and a silicon oxide film formed by a plasma CVD method is used as the third interlayer insulating film 5046. In addition, there is a combination in which a silicon oxide film formed by a plasma CVD method is used as the second interlayer insulating film 5037 and acrylic is used for the third interlayer insulating film 5046.

An opening portion is formed at a position corresponding to the pixel electrode 5047 in the third interlayer insulating film 5046. The third interlayer insulating film serves as a bank. When a wet etching method is used at the formation of the opening portion, it can be easily formed as a side wall having a taper shape. If the side wall of the opening portion is not sufficiently gentle, the deterioration of an EL layer by a step becomes a marked problem. Thus, attention is required.

A carbon particle or a metallic particle may be added into the third interlayer insulating film 5046 to reduce resistivity, thereby suppressing the generation of static electricity. At this time, the amount of carbon particle or metallic particle to be added is preferably adjusted such that the resistivity becomes $1\times10^6$ Ωm to $1\times10^{12}$ Ωm (preferably, $1\times10^8$ Ωm to $1\times10^{10}$ Ωm).

Next, an EL layer 5047 is formed on the pixel electrode 5038 exposed in the opening portion of the third interlayer insulating film 5046.

An organic light emitting material or an inorganic light emitting material which are known can be used as the EL layer 5047.

A low molecular weight based organic light emitting material, a high molecular weight based organic light emitting material, or an intermediate molecular weight based organic light emitting material can be freely used as the organic light emitting material. Note that in this specification, a intermediate molecular weight based organic light emitting material indicates an organic light emitting material which has no sublimation property and in which the number of molecules is 20 or less or a length of chained molecules is 10 μm or less.

The EL layer 5047 has generally a laminate structure. Typically, there is a laminate structure of "a hole transporting layer, a light emitting layer, and an electron transporting layer", which has been proposed by Tang et al. in Eastman Kodak Company. In addition to this, a structure in which "a hole injection layer, a hole transporting layer, a light emitting layer, and an electron transporting layer" or "a hole injection layer, a hole transporting layer, a light emitting layer, an electron transporting layer, and an electron injection layer" are laminated on an anode in this order may be used. A light emitting layer may be doped with fluorescent pigment or the like.

In this embodiment, the EL layer 5047 is formed by an evaporation method using a low molecular weight based organic light emitting material. Specifically, a laminate structure in which a copper phthalocyanine (CuPc) film having a thickness of 20 nm is provided as the hole injection layer and a tris-8-quinolinolato aluminum complex ($Alq_3$) film having a thickness of 70 nm is provided thereon as the light emitting layer is used. A light emission color can be controlled by adding fluorescent pigment such as quinacridon, perylene, or DCM1 to $Alq_3$.

Note that only one pixel is shown in FIG. 14D. However, a structure in which the EL layers 5047 corresponding to respective colors of, plural colors, for example, R (red), G (green), and B (blue) are separately formed can be used.

Also, as an example using the high molecular weight based organic light emitting material, the EL layer 5047 may be constructed by a laminate structure in which a polythiophene (PEDOT) film having a thickness of 20 nm is provided as the hole injection layer by a spin coating method and a paraphenylenevinylene (PPV) film having a thickness of about 100 nm is provided thereon as the light emitting layer. When π conjugated system polymer of PPV is used, a light emission wavelength from red to blue can be selected. In addition, an inorganic material such as silicon carbide can be used as the electron transporting layer and the electron injection layer.

Note that the EL layer 5047 is not limited to a layer having a laminate structure in which the hole injection layer, the hole transporting layer, the light emitting layer, the electron transporting layer, the electron injection layer, and the like are distinct. In other words, the EL layer 5047 may have a laminate structure with a layer in which materials composing the hole injection layer, the hole transporting layer, the light emitting layer, the electron transporting layer, the electron injection layer, and the like are mixed.

For example, the EL layer 5047 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 5048 made from a conductive film is provided on the EL layer 5047. In the case of this embodiment, an alloy film of aluminum and lithium is used as the conductive film. Of course, a known MgAg film (alloy film of magnesium and silver) may be used. The pixel electrode 5048 corresponds to the cathode of the EL element. A conductive film made of an element which belongs to Group 1 or Group 2 of the periodic table or a conductive film to which those elements are added can be freely used as a cathode material.

When the pixel electrode 5048 is formed, the EL element is completed. Note that the EL element indicates an element composed of the pixel electrode (anode) 5038, the EL layer 5047, and the pixel electrode (cathode) 5048.

It is effective that a passivation film 5049 is provided to completely cover the EL element. A single layer of an insulating film such as a carbon film, a silicon nitride film, or a silicon oxynitride film, or a laminate layer of a combination thereof can be used as the passivation film 5049.

It is preferable that a film having good coverage is used as the passivation film 5049, and it is effective to use a carbon film, particularly, a DLC (diamond like carbon) film. The DLC film can be formed at a temperature range of from a room temperature to 100° C. Thus, a film can be easily formed over the EL layer 5047 having a low heat-resistance. In addition, the DLC film has a high blocking effect to oxygen so that the oxidization of the EL layer 5047 can be suppressed. Therefore, a problem in that the EL layer 5047 is oxidized can be prevented.

Note that, it is effective that steps up to the formation of the passivation film 5049 after the formation of the third interlayer insulating film 5046 are conducted in succession using a multi-chamber type (or in-line type) film formation apparatus without being exposed to air.

Note that, actually, when it is completed up to the state shown in FIG. 14D, in order not to be exposed to air, it is preferable that packaging (sealing) is conducted using a protective film (laminate film, ultraviolet curable resin film, or the like) or a transparent sealing member which has a high airtight property and low degassing. At this time, when an inner portion surrounded by the sealing member is made to an inert atmosphere or a hygroscopic material (for example, barium oxide) is placed in the inner portion, the reliability of the EL element is improved.

Also, after an airtightness level is increased by processing such as packaging, a connector (flexible printed circuit: FPC) for connecting terminals led from elements or circuits which are formed on the substrate 5000 with external signal terminals is attached so that it is completed as a product.

Also, according to the steps described in this embodiment, the number of photo masks required for manufacturing a light emitting device can be reduced. As a result, the process is shortened and it can contribute to the reduction in manufacturing cost and the improvement of a yield.

Embodiment 9

In this embodiment, a process of manufacturing the active matrix substrate having a structure different from that described in Embodiment 11 will be described using FIGS. 15A to 15D.

Note that, the steps up to the step shown in FIG. 15A are similar to those shown in FIGS. 13A to 13D and 14A in Embodiment 11. Note that it is different from Embodiment 11 at a point that a driving TFT composing a pixel portion is an N-channel TFT having low concentration impurity regions (Loff regions) formed outside the gate electrode. With respect to the driving TFT, as described in Embodiment 9, the low concentration impurity regions (Loff regions) may be formed outside the gate electrode using a mask made of a resist.

Portions similar to FIGS. 13A to 13D and 14A to 14D are indicated using the same symbols and the description is omitted here.

As shown in FIG. 15A, a first interlayer insulating film 5101 is formed. An insulating film containing silicon is formed as the first interlayer insulating film 5101 at a thickness of 100 nm to 200 nm by a plasma CVD method or a sputtering method. In this embodiment, a silicon oxynitride film having a film thickness of 100 nm is formed by a plasma CVD method. Of course, the first interlayer insulating film 5101 is not limited to the silicon oxynitride film, and therefore another insulating film containing silicon may be used as a single layer or a laminate structure.

Next, as shown in FIG. 15B, heat treatment (thermal processing) is performed for the recovery of crystallinity of the semiconductor layers and the activation of the impurity element added to the semiconductor layers. This heat treatment is performed by a thermal anneal method using a furnace anneal furnace. The thermal anneal method is preferably conducted in a nitrogen atmosphere in which an oxygen concentration is 1 ppm or less, preferably, 0.1 ppm or less at 400° C. to 700° C. In this embodiment, the heat treatment at 410° C. for 1 hour is performed for the activation processing. However, if a laser anneal method or a rapid thermal anneal method (RTA method) can be applied in addition to the thermal anneal method.

Also, the heat treatment may be performed before the formation of the first interlayer insulating film 5101. Note that, the first conductive layers 5015a to 5019a and the second conductive layers 5015b to 5019b are sensitive to heat, it is preferable that heat treatment is performed after the first interlayer insulating film 5101 (insulating film containing mainly silicon, for example, silicon nitride film) for protecting a wiring and the like is formed as in this embodiment.

As described above, when the heat treatment is performed after the formation of the first interlayer insulating film 5101 (insulating film containing mainly silicon, for example, silicon nitride film), the hydrogenation of the semiconductor layer can be also conducted simultaneous with the activation processing. In the hydrogenation step, a dangling bond of the semiconductor layer is terminated by hydrogen contained in the first interlayer insulating film 5101.

Note that heat treatment for hydrogenation other than the heat treatment for activation processing may be performed.

Here, the semiconductor layer can be hydrogenated regardless of the presence or absence of the first interlayer insulating film 5101. As another means for hydrogenation, means for using hydrogen excited by plasma (plasma hydrogenation) or means for performing heat treatment in an atmosphere containing hydrogen of 3% to 100% at 300° C. to 450° C. for 1 hour to 12 hours may be used.

By the above steps, the driving circuit portion including the CMOS circuit composed of the N-channel TFT and the P-channel TFT and the pixel portion including the switching TFT and the driving TFT can be formed on the same substrate.

Next, a second interlayer insulating film 5102 is formed on the first interlayer insulating film 5101. An inorganic insulating film can be used as the second interlayer insulating film 5102. For example, a silicon oxide film formed by a CVD method, a silicon oxide film applied by an SOG (spin on glass) method, or the like can be used. In addition, an organic insulating film can be used as the second interlayer insulating film 5102. For example, a film made of polyimide, polyamide, BCB (benzocyclobutene), acrylic, or the like can be used. Further, a laminate structure of an acrylic film and a silicon oxide film may be used.

Next, using dry etching or wet etching, the first interlayer insulating film 5101, the second interlayer insulating film 5102, and the gate insulating film 5006 are etched to form contact holes which reach impurity regions (third impurity regions ($N^+$ regions) and fourth impurity regions ($P^+$ regions)) of respective TFTs which compose the driving circuit portion and the pixel portion.

Next, wirings 5103 to 5109 electrically connected with the respective impurity regions are formed. Note that, in this embodiment, a Ti film having a film thickness of 100 nm, an Al film having a film thickness of 350 nm, and a Ti film having a film thickness of 100 nm are formed in succession by a sputtering method and a resultant laminate film is patterned in a predetermined shape so that the wirings 5103 to 5109 are formed.

Of course, they are not limited to a three-layer structure. A single layer structure, a two-layer structure, or a laminate structure composed of four layers or more may be used. Materials of the wirings are not limited to Al and Ti, and therefore other conductive films may be used. For example, it is preferable that an Al film or a Cu film is formed on a TaN film, a Ti film is formed thereon, and then a resultant laminate film is patterned to form the wirings.

One of the source region and the drain region of a switching TFT in a pixel portion is electrically connected with a source wiring (laminate of 5019a and 5019b) through the wiring 5106 and the other is electrically connected with the gate electrode of a driving TFT in the pixel portion through the wiring 5107.

Next, as shown in FIG. 15C, a third interlayer insulating film 5110 is formed. An inorganic insulating film or an organic insulating film can be used as the third interlayer insulating film 5110. A silicon oxide film formed by a CVD method, a silicon oxide film applied by an SOG (spin on glass) method, or the like can be used as the inorganic insulating film. In addition, an acrylic resin film or the like can be used as the organic insulating film.

When the third interlayer insulating film 5110 is formed, unevenness caused by TFTs formed on the substrate 5000 is reduced and the surface can be leveled. In particular, the third interlayer insulating film 5110 is for leveling. Thus, a film having superior evenness is preferable.

Next, using dry etching or wet etching, the third interlayer insulating film 5110 is etched to form contact holes which reach the wiring 5108.

Next, a conductive film is patterned to form a pixel electrode 5111. In the case of this embodiment, an alloy film of aluminum and lithium is used as the conductive film. Of course, a known MgAg film (alloy film of magnesium and silver) may be used. The pixel electrode 5111 corresponds to the cathode of the EL element. A conductive film made of an element which belongs to Group 1 or Group 2 of the periodic table or a conductive film to which those elements are added can be freely used as a cathode material.

The pixel electrode 5111 is electrically connected with the wiring 5108 through a contact hole formed in the third interlayer insulating film 5110. Thus, the pixel electrode 5111 is electrically connected with one of the source region and the drain region of the driving TFT.

Next, as shown in FIG. 15D, banks 5112 are formed such that EL layers of respective pixels are separated from each other. The banks 5112 are formed from an inorganic insulating film or an organic insulating film. A silicon oxide film formed by a CVD method, a silicon oxide film applied by an SOG method, or the like can be used as the inorganic insulating film. In addition, an acrylic resin film or the like can be used as the organic insulating film.

Here, when a wet etching method is used at the formation of the banks 5112, they can be easily formed as side walls having taper shapes. If the side walls of the banks 5112 are not sufficiently gentle, the deterioration of an EL layer caused by a step becomes a marked problem. Thus, attention is required.

Note that, when the pixel electrode 5111 and the wiring 5108 are electrically connected with each other, the banks 5112 are formed in portions of the contact holes formed in the third interlayer insulating film 5110. Thus, unevenness of the pixel electrode caused by unevenness of the contact hole portions is leveled by the banks 5112 so that the deterioration of the EL layer caused by the step is prevented.

Examples of a combination of the third interlayer insulating film 5110 and the banks 5112 will be described below.

There is a combination in which a silicon oxide film formed by a plasma CVD method is used as the third interlayer insulating film 5110 and a silicon oxide film formed by a plasma CVD method is used as the banks 5112. In addition, there is a combination in which a silicon oxide film formed by an SOG method is used as the third interlayer insulating film 5110 and a silicon oxide film formed by an SOG method is used as the banks 5112. In addition, there is a combination in which a laminate film of a silicon oxide film formed by an SOG method and a silicon oxide film formed by a plasma CVD method is used as the third interlayer insulating film 5110 and a silicon oxide film formed by a plasma CVD method is used as the banks 5112. In addition, there is a combination in which acrylic is used for the third interlayer insulating film 5110 and acrylic is used for the banks 5112. In addition, there is a combination in which a laminate film of an acrylic film and a silicon oxide film formed by a plasma CVD method is used as the third interlayer insulating film 5110 and a silicon oxide film formed by a plasma CVD method is used as the banks 5112. In addition, there is a combination in which a silicon oxide film formed by a plasma CVD method is used as the third interlayer insulating film 5110 and acrylic is used for the banks 5112.

A carbon particle or a metallic particle may be added into the banks 5112 to reduce resistivity, thereby suppressing the generation of static electricity. At this time, the amount of carbon particle or metallic particle to be added is preferably adjusted such that the resistivity becomes $1 \times 10^6$ Ωm to $1 \times 10^{12}$ Ωm (preferably, $1 \times 10^8$ Ωm to $1 \times 10^{10}$ Ωm).

Next, an EL layer 5113 is formed on the pixel electrode 5038 which is surrounded by the banks 5112 and exposed.

An organic light emitting material or an inorganic light emitting material which are known can be used as the EL layer 5113.

A low molecular weight based organic light emitting material, a high molecular weight based organic light emitting material, or a medium molecular weight based organic light emitting material can be freely used as the organic light emitting material. Note that in this specification, a medium molecular weight based organic light emitting material indicates an organic light emitting material which has no sublimation property and in which the number of molecules is 20 or less or a length of chained molecules is 10 μm or less.

The EL layer 5113 has generally a laminate structure. Typically, there is a laminate structure of "a hole transporting layer, a light emitting layer, and an electron transporting layer", which has been proposed by Tang et al. in Eastman Kodak Company. In addition to this, a structure in which "an electron transporting layer, a light emitting layer, a hole transporting layer, and an hole injection layer" or "an electron injection layer, a light emitting layer, an hole transporting layer, and a hole injection layer" are laminated on an cathode in this order may be used. A light emitting layer may be doped with fluorescent pigment or the like.

In this embodiment, the EL layer 5113 is formed by an evaporation method using a low molecular weight based organic light emitting material. Specifically, a laminate structure in which a tris-8-quinolinolato aluminum complex ($Alq_3$) film having a thickness of 70 nm is provided as the light emitting layer and a copper phthalocyanine (CuPc) film having a thickness of 20 nm is provided thereon as the light emitting layer is used. A light emission color can be controlled by adding fluorescent pigment such as quinacridon, perylene, or DCM1 to $Alq_3$.

Note that only one pixel is shown in FIG. 15D. However, a structure in which the EL layers 5113 corresponding to respective colors of, plural colors, for example, R (red), G (green), and B (blue) are separately formed can be used.

Also, as an example using the high molecular weight based organic light emitting material, the EL layer 5113 may be constructed by a laminate structure in which a polythiophene (PEDOT) film having a thickness of 20 nm is provided as the hole injection layer by a spin coating method and a paraphenylenevinylene (PPV) film having a thickness of about 100 nm is provided thereon as the light emitting layer. When π conjugated system polymer of PPV is used, a light emission wavelength from red to blue can be selected. In addition, an inorganic material such as silicon carbide can be used for the electron transporting layer and the electron injection layer.

Note that the EL layer 5113 is not limited to a layer having a laminate structure in which the hole injection layer, the hole transporting layer, the light emitting layer, the electron transporting layer, the electron injection layer, and the like are distinct. In other words, the EL layer 5113 may have a laminate structure with a layer in which materials composing the hole injection layer, the hole transporting layer, the light emitting layer, the electron transporting layer, the electron injection layer, and the like are mixed.

For example, the EL layer 5113 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 5114 made from a transparent conductive film is formed on the EL layer 5113. A compound of indium oxide and tin oxide (ITO), a compound of indium oxide and zinc oxide, zinc oxide, tin oxide, indium oxide, or the like can be used for the transparent conductive film. In addition, the transparent conductive film to which gallium is added may be used. The pixel electrode 5114 corresponds to the anode of the EL element.

When the pixel electrode 5114 is formed, the EL element is completed. Note that the EL element indicates a diode composed of the pixel electrode (cathode) 5111, the EL layer 5113, and the pixel electrode (anode) 5114.

In this embodiment, the pixel electrode 5114 is made from the transparent conductive film. Thus, light emitted from the EL element is radiated to an opposite side to the substrate 5000. In addition, through the third interlayer insulating film 5110, the pixel electrode 5111 is formed in the layer different from the layer in which the wirings 5106 and 5109 are formed. Thus, an aperture ratio can be increased as compared with the structure described in Embodiment 9.

It is effective that a protective film (passivation film) 5115 is provided to completely cover the EL element. A single layer of an insulating film such as a carbon film, a silicon nitride film, or a silicon oxynitride film, or a laminate layer of a combination thereof can be used as the protective film 5115.

Note that, when light emitted from the EL element is radiated from the pixel electrode 5114 side as in this embodiment, it is necessary to use a film which transmits light as a protective film 5115.

Note that it is effective that steps up to the formation of the protective film 5115 after the formation of the banks 5112 are conducted in succession using a multi-chamber type (or in-line type) film formation apparatus without being exposed to air.

Note that, actually, when it is completed up to the state shown in FIG. 15D, in order not to be exposed to air, it is preferable that packaging (sealing) is conducted using a protective film (laminate film, ultraviolet curable resin film, or the like) or a sealing member which has a high airtight property and low degassing. At the same time, when an inner portion surrounded by the sealing member is made to an inert atmosphere or a hygroscopic material (for example, barium oxide) is located in the inner portion, the reliability of the EL element is improved.

Also, after an airtightness level is improved by processing such as packaging, a connector (flexible printed circuit: FPC) for connecting terminals led from elements or circuits which are formed on the substrate 5000 with external signal terminals is attached so that it is completed as a product.

Embodiment 10

In this embodiment, an example in which a light emitting device is manufactured according to the present invention will be described using FIGS. 16A to 16C.

Figure 16A:
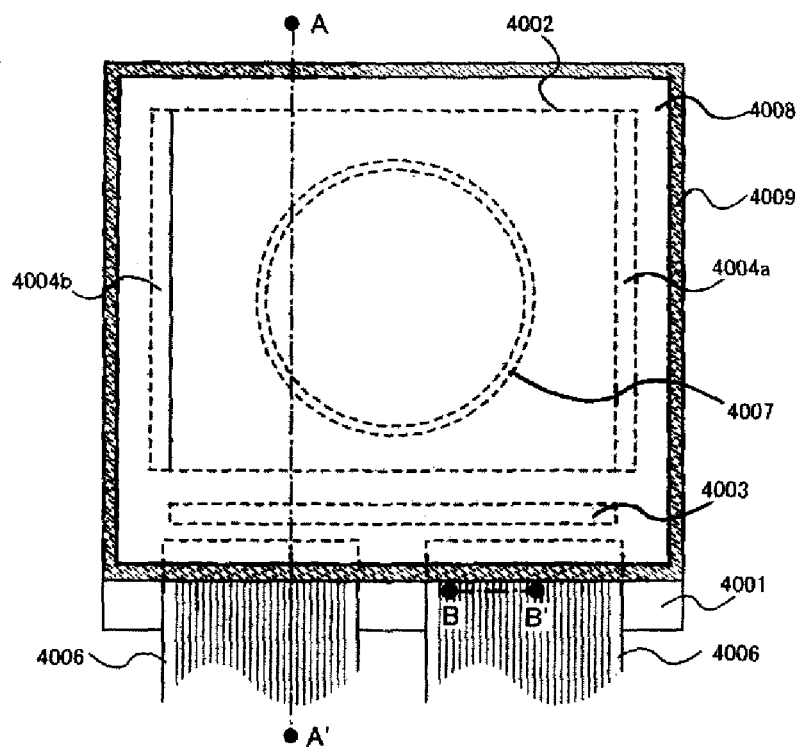
FIGS. 16A-16C are an exterior view and sectional views of a light emitting device.
Figure 16B:
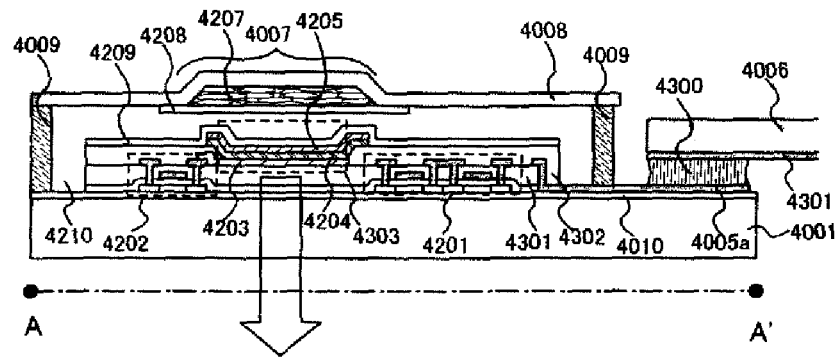

FIG. 16A is a top view of a light emitting device produced by sealing an element substrate in which TFTs are formed with a sealing member. FIG. 16B is a cross sectional view along a line A-A' in FIG. 16A. FIG. 16C is a cross sectional view along a line B-B' in FIG. 16A.

A seal member 4009 is provided to surround a pixel portion 4002, a source signal line driving circuit 4003, and first and second gate signal line driving circuits 4004*a* and 4004*b* which are provided on a substrate 4001. In addition, a sealing member 4008 is provided over the pixel portion 4002, the source signal line driving circuit 4003, and the first and second gate signal line driving circuits 4004*a* and 4004*b*. Thus, the pixel portion 4002, the source signal line driving circuit 4003, and the first and second gate signal line driving circuits 4004*a* and 4004*b* are sealed with the substrate 4001, the seal member 4009 and the sealing member 4008 and filled with a filling agent 4210.

Also, the pixel portion 4002, the source signal line driving circuit 4003, and the first and second gate signal line driving circuits 4004*a* and 4004*b* which are provided on the substrate 4001 each have a plurality of TFTs. In FIG. 16B, TFTs (note that an N-channel TFT and a P-channel TFT are shown here) 4201 included in the source signal line driving circuit 4003 and a TFT 4202 included in the pixel portion 4002, which are formed on a base film 4010 are typically shown.

An interlayer insulating film (planarization film) 4301 is formed on the TFTs 4201 and 4202, and a pixel electrode (anode) 4203 electrically connected with the drain of the TFT 4202 is formed thereon. A transparent conductive film having a large work function is used as the pixel electrode 4203. A compound of indium oxide and tin oxide, a compound of indium oxide and zinc oxide, zinc oxide, tin oxide, or indium oxide can be used for the transparent conductive film. In addition, the transparent conductive film to which gallium is added may be used.

An insulating film 4302 is formed on the pixel electrode 4203. An opening portion is formed in the insulating film 4302 on the pixel electrode 4203. In the opening portion, an organic light emitting layer 4204 is formed on the pixel electrode 4203. An organic light emitting material or an inorganic light emitting material which are known can be used as the organic light emitting layer 4204. In addition, the organic light emitting material includes a low molecular weight based (monomer system) material and a high molecular weight based (polymer system) material, and any material may be used.

An evaporation technique or an applying method technique which are known is preferably used as a method of forming the organic light emitting layer 4204. In addition, a laminate structure or a single layer structure which is obtained by freely combining a hole injection layer, a hole transporting layer, a light emitting layer, an electron transporting layer, and an electron injection layer is preferably used as the structure of the organic light emitting layer.

A cathode 4205 made from a conductive film having a light shielding property (typically, a conductive film containing mainly aluminum, copper, or silver, or a laminate film of the conductive film and another conductive film) is formed on the organic light emitting layer 4204. In addition, it is desirable that moisture and oxygen which exist in an interface between the cathode 4205 and the organic light emitting layer 4204 are minimized. Thus, a devise is required in which the organic light emitting layer 4204 is formed in a nitrogen atmosphere or a noble atmosphere and the cathode 4205 without being exposed to oxygen and moisture is formed. In this embodiment, the above film formation is possible by using a multi-chamber type (cluster tool type) film formation apparatus. A predetermined voltage is supplied to the cathode 4205.

By the above steps, a light emitting element 4303 composed of the pixel electrode (anode) 4203, the organic light emitting layer 4204, and the cathode 4205 is formed. A protective film 4303 is formed on the insulating film 4302 so as to cover the light emitting element 4303. The protective film 4303 is effective to prevent oxygen, moisture, and the like from penetrating the light emitting element 4303.

Reference numeral 4005*a* denotes a lead wiring connected with a power source, which is connected with a first electrode of the TFT 4202. The lead wiring 4005*a* is passed between the seal member 4009 and the substrate 4001 and electrically connected with an FPC wiring 4301 of an FPC 4006 through an anisotropic conductive film 4300.

A glass material, a metallic member (typically, a stainless member), a ceramic member, a plastic member (including a plastic film) can be used as the sealing member 4008. An FRP (fiberglass reinforced plastic) plate, a PVF (polyvinyl fluoride) film, a Mylar film, a polyester film, or an acrylic resin film can be used as the plastic member. In addition, a sheet having a structure in which aluminum foil is sandwiched by a PVF film and a Mylar film can be used.

Note that, when a radiation direction of light from the light emitting element is toward a cover member side, it is required that the cover member is transparent. In this case, a transparent material such as a glass plate, a plastic plate, a polyester film, or acrylic film is used.

Also, in addition to an inert gas such as nitrogen or argon, ultraviolet curable resin or thermal curable resin can be used for the filling agent 4103. PVC (polyvinyl chloride), acrylic, polyimide, epoxy resin, silicon resin, PVB (polyvinyl butyral), or EVA (ethylene vinyl acetate) can be used. In this embodiment, nitrogen is used for the filling agent.

Also, in order to expose the filling agent 4103 to a hygroscopic material (preferably barium oxide) or a material capable of absorbing oxygen, a concave portion 4007 is provided to the surface of the sealing member 4008 in the substrate 4001 side, and the hygroscopic material or the material capable of absorbing oxygen which is indicated by 4207 is located. In order to prevent the material 4207 having a hygroscopic property or being capable of absorbing oxygen from flying off, the material 4207 having a hygroscopic property or being capable of absorbing oxygen is held in the concave portion 4007 by a concave cover member 4208. Note that concave cover member 4208 is formed in a fine meshed shape and constructed such that it transmits air and moisture but does not transmit the material 4207 having a hygroscopic property or being capable of absorbing oxygen. When the material 4207 having a hygroscopic property or being capable of absorbing oxygen is provided, the deterioration of the light emitting element 4303 can be suppressed.

Figure 16C:
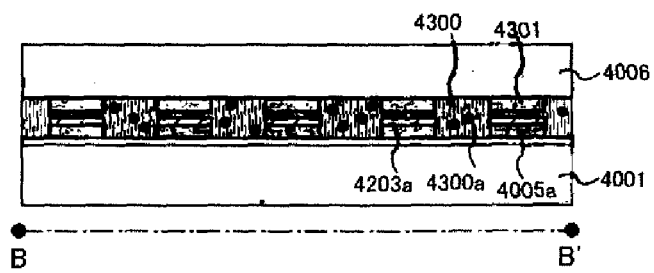

As shown in FIG. 16C, a conductive film 4203*a* is formed on the lead wiring 4005*a* such that it is in contact with the lead wiring 4005*a* simultaneously with the formation of the pixel electrode 4203.

Also, the anisotropic conductive film 4300 has a conductive filler 4300*a*. When the substrate 4001 and the FPC 4006 are bonded to each other by thermal compression, the conductive film 4203*a* located over the substrate 4001 and the FPC wiring 4301 located on the FPC 4006 are electrically connected with each other through the conductive filler 4300*a*.

Embodiment 11

According to the present invention, an organic light emitting material which can utilize phosphorescence from triplet excitation for light emission is used. Thus, external light emission quantum efficiency can be dramatically improved. Therefore, reduction in consumption power, an increase in life, and weight reduction of the light emitting element become possible.

Here, a report in which external light emission quantum efficiency is improved by utilizing triplet excitation is shown.

(T. Tsutsui, C. Adachi, S. Saito, Photochemical Processes in Organized Molecular Systems, ed. K. Honda, (Elsevier Sci. Pub., Tokyo, 1991) p. 437)

A molecular formula of an organic light emitting material (coumarin pigment) reported from the above paper is indicated below.

[Chem. 1]

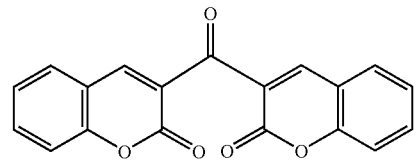

(M. A. Baldo, D. F. O'Brien, Y. You, A. Shoustikov, S. Sibley, M. E. Thompson, S. R. Forrest, Nature 395 (1998) p. 151)

A molecular formula of an organic light emitting material (Pt complex) reported from the above paper is indicated below.

[Chem. 2]

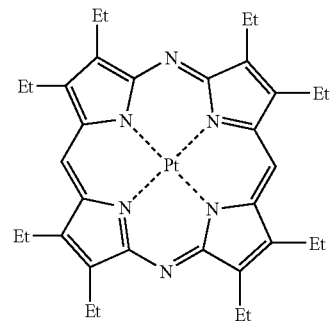

(M. A. Baldo, S. Lamansky, P. E. Burrrows, M. E. Tompson, S. R. Forrest, Appl. Phys. Lett., 75 (1999) p. 4) (T. Tsutsui, M. -J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.)

A molecular formula of an organic light emitting material (Ir complex) reported from the above paper is indicated below.

[Chem. 3]

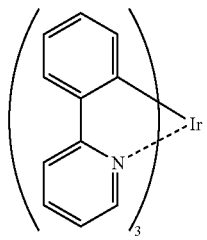

As described above, if phosphorescence light emission from triplet excitation can be utilized, external light emission quantum efficiency which is three to four times larger then that in the case where fluorescence light emission from singlet excitation is used can be realized in theory.

Embodiment 12

The present invention utilizes a phenomenon as a method to correct the threshold of a transistor. In this phenomenon, the source-drain voltage of a transistor used in the correction becomes equal to the threshold of the transistor by letting a current flow between the source and the drain after the gate and drain of the transistor is short-circuited to make the it into a diode. This phenomenon is applicable not only to a pixel portion as introduced in the present invention but also to a driving circuit.

A current supply circuit in a driving circuit for outputting a current to a pixel and others is given as an example. A current supply circuit is a circuit for outputting a desired current from a voltage signal inputted. A voltage signal is inputted to a gate electrode of a current supply transistor in a current supply circuit, and a current according to the gate-source voltage thereof is outputted through the current supply transistor. In other words, the threshold correction method of the present invention is used to correct the threshold of a current supply transistor.

Figure 27A:
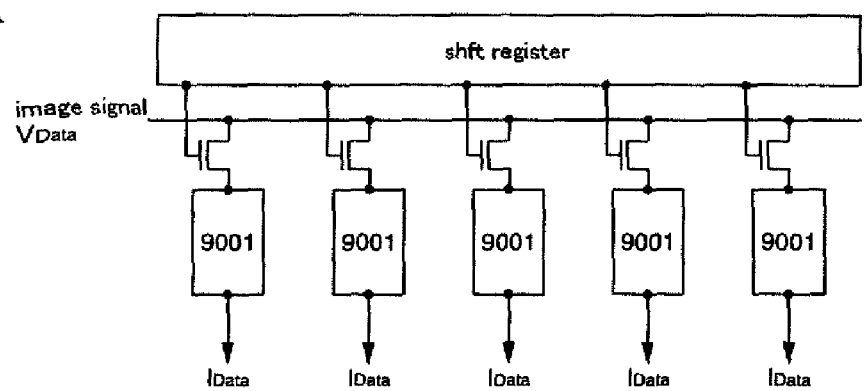
FIGS. 27A and 27B are diagrams showing an example of constituting a current supply circuit using the threshold correction principle of the present invention.

FIG. 27A shows an example of using a current supply circuit. Sampling pulses are sequentially outputted from a shift register and respectively inputted to current supply circuits 9001. Video signals are sampled upon input of the sampling pulses to the current supply circuits 9001. In this case, the sampling operation is carried out in a dot-sequential manner.

Figure 27B:
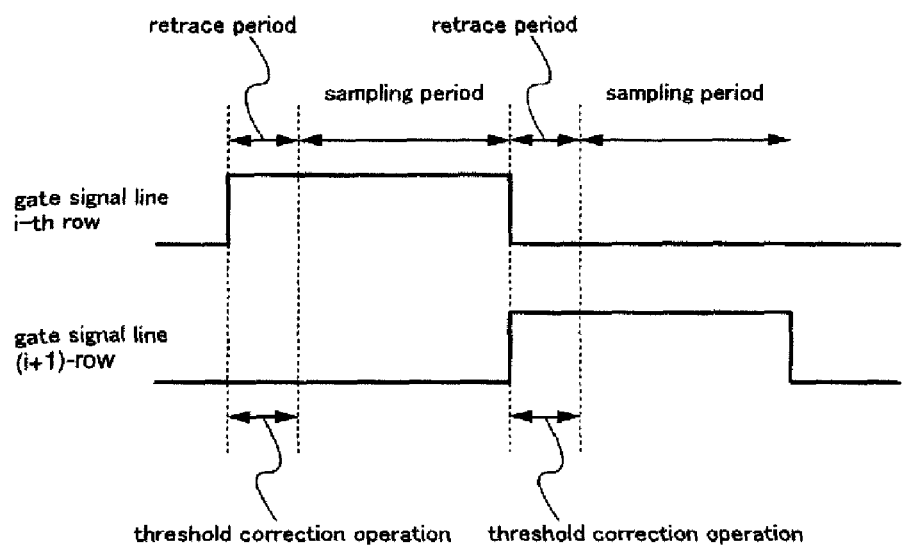

A simple operation timing is shown in FIG. 27B. A period in which the i-th gate signal line is selected is divided into a period in which sampling pulses are outputted from the shift register to sample video signals and a retrace period. In the retrace period, the threshold correction operation of the present invention, namely, a series of operations for initializing electric potentials of the respective portions and obtaining the threshold voltage of the transistor, is carried out. In other words, the operation of obtaining the threshold can be conducted once in every horizontal period.

Figure 28A:
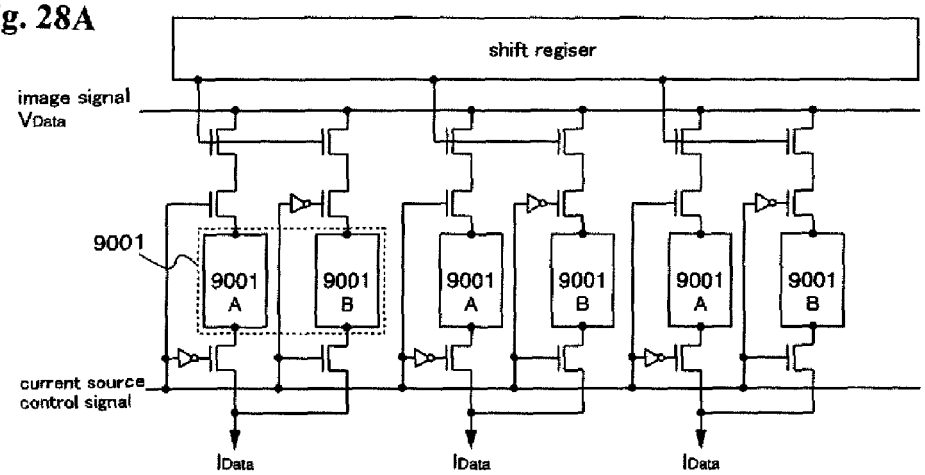
FIGS. 28A and 28B are diagrams showing an example of constituting a current supply circuit using the threshold correction principle of the present invention.

FIG. 28A shows a structure of a driving circuit for outputting a current to a pixel and others which is different from the structure of FIG. 27. The difference between FIG. 28A and FIG. 27 is that two current supply circuits, 9001A and 9001B, are provided in FIG. 28A as current supply circuits 9001 controlled by one stage of sampling pulses and that the respective operations of the two circuits are selected by a current supply control signal.

Figure 28B:
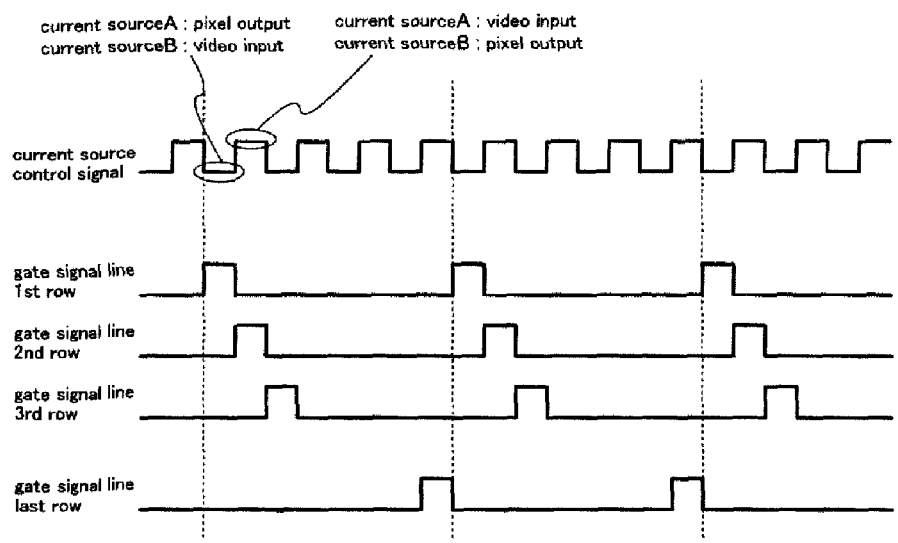

The current supply control signal is switched, for example, every time a new horizontal period is started as shown in FIG. 28B. Then, one of the current supply circuits 9001A and 9001B outputs a current to a pixel and others whereas the other inputs a video signal. These operations are alternated between the current supply circuits each time a new row is reached. In this case, the sampling operation is conducted in a line-sequential manner.

Figure 29A:
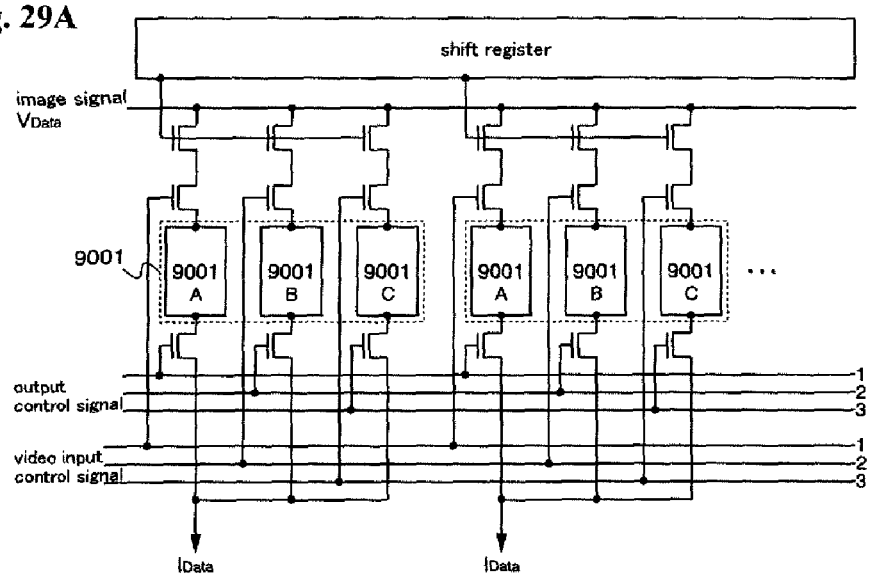
FIGS. 29A and 29B are diagrams showing an example of constituting a current supply circuit using the threshold correction principle of the present invention.

FIG. 29A shows another structure of the driving circuit. Here, three current supply circuits, 9001A, 9001B, and 9001C, are provided in FIG. 29A as current supply circuits 9001 controlled by one stage of sampling pulses. The respective operations of the three circuits are selected by a video input control signal and an output control signal.

Figure 29B:
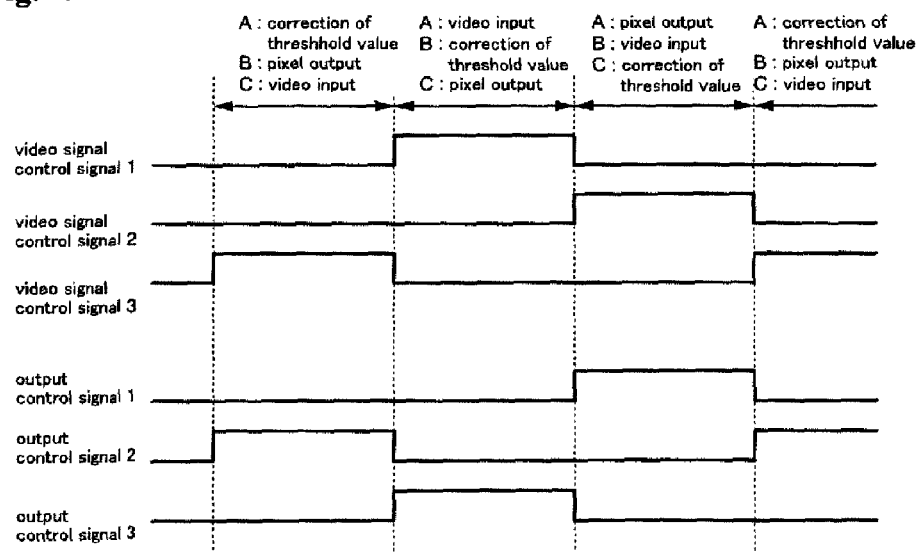

As shown in FIG. 29B, the operation of correcting the threshold, the operation of inputting a video signal, and the operation of outputting a current to a pixel are conducted and switched in this order among the current supply circuits 9001A to 9001C by video input control signals and output control signals every time a new horizontal period is started. The sampling operation is conducted in a line-sequential manner as in the structure shown in FIG. 28.

Figure 30A:
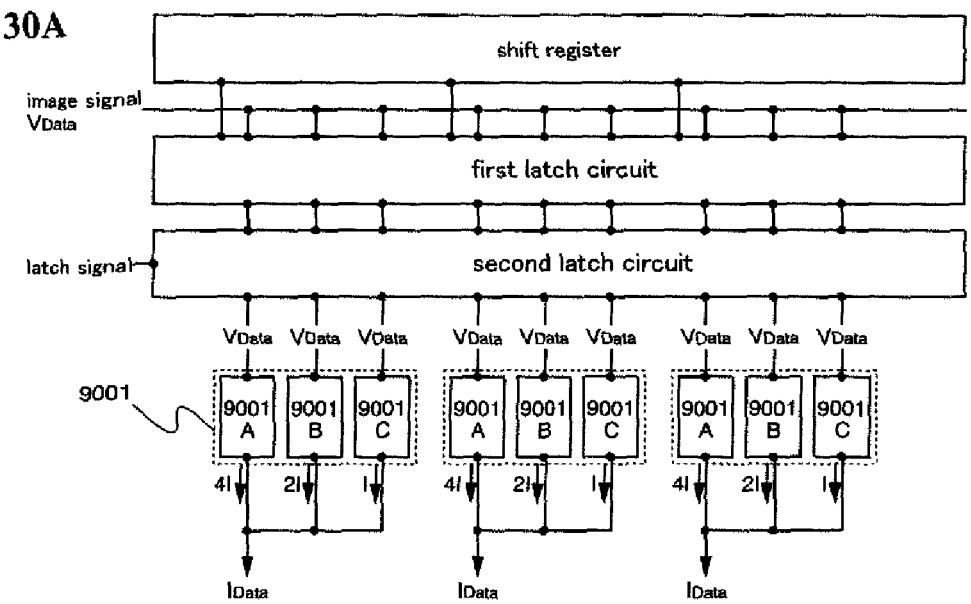
FIGS. 30A and 30B are diagrams showing an example of constituting a current supply circuit using the threshold correction principle of the present invention.

FIG. 30A shows another structure of the driving circuit. A video signal can be a digital signal or an analog signal in the structure of FIG. 27 but a digital video signal is inputted in the structure of FIG. 30A. A digital video signal inputted is taken in a first latch circuit in response to output of a sampling pulse. After taking in of video signals for one row is finished, the signals are transferred to a second latch circuit, and then, inputted to current supply circuits 9001A to 9001C. The current supply circuits 9001A to 9001C output different current values. The ratio of the current values is, for example, 1:2:4. By placing n current supply circuits in parallel, setting the ratio of current values of the circuits to $1:2:4: \ldots 2^{(n-1)}$, and putting currents outputted from the current supply circuits together, the outputted current value can be changed linearly.

The operation timing is mostly the same as the one shown in FIG. 27. During a retrace period in which the sampling operation is not conducted, current supply circuits 9001 perform the threshold correction operation, then data stored in a latch circuit is transferred, V-I conversion is conducted in the current supply circuits 9001, and a current is outputted to a pixel. The sampling operation is conducted in a line-sequential manner as in the structure shown in FIG. 28.

Figure 31A:
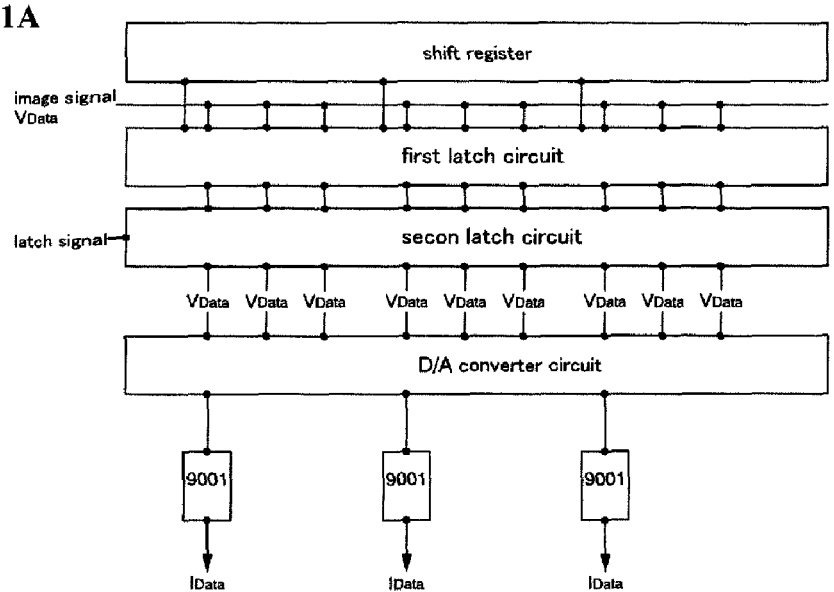
FIGS. 31A and 31B are diagrams showing an example of constituting a current supply circuit using the threshold correction principle of the present invention.

FIG. 31A shows another structure of the driving circuit for outputting a current to a pixel and others. In this structure, a digital video signal taken in a latch circuit is transferred to a D/A converter circuit upon input of a latch signal to be converted into an analog video signal. The analog video signal is inputted to current supply circuits 9001 and a current is outputted.

This D/A converter circuit may have a function of, for example, γ correction.

Figure 31B:
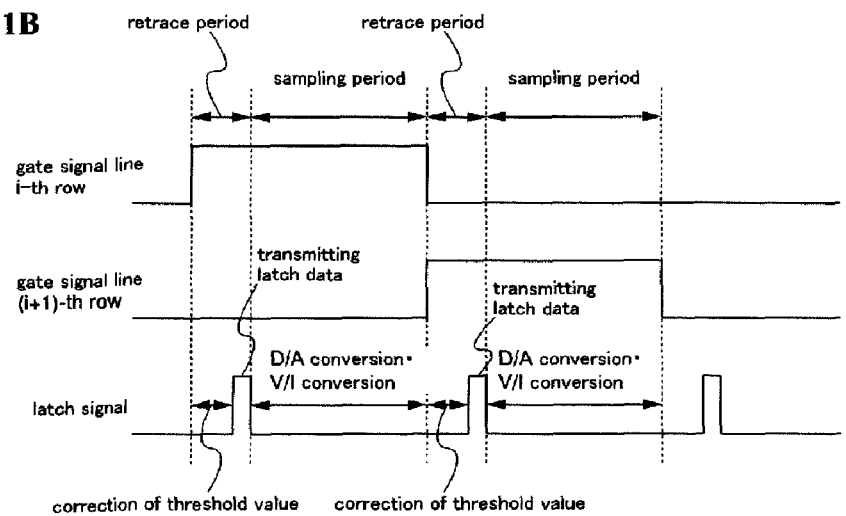

As shown in FIG. 31B, the threshold is corrected and latch data is transferred in a retrace period and a video signal of the previous row receives V-I conversion and a current is outputted to a pixel and others while the sampling operation is performed on a row. The sampling operation is conducted in a line-sequential manner as in the structure shown in FIG. 28.

Figure 30B:
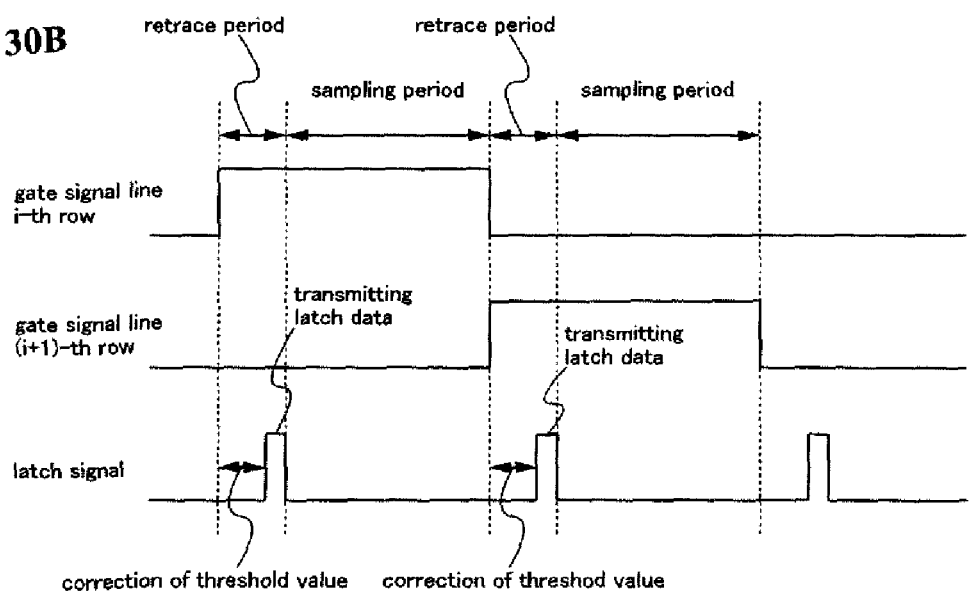

Application of the threshold correction means of the present invention is not limited to the above-mentioned structures, and it can be applied to the case of using a current supply circuit for V-I conversion. The structures of FIGS. 28 and 29 in which plural current supply circuits are placed in parallel and are used in turn may be combined with the structures of FIGS. 30 and 31 and the like.

Embodiment 13

In the structures described above in this specification, p-channel TFTs are used as the driving TFTs. However, the present invention is also applicable to a structure in which an n-channel TFT is used as a driving TFT. The structure is shown in FIG. 32A.

A driving TFT 3210 is an n-channel transistor, and in this case, its source region is the side connected to an anode of an EL element 3215 and its drain region is the side connected to a current supply line 3214 through a TFT 3211. Therefore, capacitor means 3212 and 3213 are placed at nodes that enable them to hold the gate-source voltage of the driving TFT 3210.

The operation thereof is described. As shown in FIG. 32B, first, other TFTs are turned conductive so that a driving TFT 3208 is turned ON. Subsequently, as shown in FIG. 32C, TFTs 3209 and 3211 are turned OFF to move electric charges as illustrated in the drawing until the gate-source voltage of the driving TFT 3208 becomes equal to its threshold voltage. The driving TFT 3208 is eventually turned OFF. At this point, the threshold voltage of the driving TFT 3208 is held in the capacitor means 3212.

Then, a video signal is inputted as shown in FIG. 32D. The threshold voltage held in the capacitor means 3212 prior to the input is added to the video signal and the video signal is inputted to the gate of the driving TFT 3208. A current is supplied to the EL element 3215 from the current supply line 3214 according to the gate-source voltage of the driving TFT 3208 at this point. Accordingly, the gate-source voltage of the driving TFT is not fluctuated between adjacent pixels even though the threshold of the driving TFT 3208 is fluctuated between adjacent pixels because the capacitor means 3212 adds the threshold voltage to the video signal irrespective of the threshold fluctuation.

Further, when the EL element 3215 in the structure shown in FIG. 32 is degraded through light emission, the anode-cathode voltage is raised. Usually, this causes the electric potential of the source region of the driving TFT 3208 to rise, resulting in a problem of reduction in gate-source voltage during light emission. According to the structure shown in this embodiment, when the threshold is obtained in FIGS. 32B to 32C, the TFT 3209 is turned ON to fix the electric potential of the source region of the driving TFT 3208 to the electric potential of a power supply line 3216. Therefore, unlike the description above, the gate-source voltage of the driving TFT 3208 is not reduced and lowering of luminance with time can be prevented.

The driving TFT 3210 in this embodiment is an n-channel transistor. Other TFTs are used as switching elements whose sole purpose is to control ON and OFF, and therefore, can have any polarity. The TFTs 3207 and 3208 use the same gate signal line since their ON and OFF timing is the same. However, this does not apply to control of switching elements.

A TFT 2711 may be used also as an erasing TFT for cutting a current supply to the EL element 3215 at an arbitrary timing.

Embodiment 14

A light emitting device using a light emitting element is a self light emission type. Thus, such a light emitting device has high visibility in a light place and a wide viewing angle, as compared with a liquid crystal display. Therefore, it can be used for a display portion of various electronic devices.

As electronic devices using the light emitting device of the present invention, there are a video camera, a digital camera, a goggle type display (head mount display), a navigation system, a sound reproducing device (car audio system, audio component system, or the like), a note type personal computer, a game machine, a portable information terminal (mobile computer, mobile telephone, portable game machine, an electric book, or the like), an image reproducing device including a recording medium (specifically, apparatus for reproducing an image from a recording medium such as a digital versatile disc (DVD), which includes a display capable of displaying the image), and the like. In particular, in the case of the portable information terminal in which a screen is viewed from an oblique direction in many cases, it is important that a view angle is large. Thus, it is desirable that the light emitting device is used. Concrete examples of those electronic devices are shown in FIGS. 17A to 17H.

Figure 17A:
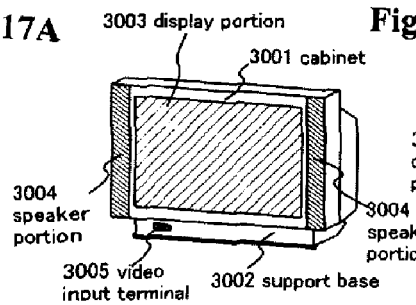
FIGS. 17A-17H are diagrams showing examples of electronic equipment to which the present invention is applicable.

FIG. 17A shows a light emitting element display device which includes a cabinet 3001, a support base 3002, a display portion 3003, a speaker portion 3004, and a video input terminal 3005. The light emitting device of the present invention can be used for the display portion 3003. The light emitting device is a self light emission type and thus does not require a back light. Therefore, a thinner display portion than a liquid crystal display can be obtained. Note that the light emitting element display device includes all display devices for information display such as personal computer, TV broadcast receiving, and advertisement display.

Figure 17B:
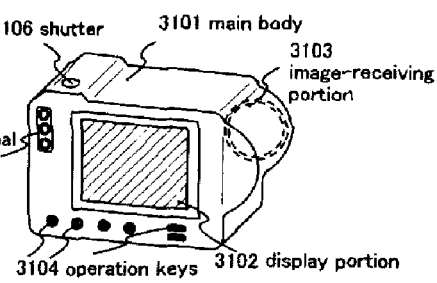

FIG. 17B is a digital still camera, which is composed of a main body 3101, a display portion 3102, an image-receiving portion 3103, operation keys 3104, external connection ports 3105, a shutter 3106, and the like. The light emitting device of the present invention can be used in the display portion 3102.

Figure 17C:
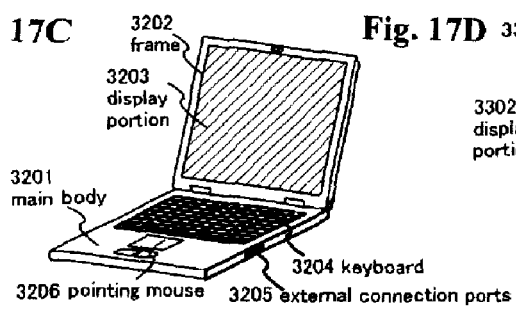

FIG. 17C is a notebook personal computer, which is composed of a main body 3201, a frame 3202, a display portion 3203, a keyboard 3204, external connection ports 3205, a pointing mouse 3206, and the like. The light emitting device of the present invention can be used in the display portion 3203.

Figure 17D:
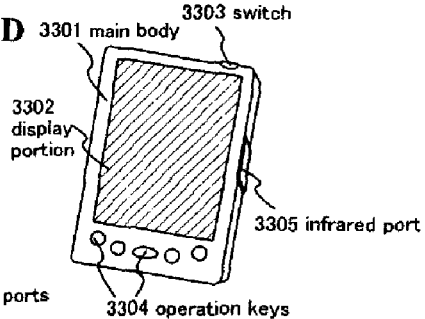

FIG. 17D is a mobile computer, which is composed of a main body 3301, a display portion 3302, a switch 3303, operation keys 3304, an infrared port 3305, and the like. The light emitting device of the present invention can be used in the display portion 2302.

Figure 17E:
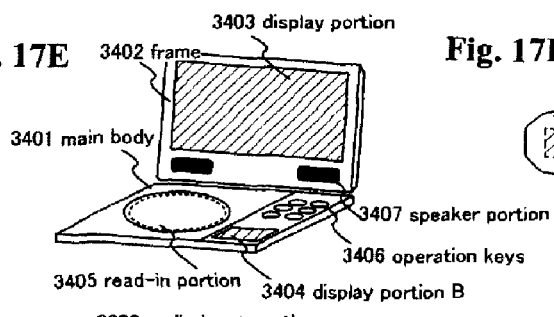

FIG. 17E is a portable image reproducing device equipped with a recording medium (specifically, a DVD player), and is composed of a main body 3401, a frame 3402, a display portion A 3403, a display portion B 3404, a recording medium (such as a DVD) read-in portion 3405, operation keys 3406, a speaker portion 3407, and the like. The display portion A 3403 mainly displays image information, and the display portion B 3404 mainly displays character information, and the light emitting device of the present invention can be used in the display portion A 3403 and in the display portion B 3404. Note that family game machines and the like are included in the category of image reproducing devices provided with a recording medium.

Figure 17F:
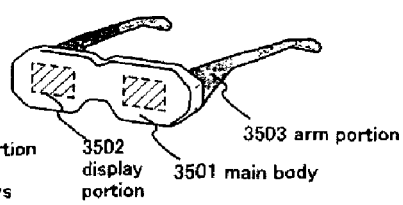

FIG. 17F is a goggle type display device (head mounted display), which is composed of a main body 3501, a display portion 3502, and an arm portion 3503. The light emitting device of the present invention can be used in the display portion 3502.

Figure 17G:
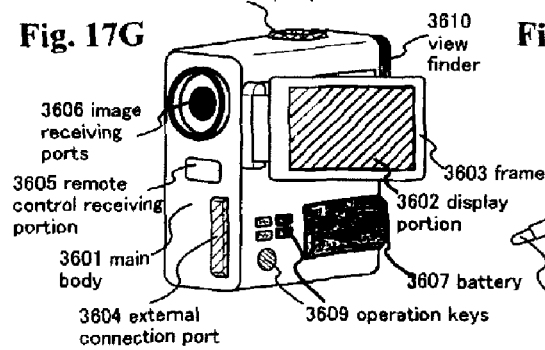

FIG. 17G is a video camera, which is composed of a main body 3601, a display portion 3602, a frame 3603, external connection ports 3604, a remote control receiving portion 3605, an image receiving portion 3606, a battery 3607, an audio input portion 3608, operation keys 3609, and the like. The light emitting device of the present invention can be used in the display portion 3602.

Figure 17H:
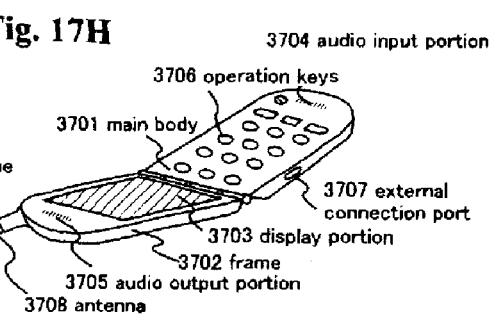

FIG. 17H is a mobile telephone, which is composed of a main body 3701, a frame 3702, a display portion 3703, an audio input portion 3704, an audio output portion 3705, operation keys 3706, external connection ports 3707, an antenna 3708, and the like. The light emitting device of the present invention can be used in the display portion 3703. Note that white characters are displayed on a black background in the display portion 3703, and thus, the power consumption of the mobile telephone can be suppressed.

Note that, when a light emitting intensity of an organic light emitting material is increased in future, it can be used for a front type or a rear type projector for magnifying and projecting outputted light including image information by a lens or the like.

Also, in the above electronic devices, the number of cases where information distributed through an electronic communication line such as an Internet or a CATV (cable television) is displayed is increased. In particular, a chance in which moving image information is displayed is increased. A response speed of the organic light emitting material is very high. Thus, the light emitting device is preferable for moving image display.

Also, with respect to the light emitting device, power is consumed in a portion which emits light. Thus, it is desirable that information is displayed so as to minimize an area of a light emitting portion. Accordingly, when the light emitting device is used for a display portion of, a portable information terminal, particularly, a mobile telephone or a sound reproducing device in which character information is mainly displayed, it is desirable that the light emitting device is driven so as to use a non-light emitting portion as a background and produce character information in a light emitting portion.

As described above, an application area of the present invention is extremely wide and the light emitting device can be used for electronic devices in all fields. In addition, the light emitting device having any structure described in Embodiments 1 to 13 may be used for the electronic devices of this embodiment.

EFFECT OF THE INVENTION

According to the present invention, fluctuation in TFT threshold among pixels can be corrected normally without being influenced by fluctuation in capacitance value of capacitor means or the like. Furthermore, a period for charging with electric charges and a period for selecting a gate signal line to write a video signal in a pixel can be set independent of each other, and therefore, the respective operations can be carried out in good time. This makes it possible for the circuit to operate at high speed, and when a digital gray scale method and a time ratio gray scale method are combined to perform display, in particular, an image of higher quality can be displayed using video signals of higher bit number.

Compared to prior art examples, the present invention is based on a simpler operation principle and the number of elements or the like is not increased much. Therefore, there is no fear of lowering aperture ratio and it can be said that the present invention is very effective.

A number of embodiments of the invention have been described. Nevertheless, it will be understood that various modifications may be made without departing from the spirit and scope of the invention. Accordingly, other embodiments are within the scope of the following claims.

What is claimed is:

1. A semiconductor device comprising:
    a transistor;
    a first switch;
    a second switch;
    a third switch;
    a fourth switch;
    a fifth switch; and
    a capacitor,
    wherein:
    one of a source and a drain of the transistor is electrically connected to a light-emitting element through the first switch,
    the other of the source and the drain of the transistor is electrically connected to a first wiring,
    a gate of the transistor is electrically connected to the one of the source and the drain of the transistor through the second switch,
    a first terminal of the capacitor is electrically connected to the gate of the transistor,
    a second terminal of the capacitor is electrically connected to the first wiring through the third switch,
    a second wiring is electrically connected to the second terminal of the capacitor through the fourth switch, and
    a third wiring is electrically connected to the second switch through the fifth switch.

2. A semiconductor device according to claim 1, wherein the light-emitting element uses triplet excitation for light emission.

3. A semiconductor device according to claim 1, wherein the light-emitting element includes an iridium complex.

4. A semiconductor device according to claim 1, wherein each of the first switch, the second switch, the third switch, the fourth switch and the fifth switch is a transistor.

5. A semiconductor device comprising:
    a transistor;
    a first switch;
    a second switch;
    a third switch;
    a fourth switch;
    a fifth switch; and
    a capacitor,
    wherein:
    one of a source and a drain of the transistor is electrically connected to a light-emitting element through the first switch,
    the other of the source and the drain of the transistor is electrically connected to a first wiring,
    a gate of the transistor is electrically connected to the one of the source and the drain of the transistor through the second switch,
    a first terminal of the capacitor is electrically connected to the gate of the transistor,
    a second terminal of the capacitor is electrically connected to the first wiring through the third switch,
    a second wiring is electrically connected to the second terminal of the capacitor through the fourth switch, and
    a third wiring is electrically connected to the first switch through the fifth switch.

6. A semiconductor device according to claim 5, wherein the light-emitting element uses triplet excitation for light emission.

7. A semiconductor device according to claim 5, wherein the light-emitting element includes an iridium complex.

8. A semiconductor device according to claim 5, wherein each of the first switch, the second switch, the third switch, the fourth switch and the fifth switch is a transistor.

* * * * *